United States Patent
Yamada et al.

(10) Patent No.: US 6,946,857 B2
(45) Date of Patent: *Sep. 20, 2005

(54) SEMICONDUCTOR DEVICE TESTER

(75) Inventors: Keizo Yamada, Tokyo (JP); Yousuke Itagaki, Tokyo (JP); Takeo Ushiki, Tokyo (JP); Tohru Tsujide, Tokyo (JP)

(73) Assignee: Fab Solutions, Inc., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/868,582

(22) Filed: Jun. 15, 2004

(65) Prior Publication Data

US 2004/0239347 A1 Dec. 2, 2004

Related U.S. Application Data

(62) Division of application No. 09/702,831, filed on Nov. 1, 2001, now Pat. No. 6,768,324.

(30) Foreign Application Priority Data

Nov. 5, 1999 (JP) ............................................ 11-315320
Jun. 26, 2000 (JP) ....................................... 2000-191817
Oct. 11, 2000 (JP) ....................................... 2000-311196

(51) Int. Cl.$^7$ ............................................. G01R 31/02
(52) U.S. Cl. ..................................... 324/751; 324/752
(58) Field of Search ................................ 324/750–765, 324/501, 73.1, 158.1; 250/306–311, 492.1, 559.42; 438/14–18

(56) References Cited

U.S. PATENT DOCUMENTS 3,614,608 A 10/1971 Giedd 4,949,162 A 8/1990 Tamaki et al.

(Continued)

FOREIGN PATENT DOCUMENTS

JP 50-63990 5/1975
JP 57-6310 1/1982

(Continued)

OTHER PUBLICATIONS

"An In–Line Contact and Via Hole Inspection Method Using Electron Beam Compensation Current", Yamada et al., IEEE 1999, available from http://www.fabsol.com/us/images/library/21.pdf.

*Primary Examiner*—Vinh P. Nguyen
(74) *Attorney, Agent, or Firm*—Neil A. Steinberg

(57) ABSTRACT

In one aspect, the present invention is a system and method for obtaining information regarding one or more contact holes and/or vias on a semiconductor wafer. In this regard, in one embodiment, the system comprises an electron gun to irradiate an electron beam on the one or more contact holes and/or vias wherein the electron beam includes a cross-section which is greater than the one or more contact holes. The system further includes a current measuring device, coupled to the semiconductor wafer, may measure a compensation current, wherein the compensation current is generated in response to the electron beam irradiated on the one or more contact holes. The system also includes a data processor, coupled to the current measuring device, to determine information relating to the one or more contact holes and/or vias using the compensation current.

25 Claims, 56 Drawing Sheets

U.S. PATENT DOCUMENTS

| | | | |
|---|---|---|---|
| 4,980,639 A | 12/1990 | Yoshizawa et al. | |
| 4,988,877 A | 1/1991 | Stokowksi et al. | |
| 5,001,536 A | 3/1991 | Fukuzawa et al. | |
| 5,089,774 A | 2/1992 | Nakano | |
| 5,132,507 A | 7/1992 | Nakano | |
| 5,280,176 A | 1/1994 | Jach et al. | |
| 5,327,012 A | 7/1994 | Yano et al. | |
| 5,365,034 A | 11/1994 | Kawamura et al. | |
| 5,412,210 A | 5/1995 | Todokoro et al. | |
| 5,453,994 A | 9/1995 | Kawamoto et al. | |
| 5,493,236 A | 2/1996 | Ishii et al. | |
| 5,614,833 A | 3/1997 | Golladay | |
| 5,637,186 A | 6/1997 | Liu et al. | |
| 5,757,198 A | 5/1998 | Shida et al. | |
| 5,780,870 A | 7/1998 | Maeda et al. | |
| 5,781,017 A | 7/1998 | Cole et al. | |
| 5,801,540 A | 9/1998 | Sakaguchi | |
| 5,815,002 A | 9/1998 | Nikawa | |
| 5,900,645 A | 5/1999 | Yamada | |
| 5,989,919 A | 11/1999 | Aoki | |
| 6,037,588 A | 3/2000 | Liu et al. | |
| 6,127,193 A | 10/2000 | Bang et al. | |
| 6,177,681 B1 * | 1/2001 | Nakamura | 250/559.42 |
| 6,294,919 B1 | 9/2001 | Baumgart | |
| 6,317,514 B1 | 11/2001 | Reinhom et al. | |
| 6,417,680 B1 | 7/2002 | Birdsley et al. | |
| 6,559,662 B1 * | 5/2003 | Yamada et al. | 324/751 |
| 6,614,244 B2 * | 9/2003 | Yamada et al. | 324/751 |
| 6,677,760 B1 * | 1/2004 | Koyama | 324/501 |
| 6,723,987 B2 * | 4/2004 | Ishimoto | 250/306 |

FOREIGN PATENT DOCUMENTS

| | | |
|---|---|---|
| JP | 62-19707 | 1/1987 |
| JP | 63-009807 | 1/1988 |
| JP | 03-205573 | 9/1991 |
| JP | 04-0692857 | 2/1992 |
| JP | 06-273297 | 9/1994 |
| JP | 07-066172 | 3/1995 |
| JP | 08-005528 | 1/1996 |
| JP | 08-313244 | 11/1996 |
| JP | 09-061142 | 3/1997 |
| JP | 10-281746 | 10/1998 |
| JP | 10-300450 | 11/1998 |
| JP | 11-026343 | 1/1999 |
| JP | 2000-124276 | 4/2000 |
| JP | 2000-164715 | 6/2000 |
| JP | 2000-174077 | 6/2000 |
| JP | 2000-180143 | 6/2000 |

* cited by examiner

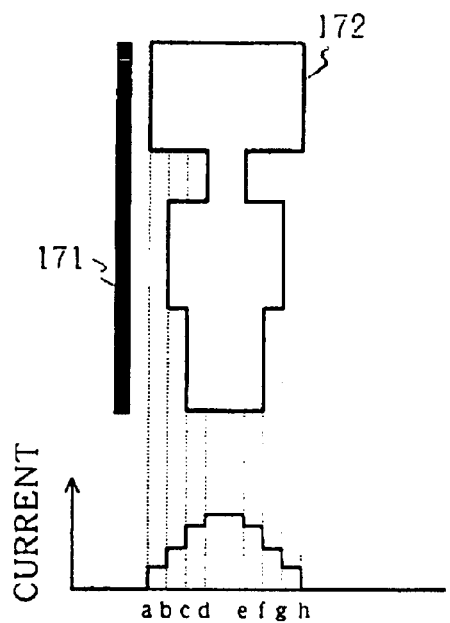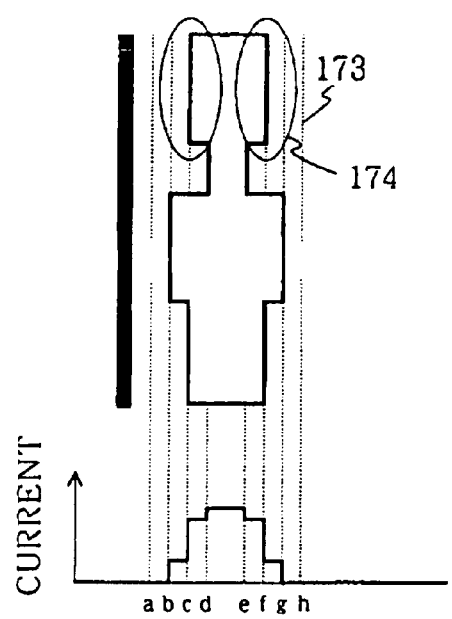
FIG.33a　　　　　　FIG.33b
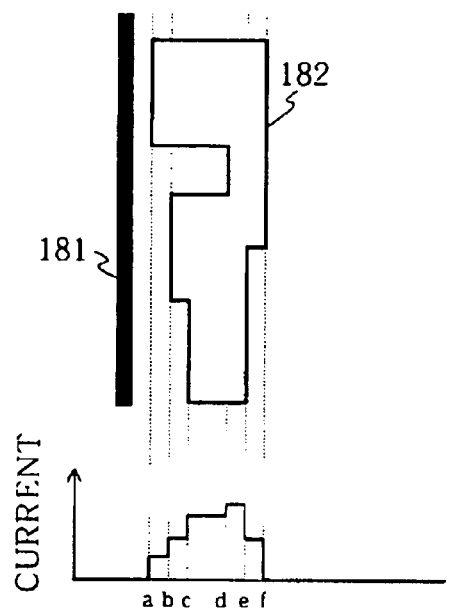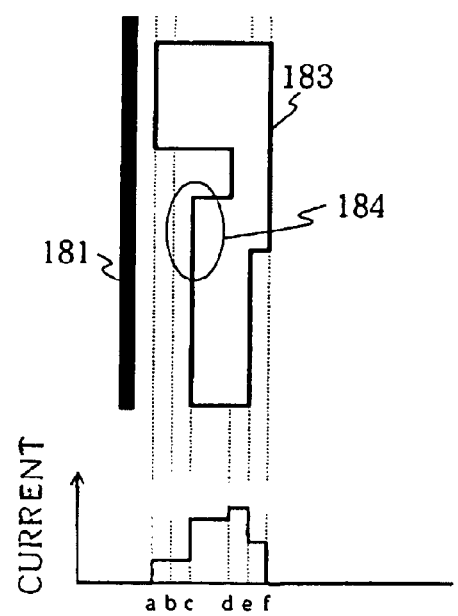
FIG.34a　　　　　　FIG.34b

TIME

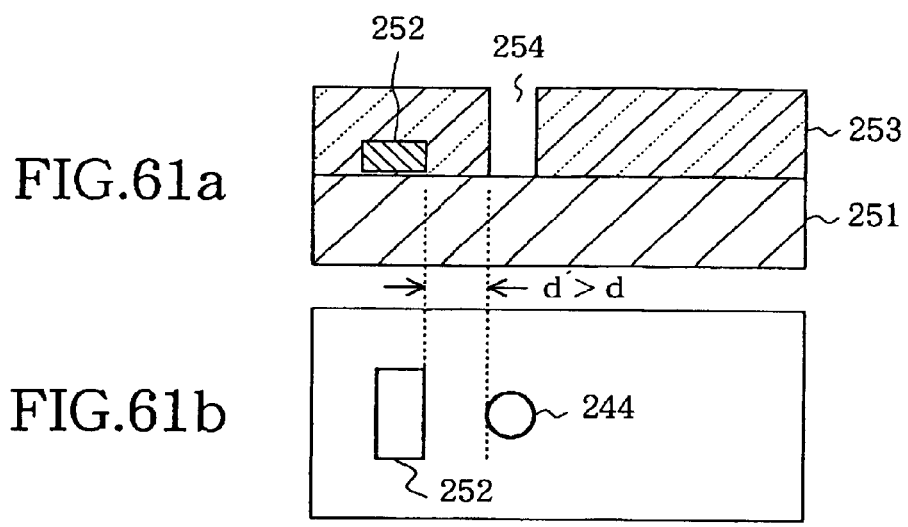
FIG.61a
FIG.61b
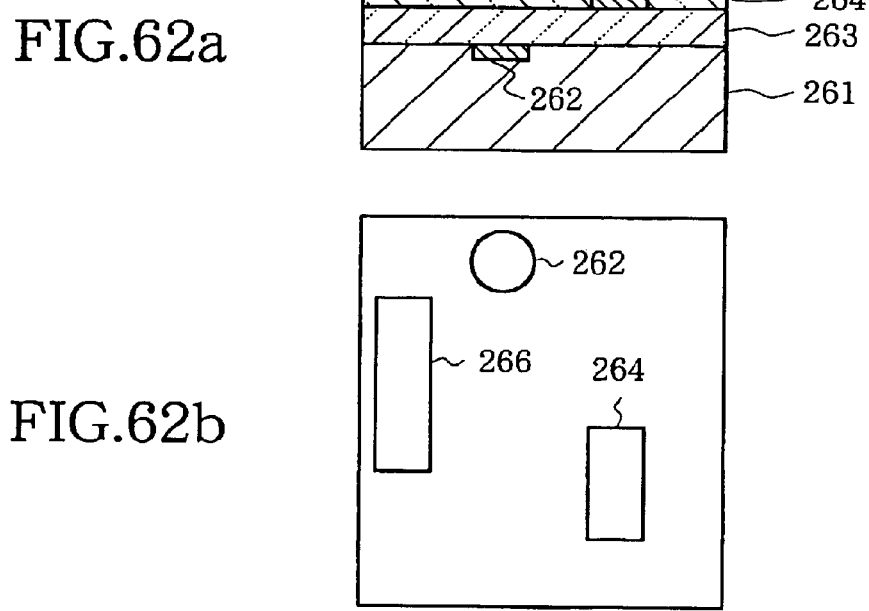
FIG.62a
FIG.62b

SEMICONDUCTOR DEVICE TESTER

CROSS REFERENCE TO RELATED APPLICATIONS

This application is a divisional application of application Ser. No. 09/702,831 (now U.S. Pat. No. 6,768,324), filed Nov. 1, 2000, which claims the benefit of priority, under 35 USC § 119, to Japanese Patent Application Nos. 11-315320, 2000-191817 and 2000-311196, filed on Nov. 5, 1999, Jun. 26, 2000 and Oct. 11, 2000, respectively, the contents of which are incorporated herein by reference.

BACKGROUND OF THE INVENTION

1. Field of the Invention

The present invention relates to a semiconductor device tester using electron beam and, particularly, to a semiconductor device tester in which current flowing through a semiconductor device irradiated with electron beam is measured.

2. Description of Related Art

In a semiconductor device such as memory, contact-holes or via-holes are usually provided for electrically connecting active elements formed in a lower portion thereof to a wiring layer formed in an upper portion thereof. The contact-holes are formed by etching an insulating film such as an oxide film from a surface thereof down to an underlying substrate by reactive ion etching. In order to optimize etching condition, it is necessary to detect an outer and inner configurations of a contact-hole or a state of a bottom of the contact-hole.

Since the diameter of contact-hole is in the order of microns or less, visible light can not illuminate the bottom of the contact-hole, so that it is difficult, to detect the state of the contact-hole optically. Therefore, SEM (Scanning Electron Microscope) suitable for analysis of a fine structure has been mainly used as a tester. In the SEM, a contact-hole region is irradiated with electron beam, which is accelerated to several tens keV and collimated to several nanometers, and secondary electron produced in the irradiated region is detected by a secondary electron detector, on which an image of the contact hole is formed. A specimen irradiated with the electron beam generates secondary electrons, an amount of which corresponds to constituting atoms thereof. However, the secondary electron detector in the SEM is usually arranged in a specific direction, so that a whole of produced secondary electrons are not always detected. If the specimen includes irregularity in its structure, there is a case where secondary electron is not detected depending upon portions of the specimen, resulting in that contrast is produced in an image of the specimen under test, which is formed of a single substance. This is the feature of the SEM.

On the other hand, an electrical contact is realized through a contact-hole or a through-hole. Therefore, not only a configuration of an opening portion of the contact-hole but also a configuration and a surface condition of the bottom portion of the contact-hole are very important. In an etching for forming contact-holes each having aspect ratio exceeding 10 in concomitant with the recent increase of integration density and the number of layers of a semiconductor device, there may be a case where inner diameters of the contact-holes become different from diameters of opening portions of the contact-holes depending upon process condition even when the sizes of the opening portions are the same as a designed size. Since such variation of the inner size of the contact-hole substantially affects characteristics of a semiconductor device, it is necessary for persons in charge of a process to control the process such that all contact-holes have identical sizes. Further, since such size variation of contact-holes must not exist in practical products, the products have to be tested too. Therefore, a technique capable of non-destructively detecting both the inner size of the contact-holes and such size variation of the contact-holes is very important.

FIGS. 4(a) and 4(b) illustrate a test method using an SEM for testing a contact-hole 43 having a circular cross section and a result of the test thereof, respectively, and FIGS. 5(a) and 5(b) illustrate a test method using an SEM for testing a tapered contact-hole and a test result thereof, respectively. In the test using the SEM, the specimen under test is scanned by electron beam 31 and secondary electron 32 produced in the specimen is detected by a secondary electron detector 33.

It is assumed that the circular contact-hole 43 is formed through an insulating film 41 such as an oxide film formed on an underlying substrate 42 by etching from an opening portion thereof in a vertical direction such that the contact-hole 43 has an inner diameter substantially equal to a diameter of the opening portion, as shown in FIG. 4(a). In such case, energy of secondary electron hardly reaches the detector 33 unless there is a space large enough to gather a sufficient amount of energy since the energy of secondary electron is small. Therefore, a measured amount of secondary electron becomes as shown in FIG. 4(b). That is, an image of secondary electron obtained becomes suddenly darkened correspondingly to the opening portion of the contact-hole 43. By this phenomenon, an existence of a contact-hole is detected.

On the other hand, it is assumed that a contact-hole 44 has a tapered configuration whose diameter is reduced with depth as shown in FIG. 5(a). In such case, secondary electron from the tapered portion of the contact-hole may be observed depending upon a position of a secondary electron detector. However, since the aspect ratio of the contact-hole 44 is large, secondary electron emitted from an inner wall of the contact-hole can not observed practically. Therefore, the configuration of the contact-hole 44 and an information of a bottom thereof are not always reflected to a secondary electron image.

In the tapered contact-hole such as shown in FIG. 5(a), the inner diameter thereof is reduced with increase of a depth thereof and there may be a case where a contact resistance of the contact-hole is increased, resulting in a defective contact-hole even if the diameter of the opening portion thereof is acceptable. In the SEM test, however, a detected image becomes dark sharply at the opening portion of the contact-hole and an information of a bottom thereof is not reflected to the image regardless of whether the configuration of the contact-hole is circular or tapered. Thus, it is impossible to distinguish these contact-holes by the usual SEM.

In order to test an interior or a bottom of a contact-hole, a method of observing a cross section of the contact-hole of a specimen obtained by vertically cutting the specimen along a center axis of the contact-hole has been employed. This method requires a high level technique for precisely cutting the specimen to two pieces at the center axis of the contact-hole. Therefore, in view of the diameter of the current contact-hole in the order of several thousands Å, it is practically impossible to cut the specimen along the center axis of the contact-hole with precision of 10% which is necessary to determine the quality of a product. Further, this method is a destructive test and requires considerable labor and time, in addition to the impossibility of directly observation of the product.

In order to solve such problems, JP H10-281746A discloses a technique in which current produced by electron beam, which is passed through a contact-hole and arrived at a substrate, is detected to detect a position and size of a bottom of the contact-hole. Further, JP H4-62857A discloses a technique in which a secondary electron image is obtained by irradiating a contact-hole with not electron beam but ion beam and measuring a current flowing through a substrate due to the ion beam irradiation.

As another prior art, JP H11-026343A discloses a technique in which a pattern for measuring a positional deviation of a mask is formed and an amount of positional deviation of the mask is obtained on the basis of a substrate current produced when electron beam irradiation is performed. Further, JP P2000-174077A discloses a technique in which an area containing a plurality of contact-holes is irradiated with electron beam and a ratio of normal contact-holes in that area is tested on the basis of current values produced by electron beam passed through the contact-holes.

Further, it is possible to know a film thickness by measuring a substrate current. For example, JP P62-19707A discloses a technique in which a relation between a waveform of a substrate current, acceleration voltage of electron beam and a film thickness, when a pulsed electron beam irradiation is performed, is preliminarily obtained and a fir thickness is obtained from a current waveform measured by using electron beam accelerated with a certain acceleration voltage. Further, JP P2000-124276A discloses a technique in which a current, which is not a variation of current with time but a current value, produced by irradiating a test sample with electron beam and passed through the test sample to a backside surface thereof is measured. In a technique disclosed in JP 2000-180143A, a current flowing through a thin film to a substrate, is measured and a film thickness is obtained by comparing the measured current with a current value obtained for a standard sample and JP P2000-164715A discloses a standard sample suitable for use in the technique disclosed in JP P2000-180143A.

SUMMARY OF THE INVENTION

An object of the present invention is to further improve the technique for detecting a substrate current produced by irradiation of electron beam to thereby provide a semiconductor device tester capable of non-destructively testing a detailed configuration of a contact-hole and an inner state of a semiconductor device.

The semiconductor device tester according to the present invention, which includes electron beam irradiation means for irradiating a semiconductor device as a sample under test with electron beam while scanning the semiconductor device, current measuring means for measuring current produced in the sample by irradiation of electron beam and data processing means for processing measured data from the current measuring means, is featured by that the electron beam irradiation means includes collimator means for collimating electron beam to parallel beam and means for changing acceleration voltage of electron beam and the data processing means includes means for obtaining an information related to a structure of the sample in a depth direction on the basis of a difference in transmittivity of electron beam for the sample when the latter is scanned with different acceleration voltages.

The reason for the use of parallel electron beam in the present invention is that, when a converging electron beam is used, it is necessary to condense the electron beam to a vertical level of a measuring location and, so, it is not suitable in obtaining an information of the sample in a depth direction thereof. When a parallel electron beam is used, focal distance becomes infinite so that focus regulation becomes unnecessary.

The previously described technique disclosed in JP H1-281746A can perform a test for detecting whether or not the contact-hole penetrates the film. However, it can not provide a detailed information of such as configuration of a contact-hole. This is also true for the technique disclosed in JP H4-62857A, which uses ion beam. Although there is a description in JP P2000-124276A of a change of the amount of current or acceleration voltage of electron beam, the purpose of the change of current or acceleration voltage is to reduce noise, not to check a structure of the test sample in its depth direction. The use of parallel beam disclosed in JP P2000-174077A is to irradiate the area including a plurality of contact-holes, not to check the structure such as individual contact-holes of the test sample in the depth direction thereof.

The electron beam irradiation means includes an electron gun and the collimator means includes a condenser lens for collimating the electron beam emitted from the electron gun to a parallel beam and an aperture plate having an aperture inserted between the condenser lens and the semiconductor device, for limiting a spot size of electron beam such that the electron beam impinges an opening portion. The electron beam irradiation means preferably includes means for moving the sample under test with respect to the electron beam in order to scan the sample with electron beam.

Alternatively, the electron beam irradiation means includes an electron gun and the collimator means may include a first condenser lens for collimating the electron beam emitted from the electron gun to parallel beam, a second condenser lens arranged such that it constitutes an afocal system, an objective lens and an aperture plate having an aperture inserted between the first condenser lens and the second condenser lens for limiting a spot size of the electron beam. It may further include means for moving the sample under test with respect to the electron beam in order to scan the sample with electron beam.

The electron beam irradiation means may include means for vertically irradiating the semiconductor device along a line segment passing through a center of a measuring region with electron beam having spot size smaller than an area of the measuring region and the data processing means may include means for obtaining a distance of a bottom of the measuring region from a time between a rising and falling edges of a current measured along the line segment.

The data processing means may include area calculation means, which divides a value of current produced in an unknown measuring region by electron beam irradiation under constant condition by a value of current produced in a standard sample having a known area of measuring region by electron beam irradiation under the same constant condition and obtains an area of the unknown measuring region from a resulting quotient. In this case, the data processing means may include distance calculation means, which divides the area obtained by the area calculation means by the ratio ($\pi$) of the circumference of a circle to its diameter and obtains a root of the resultant quotient as a distance measured from one edge to the other of the unknown measuring region.

The electron beam irradiation means may include means for setting the spot size of electron beam to a value large enough to cover all of the measuring region in the lump and the data processing means may include means for calculating a ratio of current produced when the standard sample having the known measuring region area is irradiated with electron beam having the large spot size to a value of current produced when a measuring region of the unknown sample is irradiated with electron beam having the large spot size and means for calculating an area of the measuring region of the unknown sample from the ratio.

The data processing means may include means for determining the value of current produced when the standard sample is irradiated with electron beam having known spot size as an amount of current per unit area of the standard sample.

The data processing means may further include means for comparing a current measured correspondingly to a positional coordinates if a wafer under test irradiated with electron beam with a current to be measured at the same positional coordinates of the wafer is good and setting the kind of process to be performed next on the basis of the result of the comparison.

The present invention can be utilized in combination with an SEM. That is, the semiconductor device tester according to the present invention further comprises a secondary electron detector for detecting secondary electron emitted from a surface of a sample under test, wherein the data processing meant may include correspondence means for making an amount of secondary electron measured by the secondary electron detector correspondent with the result of measurement of the current measuring means. In detail, it is possible to vertically irradiate the sample under test along the line segment passing through a center of a measuring region with electron beam having spot size smaller than an area of the measuring region by means of the electron beam irradiating means, obtaining a bottom distance of the measuring region from a distance between a rising and failing edges of current measured along the line segment by means of the current measuring means and obtaining an upper distance of the measuring region from a distance between a rising and falling edges of the secondary electron detected by the secondary electron detector. The correspondence means may include means for three-dimensionally displaying a circular pillar or a frustum of a cone having the measured bottom distance, upper distance and film thickness of the measuring region as a bottom diameter, an upper diameter and a height.

The semiconductor device tester further comprises tilting means for tilting a sample stage on which a sample under test is mounted, wherein the data processing means may include means for processing a tilting angle of the sample with respect to electron beam.

The data processing means may include means for storing a current value corresponding to an electron beam irradiated portion, which is obtained in a location of the sample having no dust (particle or residue), means for comparing the current value stored in the storing means with a current value corresponding to an electron beam irradiated position in the same pattern portion of an unknown sample as that of the sample and means for determining the existence and size of dust from a difference between a rising and falling positions of the current obtained by the comparison.

The electron beam irradiation means may include means for setting a cross sectional shape of electron beam such that it covers the whole measuring region in the lump and at least one end of the cross sectional shape of electron beam becomes linear and the data processing means may include means for obtaining the distance of the measuring region from a distance between a rising value and a maximum value of current.

The electron beam irradiation means includes means for setting a cross sectional shape of electron beam such that it covers a whole measuring region in the lump and at least one end of the cross sectional shape of electron beam becomes linear and the data processing means may include means for calculating a differentiated curve of current with respect to a distance and means for obtaining a radius of the measuring region from a distance between a rising position and an apex position of the differentiated curve.

The data processing means may include means for displaying measured current values on a map corresponding to the measured positions.

The data processing means may include comparison means for comparing a measured value obtained in one of two regions on a wafer as samples with a measured value obtained in the other region as a reference value and means for extracting a positional coordinates when there is a difference equal to or larger than a predetermined constant value.

In this case, the electron beam irradiation means includes means for scanning a sample under test with line shaped electron beam having length substantially equal to a width of a wiring in a direction perpendicular to a lengthwise direction of the line shaped line and moving a scan position by a distance equal to the width of the wiring vertically to scanning direction after one line scan is completed and the comparison means may include means for comparing current waveforms measured as variations of current values with respect to electron beam irradiating positions in the two regions.

The electron beam irradiation means includes means for scanning a sample under test with electron beam having size smaller than a minimum width of a wiring of the sample in a first direction and moving the scan position in a direction perpendicular to the scanning direction by a distance corresponding to the width of the wiring every time one line scan is completed and the comparison means may include means for extracting, from current waveforms measured as variations of current values corresponding to electron beam irradiating positions in the two regions, instantaneous current values at centers of a rising and falling edges of the current waveform corresponding to the same pattern positions and comparing the instantaneous current values with each other.

The electron beam irradiation means includes means for scanning a sample under test with line shaped electron beam having a length capable of irradiating a plurality of wiring lines of the sample as a lump in a direction perpendicular to a lengthwise direction of the line shaped electron beam and moving the sample in a direction perpendicular to the scanning direction by a width of electron beam irradiating a scan position every time when one line scan is completed and the comparison means may include means for comparing current waveforms measured as variations of current values for electron beam irradiating positions in the two regions. In this case, the means for comparing waveforms may include means for integrating the waveforms and comparing the integrated values.

The comparison means may include means for integrating current from a rising edge to a falling edge of one pulse of a current waveform measured as a variation of a current from an electron beam irradiating position, divider means for dividing the integrated value by a distance between the rising edge and the falling edge of the pulse and means for comparing current values per unit area of the two regions obtained by the divider means.

The comparison means may include means for comparing positions of a rising edge and a falling edge of the pulse of the current waveform measured as a variation of current value for an electron beam irradiating position. Alternatively, the comparison means may include means for comparing the center position of the rising edge and the falling edge of that pulse.

The electron beam irradiation means may include main scan means for moving a sample under test with respect to electron beam and sub scan means for repeatedly deflecting electron bean in a direction different from a main scan direction simultaneously with the main scan.

The electron beam irradiation means can switch an operation mode between a first mode in which individual wiring lines of a sample under test are irradiated with electron beam and a second mode in which all of the wiring lines of the sample are irradiated with electron beam in the lump and the data processing means may include means for analyzing, every constant positional section, spacial frequency of current waveform measured as a variation of current value for electron beam irradiating position in the first mode and detecting a position in which sections having the same spacial frequency continue for a constant time period and means for, under an assumption that a plurality of wiring lines are arranged in an array in the detected position, setting the electron beam irradiation means to the second mode and obtaining defect ratio in the lump.

The means for obtaining information related to the structure in the depth direction preferably includes means for obtaining a three-dimensional configuration of a through-hole provided in an insulating film by measuring values of current produced by irradiation of electron beam passing through a portion of the insulating film, which surrounds the through-hole, with increased acceleration voltage.

In order to obtain a three-dimensional configuration of a through-hole provided in an insulating film, it is necessary to know a thickness of the insulating film. The technique disclosed in JP S62-19707A, P2000-124276A or P2000-180143A may be used therefor.

The semiconductor device tester may further include means for tilting a sample stage on which a sample under test is mounted and the means for obtaining the three-dimensional configuration preferably includes means for detecting whether a diameter of a through-hole is increased or decreased with depth, from measured values obtained when electron beam and an incident angle of electron beam to the sample are changed.

The means for obtaining the information related to a structure in a depth direction may include means for detecting deviation of a circuit pattern in an insulating film from measured value of current produced by electron beam passing through the insulating film.

Although a technique for measuring a deviation of mask position is disclosed in JP H11-026343A, the measurement of the mask position deviation utilizes a measuring pattern with which a through-hole is provided when the mask positions are registered. It does not use electron beam passing through an insulating film.

The means for detecting deviation of circuit pattern preferably includes means for evaluating a deviation of circuit patterns in respective layers from measured values when penetrating depth of electron beam is changed by changing acceleration voltage. In order to obtain a position of the insulating layer in which the circuit patterns overlap, means for taking in an information related to the circuit patterns from CAD data is preferably provided.

In the construction mentioned above, acquisition of current waveform is performed by electron beam scanning and measured current contains current flowing through a capacitance of a sample depending upon irradiation frequency or scanning frequency. Therefore, there may be a case where D.C. current, which can not flow through the sample essentially, is measured as if it flows through the sample. In order to avoid such phenomenon, the data processing means preferably includes means for correcting current component flowing through a capacitance of a sample under test, which is caused by irradiation frequency of electron beam or scanning frequency. In detail, in a case where the electron beam irradiation means has a construction in which pulsed electron beam is generated repeatedly, it includes means for changing the repetition period of electron beam pulse and the correcting means preferably includes means for obtaining the D.C. component by extrapolating current value when the sample is continuously irradiated with electron beam from current values measured by the current measuring means when the sample is irradiated with electron beam with different repetition period. The semiconductor device tester may further include means for switching scan speed of electron beam from the electron beam irradiation means and the correcting means may include means for obtaining a current value when the scanning speed, which is zero, is extrapolated from the current values measured by the current measuring means when the sample is scanned by electron beam at different scan speeds.

BRIEF DESCRIPTION OF THE DRAWINGS

The above mentioned and other objects, features and advantages of the present invention will become more apparent by reference to the following detailed description of the present invention taken in conjunction with the accompanying drawings, in which:

FIGS. 3(a) and 3(b) show an aperture construction, in which FIG. 3(a) shows an aperture for collimating electron beam to beam having a circular cross section and FIG. 3(b) shows an aperture for collimating electron beam to beam having a square cross section;

FIGS. 4(a) and 4(b) illustrate a test of a contact-hole having a circular cross section with using an SEM, in which FIG. 4(a) illustrates a test method and FIG. 4(b) shows an example of a test result;

FIGS. 5(a) and 5(b) illustrate a test of a tapered contact-hole having circular cross section with using an SEM, in which FIG. 5(a) illustrates a test method and FIG. 5(b) shows an example of a test result;

FIGS. 6(a) and 6(b) illustrate a measuring method of a circular contact-hole, in which FIG. 6(a) shows a structure of a circular contact-hole to be measured and FIG. 6(b) shows a measuring system thereof;

FIGS. 7(a) and 7(b) illustrate a measuring method of a tapered contact-hole, in which FIG. 7(a) shows a structure of a circular contact-hole to be measured and FIG. 7(b) shows a measuring system thereof;

FIGS. 10(a) and 10(b) illustrate a measurement using electron beam of which cross sectional area is larger than the aperture of the hole, in which FIG. 10(a) shows a structure of a contact-hole to be measured and a measuring system therefor and FIG. 10(b) shows an example of a result of measurement;

FIGS. 11(a) and 11(b) illustrate a measurement using electron beam of which cross sectional area is larger than the aperture of the hole, in which FIG. 11(a) shows a structure of a contact-hole to be measured and a measuring system therefor and FIG. 11(b) shows an example of a result of measurement;

FIGS. 12(a) and 12(b) illustrate a measurement using electron beam having cross sectional diameter smaller than a diameter of a contact-hole, in which FIG. 12(a) shows a structure of a contact-hole to be measured and a measuring system therefor and FIG. 12(b) shows an example of a result of measurement;

FIGS. 14(a), 14(b) and 14(c) illustrate an example of measurement of a circular contact-hole with using vertical electron beam together with SEM, in which FIG. 14(a) shows a structure of the contact-hole to be measured and a measuring system therefor, FIG. 14(b) shows an amount of secondary electron measured along a center line of the contact-hole and compensation current, with respect to irradiating position of electron beam and FIG. 14(c) shows a restored three-dimensional display of the contact-hole;

FIGS. 15(a), 15(b) and 15(c) illustrate an example of measurement of a tapered contact-hole with using vertical electron beam together with SEM, in which FIG. 15(a) shows a structure of the tapered contact-hole to be measured and a measuring system therefor, FIG. 15(b) shows an amount of secondary electron measured along a center line of the tapered contact-hole and compensation current, with respect to irradiating position of electron beam and FIG. 15(c) shows a restored three-dimensional display of the tapered contact-hole;

FIGS. 16(a) and 16(b) illustrate an example of measurement of a circular contact-hole with using slanted electron beam together with SEM, in which FIG. 16(a) shows a structure of the contact-hole to be measured and a measuring system thereof and FIG. 16(b) shows an amount of secondary electron measured along a center line of the contact-hole and compensation current, with respect to irradiating position of electron beam;

FIGS. 17(a) and 17(b) illustrate an example of measurement of a tapered contact-hole with using slanted electron beam together with SEM, in which FIG. 17(a) shows a structure of the contact-hole to be measured and a measuring system therefor and FIG. 17(b) shows an amount of secondary electron measured along a center line of the contact-hole and compensation current, with respect to irradiating position of electron beam;

FIGS. 18(a), 18(b) and 18(c) illustrate an example of measurement of a reverse-tapered contact-hole with using vertical electron beam together with SEM, in which FIG. 18(a) shows a structure of the tapered contact-hole to be measured and a measuring system therefor, FIG. 18(b) shows an amount of secondary electron measured along a center line of the reverse-tapered contact-hole and compensation current, with respect to irradiating position of electron beam and FIG. 18(c) shows a restored three-dimensional display of the reverse-tapered contact-hole;

FIGS. 19(a) and 19(b) illustrate a method for detecting and specifying an extraordinary thing in a contact-hole, in which FIG. 19(a) shows a structure of the contact-hole to be measured and a measuring system therefor and FIG. 19(b) shows an amount of secondary electron measured along a center line of the contact-hole and compensation current, with respect to irradiating position of electron beam;

FIGS. 20(a) and 20(b) illustrate a method for detecting and specifying an extraordinary thing in a tapered contact-hole, in which FIG. 20(a) shows a structure of the contact-hole to be measured and a measuring system therefor and FIG. 20(b) shows an amount of secondary electron measured along a center line of the contact-hole and compensation current, with respect to irradiating position, FIGS. 21(a) and 21(b) illustrate a method for detecting and specifying an extraordinary thing in a reverse-tapered contact-hole, in which FIG. 20(a) shows a structure of the contact-hole to be measured and a measuring system therefor and FIG. 20(b) shows an amount of secondary electron measured along a center line of the contact-hole and compensation current, with respect to irradiating position;

FIGS. 22(a), 22(b) and 22(c) illustrate an example of measurement of a contact-hole with using electron beam having large cross sectional area, in which FIG. 22(a) is a plan view showing a positional relation between the contact-hole and electron beam, FIG. 22(b) is a cross sectional view thereof and FIG. 22(c) shows compensation current obtained with respect to scanning position of electron beam and differentiated value thereof;

FIGS. 29(a) and 29(b) show an example of a result of test, in which FIG. 29(a) shows an example of a normal chip and FIG. 29(b) shows a defective chip;

FIGS. 30(a) and 30(b) show an example of a result of test performed with using thin electron beam, in which FIG. 30(a) shows an example of a normal chip and FIG. 30(b) shows a defective chip;

FIGS. 31(a) and 31(b) show an example of a result of test when a plurality of randomly arranged wiring lines are irradiated with electron beam having a linear cross section, in which FIG. 31(a) shows an example of a normal chip and FIG. 31(b) shows a defective chip;

FIGS. 32(a) and 32(b) show an example of a result of test when wiring lines have identical configurations in longitudinal directions, in which FIG. 32(a) shows an example of a normal chip and FIG. 32(b) shows a defective chip;

FIGS. 33(a) and 33(b) show an example of a result of test when wiring lines having different width exist in axis-symmetry, in which FIG. 33(a) shows an example of a normal chip and FIG. 33(b) shows a defective chip;

FIGS. 34(a) and 34(b) show an example of a result of test when wiring lines having different widths exist randomly, in which FIG. 34(a) shows an example of a normal chip and FIG. 34(b) shows a defective chip;

FIGS. 39(a) and 39(b) show a relation between wiring coverage of electron beam and current waveform, in which FIG. 39(a) shows an example when the coverage is 100% and FIG. 39(b) shows an example when the coverage is 50%;

FIGS. 43(a) and 43(b) show a test result, in which FIG. 43(a) shows a normal wiring and FIG. 43(b) shows defective wiring;

FIGS. 59(a) and 59(b) illustrate an evaluation example of interlayer deviation, in which FIG. 59(a) is a cross section of a device and FIG. 59(b) shows a result of measurement;

FIGS. 60(a) and 60(b) illustrate another evaluation example of interlayer deviation in which FIG. 60(a) is a cross section of a device with no deviation and FIG. 60(b) shows a result of measurement;

FIGS. 61(a) and 61(b) illustrate another evaluation example on a similar device with that of FIGS. 60(a) and 60(b), in which FIG. 61(a) is a cross section of the device and FIG. 61(b) shows a result of measurement;

FIGS. 62(a) and 62(b) illustrate an another evaluation example of interlayer deviation, in which FIG. 62(a) is a cross section of a device and FIG. 62(b) shows a result of measurement;

DETAILED DESCRIPTION OF THE PREFERRED EMBODIMENTS

Figure 1:
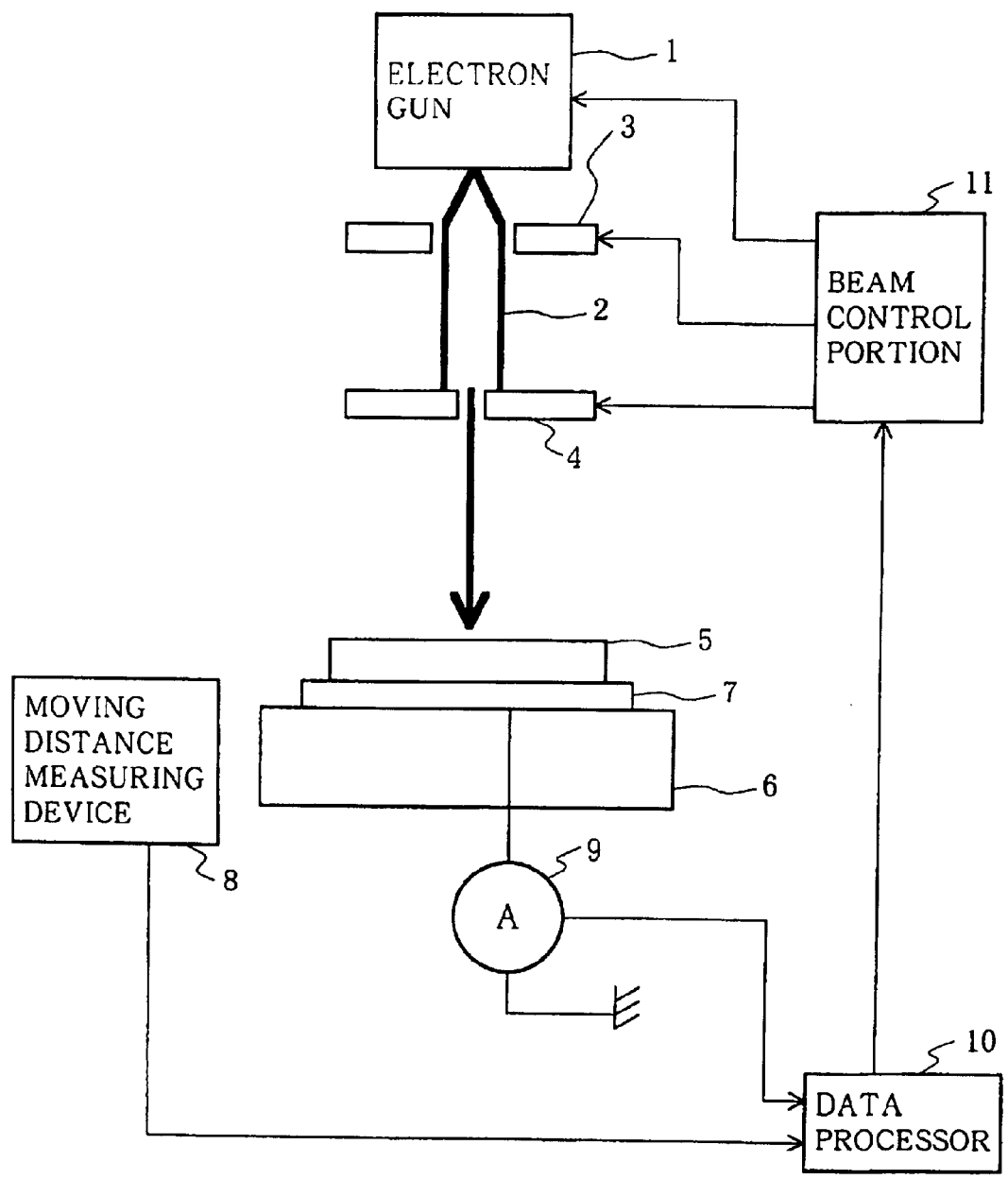
FIG. 1 is a block diagram of a semiconductor device tester according to a first embodiment of the present invention

The present invention will be described in detail with reference to the drawings. In the drawings, same or similar components are depicted by same reference numerals, respectively, with detailed description thereof being omitted.
Generation of Parallel Electron Beam FIG. 1 is a block diagram showing a construction of a semiconductor device tester according to a first embodiment of the present invention. The semiconductor device tester includes an electron gun 1 for generating electron beam 2, a condenser lens 3 and an aperture plate 4, which collimates the electron beam 2, a movable stage 6 for scanning irradiating positions of a sample 5 with electron beam by moving the sample 5, an electrode 7 and an ammeter 9, which measures current produced in the sample 5 by irradiation of electron beam 2, a moving distance measuring device 8 for measuring a moving distance of the movable stage 6, a data processor 10 such as a computer processing data resulting from the ammeter 9 and a beam control portion 11 for performing controls such as change of acceleration voltage of electron beam and/or change of irradiation period.

Electron beam 2 emitted from the electron gun 1 is once collimated to parallel beam by the condenser lens 3 and directed to the aperture plate 4 having very small aperture. The aperture plate 4 is made of such as metal and is grounded such that electron irradiating the aperture plate 4 is not accumulated therein. Electron beam 2 passed through the small aperture of the aperture plate 4 becomes very thin beam having cross sectional area substantially equal to an area of the aperture and fallen in the sample 5. In order to prevent the diameter of the aperture from being changed by thermal expansion of the aperture plate 4, the aperture plate 4 may be cooled suitably.

Figure 3A:
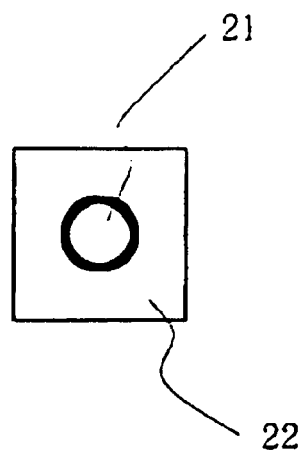
Figure 3B:
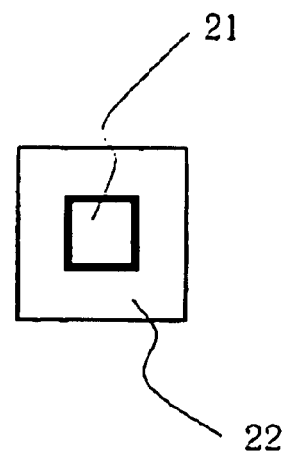

FIGS. 3(a) and 3(b) show examples of a construction of the aperture plate including an aperture and a shielding portion, in which FIG. 3(a) shows an aperture 21 provided in a center portion of the aperture plate formed of an electron beam shielding material for collimating the cross section of electron beam to circular and FIG. 3(b) shows an aperture 21 for collimating the cross section of electron beam to square. Each of the apertures 21 is surrounded by a shielding portion 22. The shielding portion 22 of the aperture plate 4 is formed of tungsten, molybdenum, silicon, polysilicon, gold, palladium or titanium, etc., which, when irradiated with electron beam, hardly generates gas. A diameter of the aperture 21 is in a range from several hundreds Å to 1000 Å when a distance is to be obtained by scanning an interior of a contact-hole or several microns when a whole single contact-hole is irradiated with electron beam at one time. The shape of the aperture 21 is not limited to square or circular. A rectangular, ellipsoidal or other polygonal aperture may be used.

The cross sectional area of electron beam may be larger or smaller than the area of the aperture 21. When the cross sectional area of electron beam is smaller than that of the aperture 21, it is possible to obtain a similar result to that obtainable when electron beam having cross sectional area larger than that of the aperture 21, by scanning the aperture 21 therewith.

The sample 5 is mounted on the electrode 7, which is mounted on the movable stage 6. The moving distance measuring device 8 for measuring the moving distance of the movable stage 6 precisely in angstrom order according to the principle of an interferometer is provided in the vicinity of the movable stage 6. Although an optical system is usually used as the moving distance measuring device 8, it is possible to use other system for detecting a physical amount which is changed with distance, such as a system utilizing electromagnetic wave, electric resistance or capacitance or a system utilizing a quantum-mechanical effect.

The sample 5 may be in contact with the electrode 7 so that it can contact with the electrode in D.C. sense or, when electron beam irradiating the sample 5 is high frequency-modulated, the sample 5 may be arranged adjacent to the electrode 7 since current can be measured by an capacitive coupling. In general, in the fabrication method of semiconductor device, a local oxide film for element separation is formed on a rear surface of a substrate. Therefore, an insulating film is usually formed on the rear surface of the substrate. When the sample 5 is such wafer, it may be effective to use a capacitive coupling stage in order to realize an electric contact between the sample 5 and the stage 6. Alternatively, it may be possible to provide an electrical connection by utilizing side faces of the wafer.

Since size of the contact-hole to be measured is very small, the sample 5 should be put on the stage 6 flat. In order to realize such arrangement of the sample 5 on the stage 6, it may be effective to press an outer periphery of the sample 5 onto the stage 6 by using such as ring-shaped jig.

Current collected by the electrode is measured by the ammeter 9. The measured current is converted into a digital signal and outputted to the data processor 10. In order to improve the anti-noise characteristics of the tester, it may be effective to construct the ammeter 9 with a differential amplifier.

The data processor 10 processes various data and, particularly, can obtain an information related to a structure of a sample under test in a depth direction thereof from a difference of transmittivity of electron beam of the sample when scanned with electron beam at different acceleration voltages.

Figure 2:
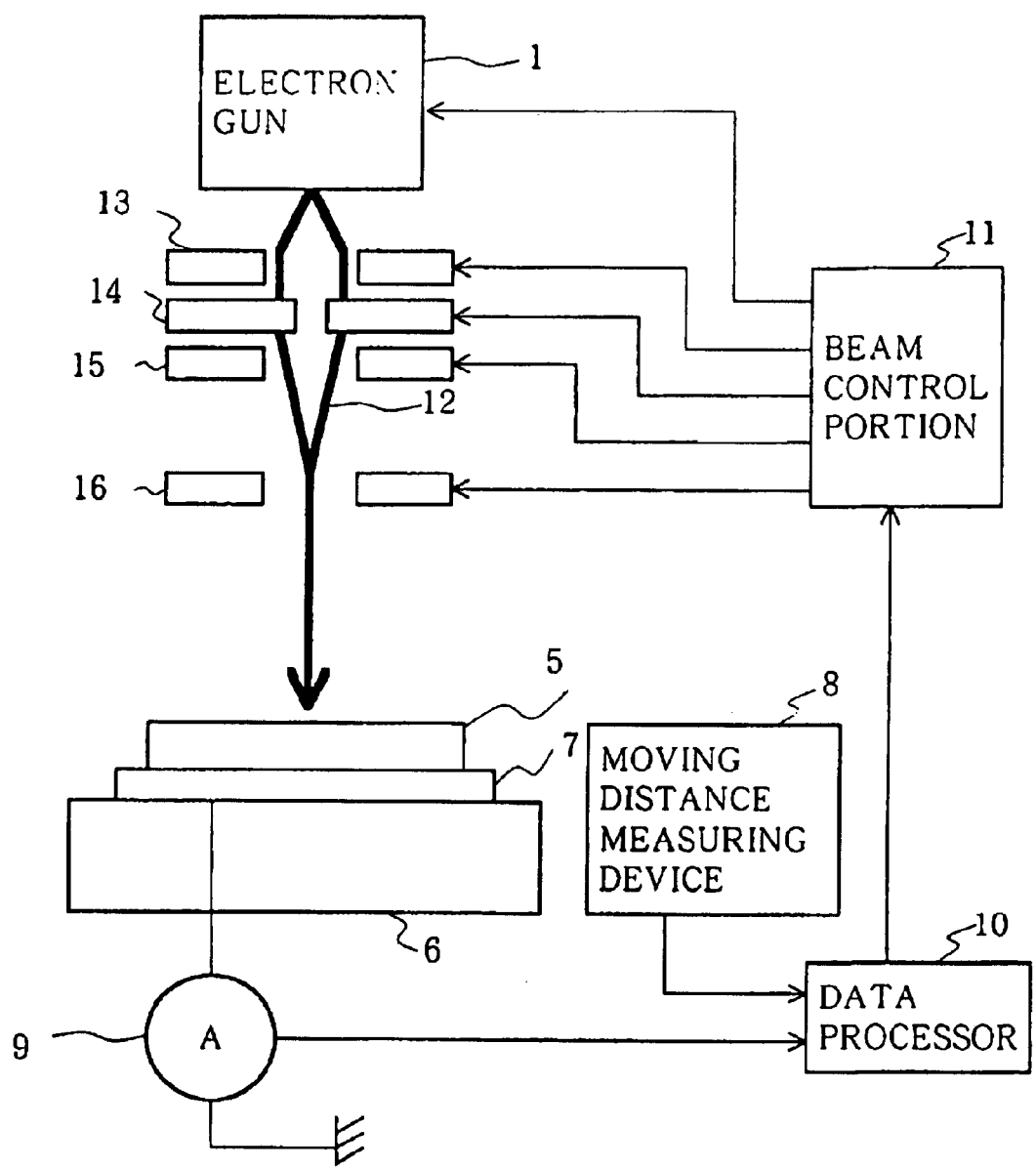
FIG. 2 is a block diagram of a semiconductor device tester according to a second embodiment of the present invention.

FIG. 2 is a block diagram of a semiconductor device tester according to a second embodiment of the present invention, which is suitable when a cross sectional area of electron beam is on the order of a micron. In this tester, an electron beam generation system includes an afocal system composed of a second condenser lens 15 and an objective lens 16 and constitutes an electron optics system for converting incident parallel beam into parallel beam having cross sectional area smaller than an aperture area of an aperture plate 14.

That is, electron beam 12 emitted from the electron gun 1 is converted into parallel beam by the first condenser lens 13 and, then, converted into thin parallel beam by the aperture plate 14. Thereafter, the thin parallel beam is converged by the second condenser lens 15 and directed to the objective lens 16. In this electron beam generating system, the final beam, which is used to irradiate the sample 5, is formed without using the aperture of the aperture plate. Therefore, it is possible to easily form very thin electron beam having cross sectional area in the order of 100 Å, which is difficult to realize with an aperture by directly machining the aperture plate. By scanning a wide area by such thin electron beam, it is possible to provide a similar effect to that obtainable when the sample is totally irradiated with thick electron beam.

Figure 4A:
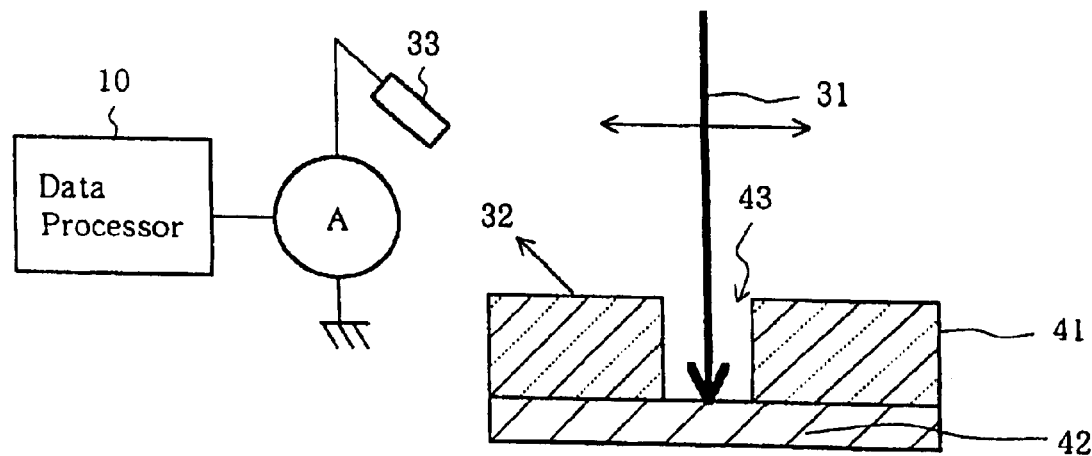
Figure 4B:
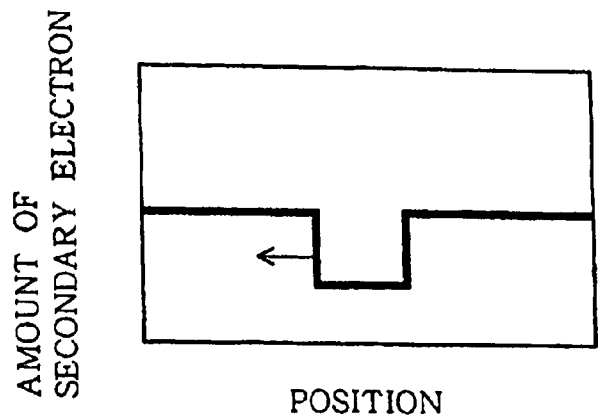
Figure 5A:
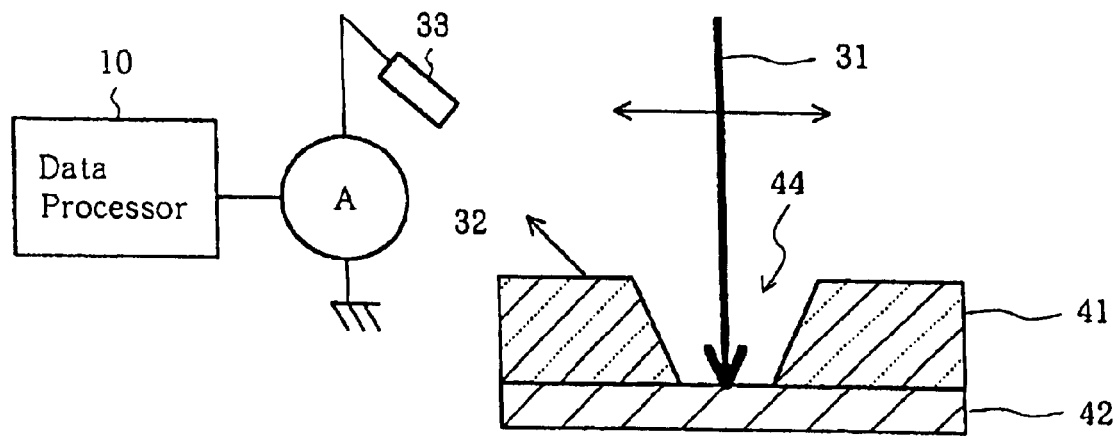
Figure 5B:
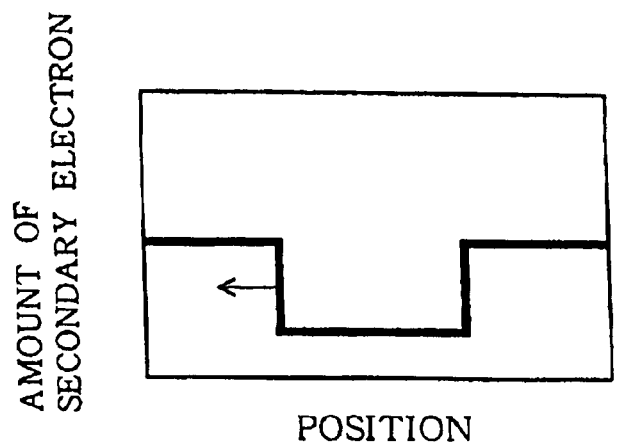

When a secondary electron detector is added to the semiconductor device tester shown in FIG. 1 or 2, it can be utilized in an SEM shown in FIG. 4(a) or FIG. 5(a).

Now, a contact-hole, which is to be tested in this invention, will be described. The contact-hole is formed in an oxide film or a dielectric film formed on an underlying substrate such as a silicon substrate such that it extends from a surface of the oxide film or the dielectric film down to a surface of the substrate. In a normal contact-hole, the surface of the substrate or a surface of a wiring layer formed thereon is in an exposed state.

The contact-hole is formed by applying reactive ion etching with using fluorine containing gas as an etchant to an oxide film on which a resist having an opening is provided. The contact-hole currently used mainly has a very thin structure having aspect ratio of 10 or more, that is, a diameter of the contact-hole with respect to a thickness of the oxide film, which is usually several microns thick, is 0.15 microns. The reactive ion etching is a physicochemical etching. Practical etching speed depends upon an etching speed of the oxide film by ions of flourine containing gas supplied vertically to the surface of the substrate at high speed and a forming speed of a high molecular fluorocarbon film produced by the etching in general, the etching reaction of the oxide film inside the contact-hole, to which ions of fluorine containing gas impinge, is enhanced and a high molecular fluorocarbon film is deposited on the sidewall of the contact-hole formed by the same etching reaction. Since the sidewall of the contact-hole is protected by this mechanism, it becomes possible to form a very deep vertical hole. On the other hand, when the etching progresses and the contact-hole reaches the underlying substrate, the oxide film etching reaction is changed to a reaction for etching a high molecular film, since there is no oxygen in the substrate. Therefore, the progress of etching into the underlying substrate is automatically terminated.

Since, however, a balance of these reactions is sophisticated, there may be a case where the etching of the oxide film is suddenly stopped before the contact-hole reaches the underlying substrate or where the underlying substrate is etched, by variation of sophisticated condition of the fabrication equipment. Since such phenomenon causes a defective contact-hole or through-hole to be formed, such defect must be detected.

Measurement of Bottom Diameter of Contact-Hole

A technique for measuring a bottom diameter of such contact-hole will be described.

Figure 6A:
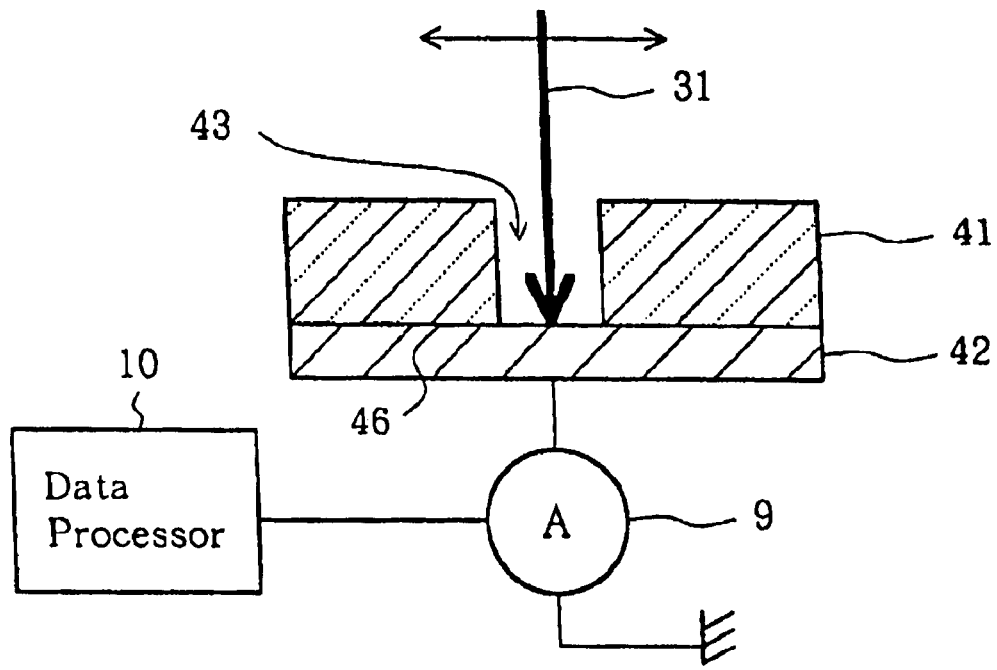
Figure 6B:
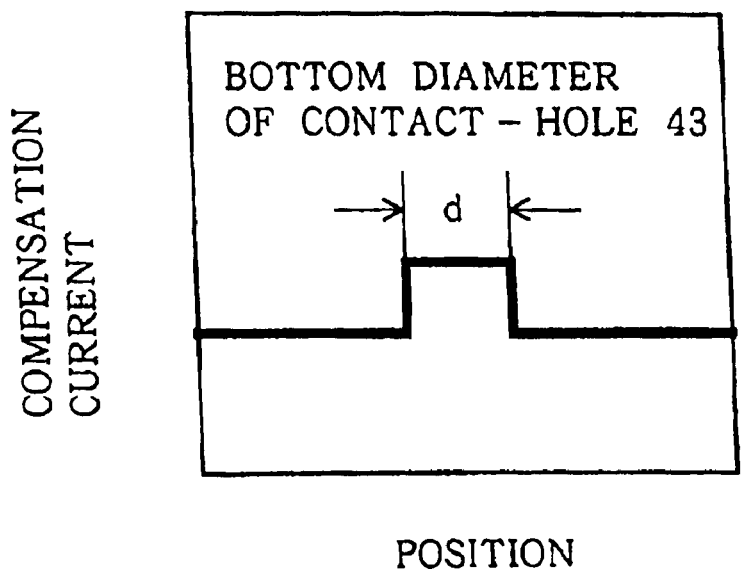

FIGS. 6(a) and 6(b) illustrate the measuring method, in which FIG. 6(a) shows a structure of a contact-hole 43 to be measured and a measuring system therefor and FIG. 6(b) shows an example of a result of measurement. The contact-hole 43 is formed such that it penetrates an insulating film 41 formed on an underlying substrate 42. The insulating film 41 may be an oxide film or a nitride film, etc. In a good, that is, normal contact-hole, a surface of the underlying substrate 42 or a surface of a wiring layer formed below the insulating film is exposed. Electron beam 31 having a diameter in the order of 100 & angst; and generated by the tester shown in FIG. 1 or FIG. 2 is vertically directed to a sample having the contact-hole 43 formed therein while scanning it horizontally. Acceleration voltage and current of electron beam 31 are set to in a range from 0.5 kV to several kV and several nA, respectively. When electron beam 31 passes through the contact-hole 43 down to the underlying substrate 42, current flows through the underlying substrate 42. The current is referred to as ""compensation current". FIG. 6(b) shows compensation current produced when the sample is scanned by electron beam in a horizontal direction along a center line of the contact-hale 43.

Since the electron beam has a finite cross sectional area, the compensation current starts to rise at a time when the electron beam crosses an edge portion of the bottom of the contact-hole, as shown in FIG. 6(b). When the electron beam exits from the bottom portion of the contact-hole, compensation current starts to decrease from the saturated value and becomes zero when the electron beam completely leaves the contact hole.

Since the cross section of the contact-hole is usually circular, a distance characterizing the contact-hole is a diameter or radius of the circle defining the bottom portion of the contact-hole. In order to obtain the diameter or radius of the contact-hole, it is necessary to perform the measurement along a line passing through a center of the contact-hole. This can be done by exactly obtaining a position to be irradiated with electron beam from a secondary electron image or CAD data, which is a design information, and controlling a position control motor of the wafer stage or controlling electron beam by means of a deflector such that the electron beam irradiated position moves along the center line of the contact-hole.

The compensation current shown on an ordinate in FIG. 6(b) depends upon the thickness of the oxide film on the bottom portion of the contact-hole. That is, the compensation current in a region of a thick oxide film such as sidewall of the contact-hole becomes substantially zero, while large compensation current is observed in a region in which underlying silicon or underlying wiring layer is exposed. Therefore, the compensation current observed along the center line of the contact-hole is zero outside the region of the contact-hole and becomes a certain value larger than zero in the region in which silicon is exposed. Since the region in which the compensation current is not zero corresponds to the region in which the bottom portion of the contact-hole is exposed, a width within which silicon is exposed is obtained by measuring the distance. Therefore, the measured distance corresponds to the diameter of the bottom portion of the contact-hole.

Figure 7A:
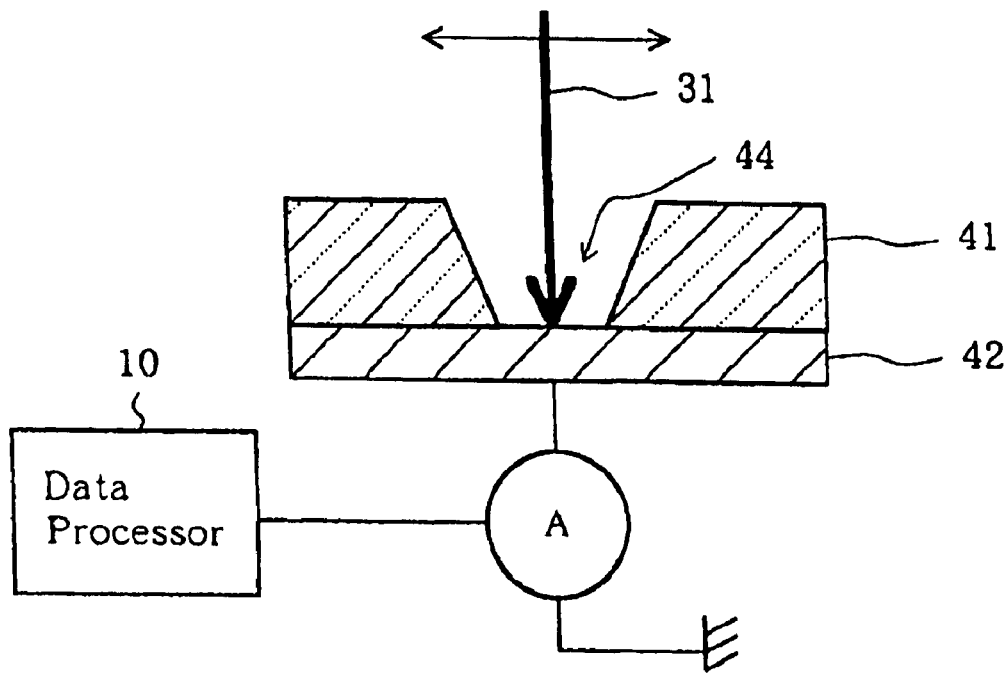
Figure 7B:
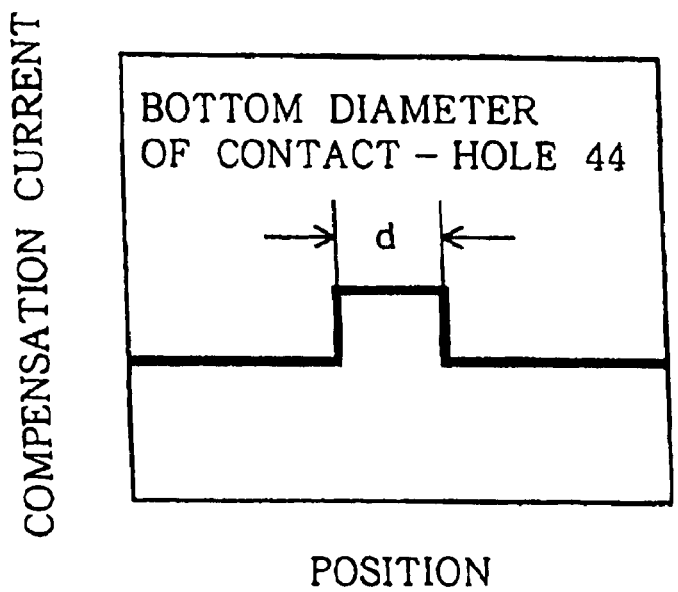

FIGS. 7(a) and 7(b) illustrate a measurement of a tapered contact-hole, in which FIG. 7(a) shows a structure of a contact-hole to be measured and a measuring system therefor and FIG. 7(b) shows an example of a result of measurement. A diameter of the tapered contact-hole 44 to be measured reduces from that of an opening portion thereof with depth thereof. A taper angle is relatively large and thickness of an insulating film 41 exceeds 1000 Å immediately when a position irradiated with electron beam is shifted only slightly from a bottom of the contact-hole. In a region in which the apparent thickness of the insulating film 41 is large, there is substantially no compensation current produced. Since the compensation current is produced in a region in which the bottom of the contact-hole is exposed and substantially no current is produced otherwise, a distance along which the compensation current is observed corresponds to a diameter of the bottom of the contact-hole. As such, even when the contact-hole is tapered, it is possible to measure the distance of the bottom of the contact-hole even when the contact-hole is tapered.

Incidentally, since the cross sectional diameter of electron beam is finite, the waveform of compensation current has a rising portion and a falling portion. Therefore, the diameter of the contact-hole can be obtained from various positional information contained in the waveform of compensation current such as rising position, falling position or a position at which the current is returned to zero from a position at which the current completely saturates, etc.

Depending upon the acceleration voltage of the electron beam, there may be a case where the compensation current flows even if the bottom portion of the contact-hole is not irradiated with electron beam if the taper angle is not large. By utilizing this phenomenon and repeating the measurement while changing the acceleration voltage, it is possible to obtain a three-dimensional structure of the contact-hole, as to be described in detail later.

Figure 8:
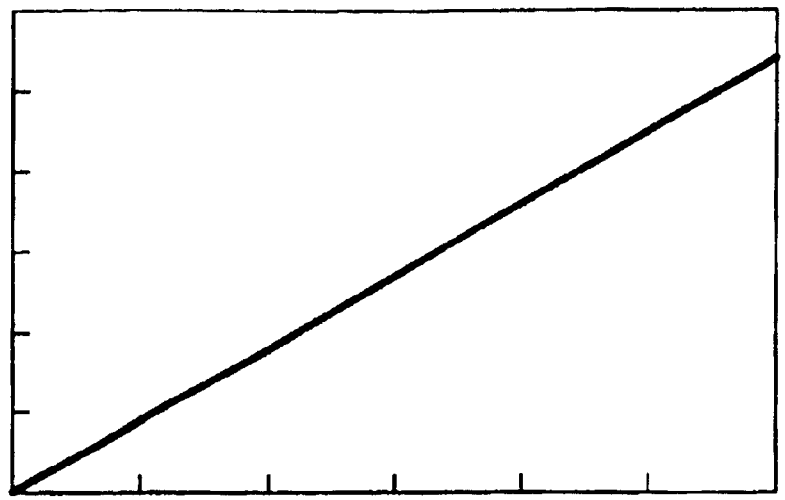
FIG. 8 shows a variation of compensation current with respect to a bottom area of a contact-hole.

FIG. 8 shows a variation of compensation current observed when a bottom area of a contact-hole is changed under condition in which a whole bottom portion of the contact-hole is irradiated with uniform electron beam. As shown in FIG. 8, it is clear that the compensation current is proportional to the bottom area of the contact-hole.

Figure 9:
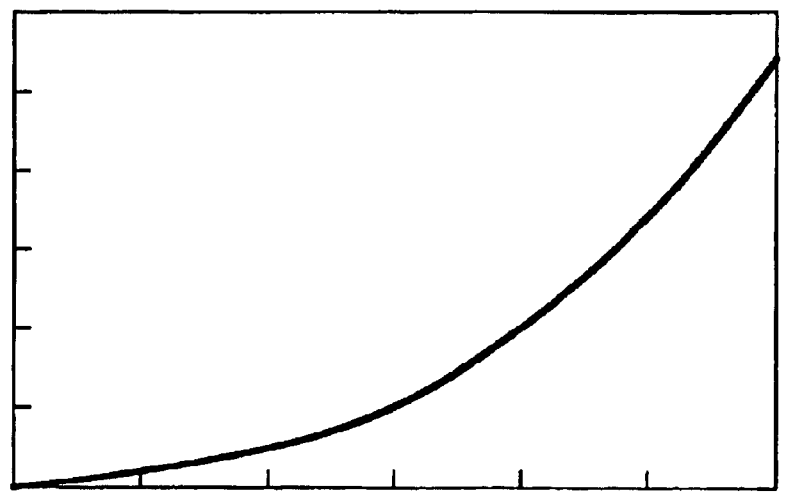
FIG. 9 shows a variation of compensation current with respect to diameter of a contact-hole.

FIG. 9 shows a variation of compensation current corresponding to a diameter (converted bottom diameter of contact-hole) of a circular bottom area of the contact-hole. Since the area is proportional to square of the diameter of the bottom of the contact-hole, the compensation current becomes proportional to the square of the bottom diameter.

Figure 10A:
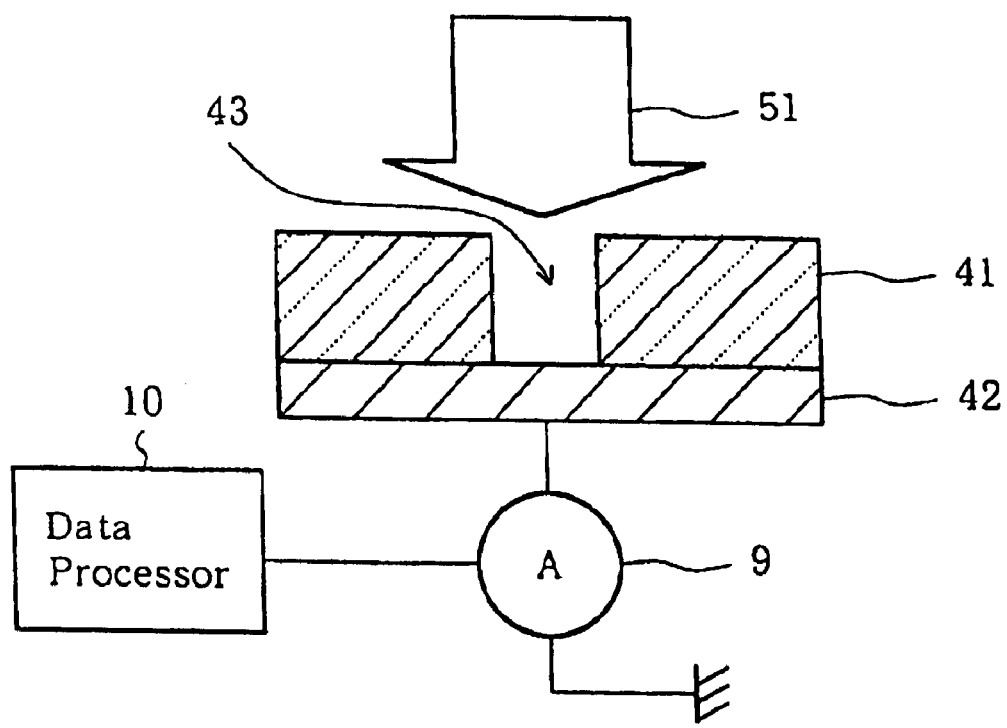
Figure 10B:
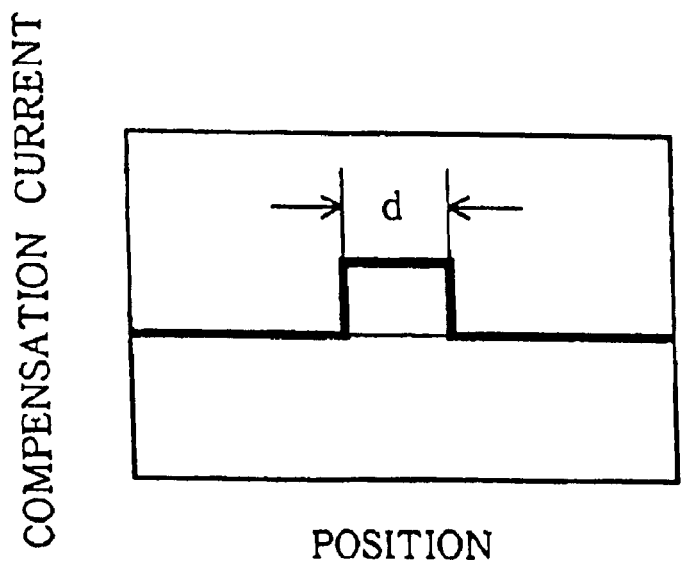
Figure 11A:
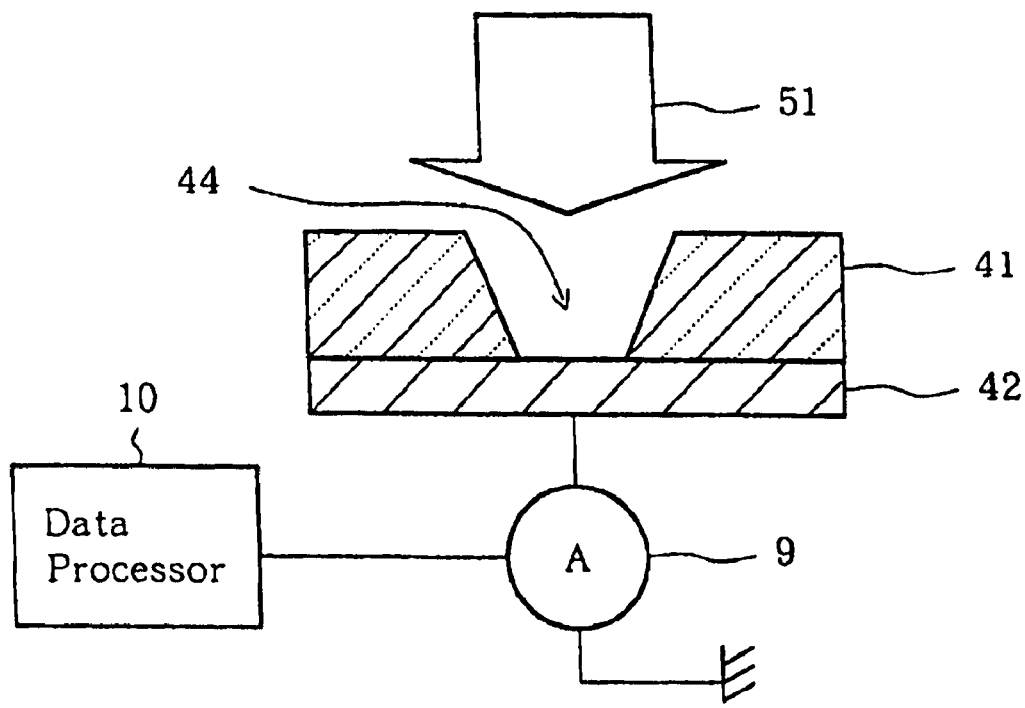
Figure 11B:
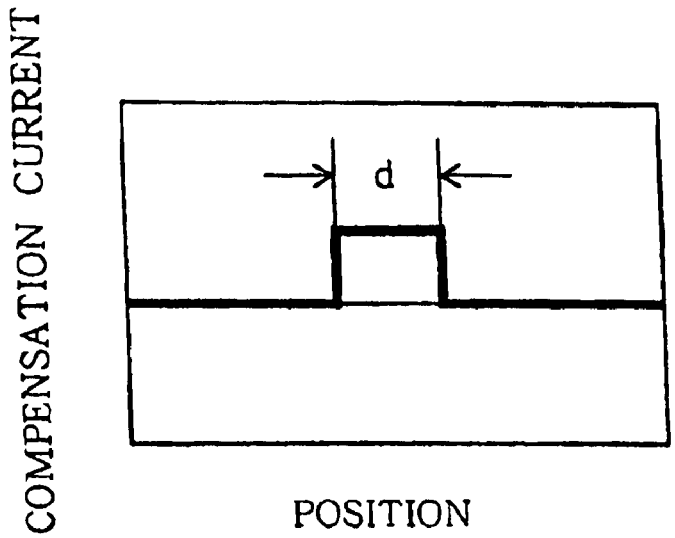

FIGS. 10(a) and 10(b) illustrate a measurement of a contact-hole by using electron beam of which cross sectional area is larger than the aperture of the hole, in which FIG. 10(a) shows a structure of a contact-hole to be measured and a measuring system therefor and FIG. 10(b) shows an example of a result of measurement. FIGS. 11(a) and 11(b) illustrate a measurement of a tapered contact-hole by using electron beam of which cross section area is larger than the aperture of the hole, in which FIG. 11(a) shows a structure of the contact-hole to be measured and a measuring system and FIG. 11(b) shows an example of a result of measurement. In each of the measurements, the electron beam generator shown in FIG. 1 or FIG. 2 is used and a cross sectional area of the electron beam is set to a value (for example, several microns square) larger enough than an area of the contact-hole. Compensation current is measured under condition that a sample is vertically irradiated with electron beam such that a whole bottom of the contact-hole thereof is irradiated simultaneously with the electron beam. An electron beam source is preferably capable of emitting electron beam whose intensity distribution within a cross sectional beam area is as flat as 1% or less.

When a whole contact-hole 43 or 44 is irradiated with electron beam 51 at once, compensation current produced in an exposed portion of an underlying substrate 42 is measured by an ammeter 9 at once. Since the secondary electron emitting efficiency is specific to substance to be irradiated with electron beam, an amount of compensation current in unit area of the region in which the underlying layer is exposed is constant throughout the region if electron beam irradiation condition is the same. Therefore, when the whole bottom of the contact-hole 43 or 44 is irradiated with electron beam 51, compensation current, which is proportional to the bottom area of the contact-hole 43 or 44, is observed as shown in FIG. 10(*b*) or FIG. 11(*b*).

Utilization of Standard Sample

The compensation current thus obtained may be changed delicately upon measuring condition. Therefore, the compensation current is converted into an area of a contact-hole by using a standard value of compensation current obtainable when a state of a sample is known. That is, a compensation current per unit area of a standard sample having a contact-hole, a bottom area of which is known, is preliminarily measured under certain electron beam irradiating condition and, then, an amount of compensation current for a sample having a contact-hole, bottom area of which is unknown, is obtained by irradiating it with similar electron beam. The amount of compensation current obtained for the unknown sample is divided by the compensation current of the standard sample to obtain a ratio of the bottom area of the contact-hole of the sample under test to the bottom area of the contact-hole of the standard sample. This procedure is based on an assumption that an amount of compensation current per unit bottom area of the contact-hole of the standard sample is equal to an amount of compensation current per unit bottom area of the contact-hole of the sample under test.

Figure 12A:
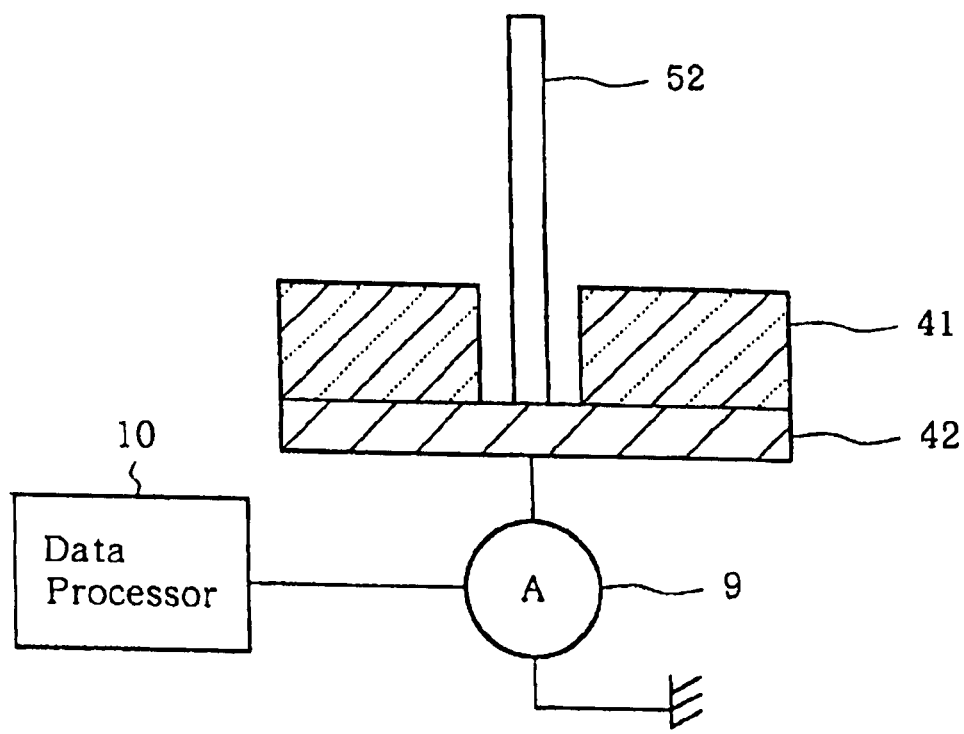
Figure 12B:
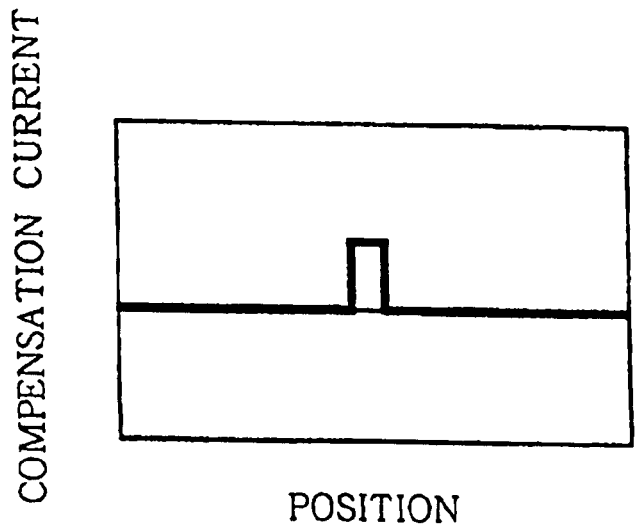

FIGS. 12(*a*) and 12(*b*) illustrate a similar measurement of a bottom of a contact-hole by using electron beam having cross sectional diameter smaller than a diameter of the contact-hole, in which FIG. 12(*a*) shows a structure of the contact-hole to be measured and a measuring system and FIG. 12(*b*) shows an example of a result of measurement. When the cross sectional area of electron beam is smaller than that of the contact-hole, compensation current is obtained in only a position irradiated with electron beam. However, by integrating values of current produced by scanning a whole area of the contact-hole to be tested, it is possible to obtain the diameter of the contact-hole according to a similar procedure to that used to obtain the total compensation current. In a case where time constant of the ammeter is large, the integrated value of current becomes substantially proportional to the average current value. Therefore, it is possible to estimate a diameter of the contact-hole by using the average current value indicated on the ammeter.

In a case where the tilting angle of a sidewall of the tapered contact-hole is small, compensation current flows naturally even when a bottom of the contact-hole is not irradiated with electron beam since the thickness of the insulating film becomes small. The condition under which the above method can be simply applied can be determined by thickness of the insulating film, power of electron beam and taper angle of the contact-hole, etc.

Since compensation current per unit area depends upon material exposed in the bottom of the contact-hole, acceleration voltage of electron beam and/or injected current. It is necessary to obtain a relation between compensation current and area by performing required preliminary experiments and to convert the relation into a table or a function when the measurement is performed with using other material or other condition.

Example of Measurement of Bottom Diameter of Contact-Hole

The inventors have calculated the bottom diameter of the contact-hole by using a sample made on an experimental basis and have verified the calculation. In the experiment, a contact-hole having a circular cross section such as shown in FIG. 10(*a*) was preliminarily fabricated as a standard sample. A diameter of an opening portion of the contact-hole and a diameter of a bottom portion of the contact-hole were 0.1 micron, respectively, a material exposed on the bottom of the contact-hole was silicon, an insulating film, which becomes a sidewall of the contact-hole, was a silicon oxide film. When electron beam was directed with acceleration voltage of 1 kV, compensation current of 100 pA was observed. Then, compensation current for a contact-hole such as shown in FIG. 11(*a*) having the same opening diameter as that of the standard contact-hole and an unknown bottom diameter was measured under a similar condition. Compensation current of about 50 pA was observed for the unknown sample, from which it was confirmed that the bottom area of the unknown contact-hole is 50% of that of the standard contact-hole.

On the other hand, the configuration of a practical contact-hole can be investigated by the cross sectional configuration test (destructive test) of SEM. By obtaining a correspondence between the diameter of the contact-hole of the standard sample, which is obtained from the cross sectional area, and the compensation current thereof, it is possible to obtain the bottom area of the contact-hole from the measured compensation current of the unknown sample. Further, assuming that the shape of the bottom of the contact-hole of the unknown sample is analogous to that of the standard sample regardless of its diameter, the diameter of the contact-hole to be measured can be obtained by a root of the area.

In the above described experiment, the diameter of the contact-hole of the unknown sample was 0.07 microns.

The number of scans of a contact-hole with electron beam. However, in order to improve the preciseness of measurement, it is possible to scan the same position several times. In such case, it is possible to calculate a diameter of contact-hole from an average value of compensation current obtained when a certain test region is scanned several times.

Determination of Compensation Current per Unit Area when Bottom Area is Unknown

A method for determining compensation current per unit area when the standard sample having a contact-hole whose bottom area is known can not be prepared will be described with reference to FIGS. 12(*a*) and, 12(*b*). In the method, electron beam 52, which is sufficiently thinner than an opening area of a contact-hole of a sample and has a known spot size, is vertically directed into the contact-hole. Since the spot size of electron beam produced by the tester shown in FIG. 1 or FIG. 2 is restricted by size of the aperture forming in the aperture plate, it is possible to obtain the size of the electron beam by calculation. In order to further improve the accuracy of measurement, the diameter of electron beam is directly obtained by the knife edge method, etc. When such electron beam is directed to a standard contact-hole, compensation current such as shown in FIG. 12(*b*) is measured. A compensation current per unit area of the standard contact-hole is obtained by dividing the thus obtained compensation current by the spot size of electron beam.

Utilization in Mass-Production Factory

Figure 13:
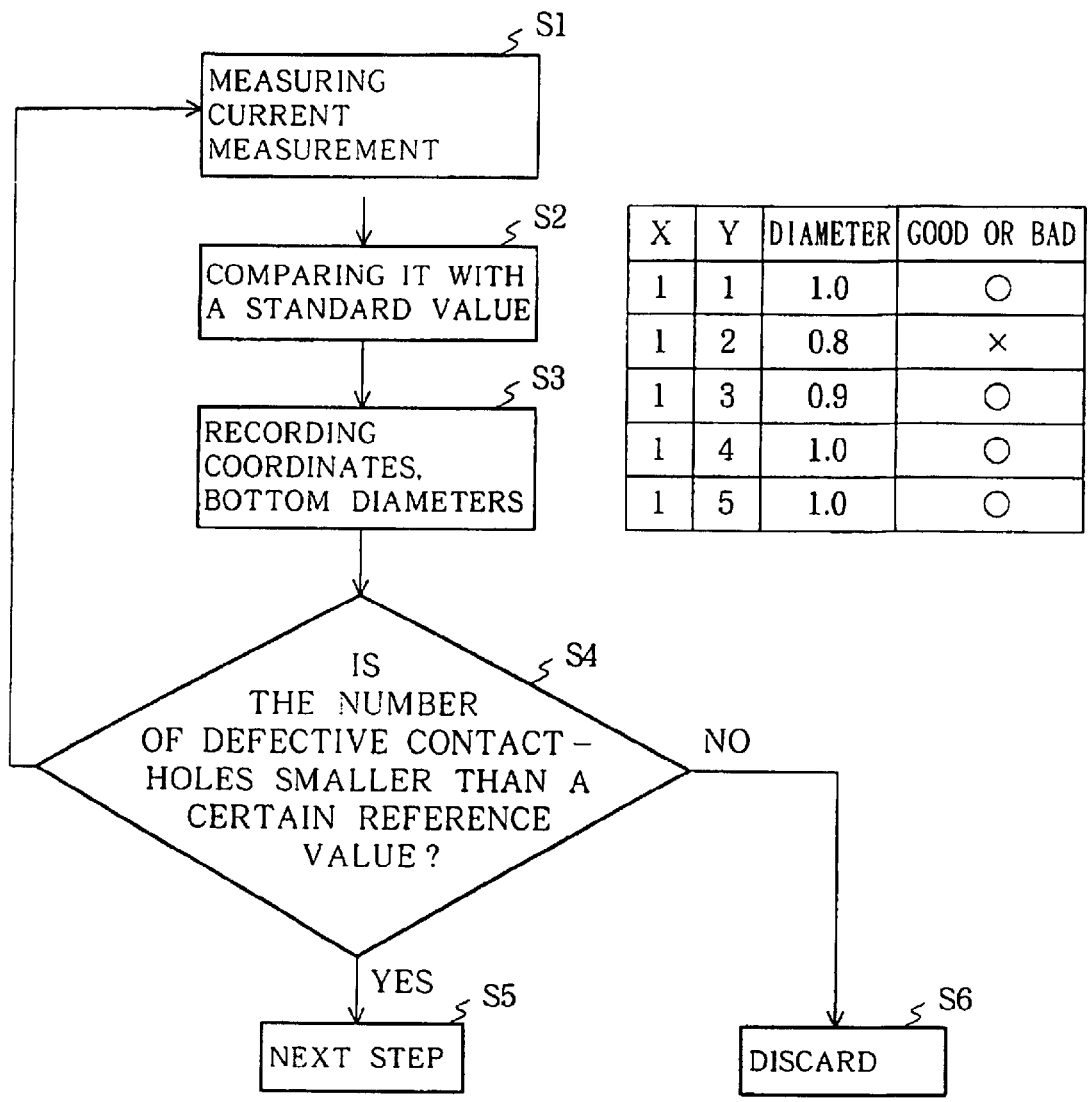
FIG. 13 is a flowchart of a measurement of a bottom diameter of a contact-hole in a mass-production factory and an example of a quality determination.

FIG. 13 shows a flowchart in a case where the above describe bottom diameter measurement of contact-hole is utilized in a mass-production factory and a table showing an example of good or bad determination.

The size of contact-hole is one of factors which determine the amount of current flowing through the contact-hole. In a high speed memory or a logic device, very high speed pulse signals operate with sophisticated timing. Since a size variation of contact-hole changes a time constant of a circuit through a contact resistance thereof, the pulse transmission time becomes different from a designed value, causing an operation of the circuit to be defective. Therefore, when there is a size variation of contact-holes, which exceeds a certain range, it affects a related circuit adversely even if an electric connection is established. In order to prevent such defect from occurring, it is necessary in a mass-production factory to severely manage a variation of bottom diameters of contact-holes to be fabricated.

It is assumed, for example, that a contact-hole having bottom diameter of 0.1 micron is formed with fabrication tolerance of ±0.01 micron (±10%). The bottom diameter tolerance of 10% is equivalent to a converted area tolerance of ±20%. The bottom size of contact-hole is managed on the basis of this reference according to the flowchart shown in FIG. 13.

First, compensation current of each of contact-holes existing in a wafer is measured by using electron beam (S1). A result of the measurement is stored in a memory or a magnetic disk. The recording medium is not limited thereto and may be any other medium provided that it can record the result of measurement. Then, a standard compensation current obtained by a normal contact-hole is compared with the measured and recorded compensation current (S2). If a difference of the recorded compensation current from the standard compensation current is within ±20%, the measured contact-hole is decided as a normal contact-hole and an information indicating that the measured contact-hole is normal is recorded in the memory. A table in FIG. 13 shows an example of results of decision obtained for contact-holes positioned in X-Y coordinates (1, 1) . . . (1, 5) with measured bottom diameters and quality decisions thereof (S3). When the number of defective contact-holes is smaller than a certain reference value (S4), the wafer is put on a wafer carrier for transportation to a next step (S5). On the other hand, when the number of defective contact-holes exceeds the reference value, the wafer itself is decoded as defective. In such case, the succeeding process for the wafer is stopped and the wafer in question is put on a carrier to discard it (S6). In this case, an instruction for regulating an etching apparatus, etc., is sent to the factory side.

For the measured values of bottom diameters of the respective contact-holes, a statistical value thereof, such as dispersion or average, etc., of the measured values, is calculated and compared with a statistical value of the normal contact-holes. Since a result of such comparison can be analyzed before defective electric connection of contact-hole occurs practically, it is possible to precisely know fluctuation and/or tendency of the process change. Further, since it is possible to find defective wafer quickly, it is possible to know causes from which the wafer becomes defective to thereby prevent occurrence of subsequent defective products.

In a recent semiconductor integrated circuit device, the scale of circuit is very large and the number of contact-holes is being increased in geometric progression. In such circuit device, it is difficult to measure all of the contact-holes in a wafer. On the other hand, a plurality of identical chips are regularly arranged on the wafer. It is possible to determine the quality of the chips by interlace-scanning identical positions of the respective chips. In such case, it is also possible to measure, in the lump, bottom diameters of a plurality of contact-holes in the positions of the respective chips to be scanned to obtain an average bottom diameter. In the case where the average bottom diameter of a plurality of contact-holes is to be obtained, it is possible to use a single thick electron beam collimated by the aperture to irradiate the contact-holes or scan the contact-holes with thin electron beam in the jump. When the single thick electron beam is used to irradiate the contact-holes in the lump, it may be possible to obtain an average value by irradiating the contact-holes with electron beam a plurality of times. Similarly, the number of electron beam scans may be one or a plurality of times.

Map Display

Further, it is possible to map results of measurement of compensation current of a wafer or diameter of a contact-hole, etc., correspondingly to positions at which the measurement is performed. For example, it is possible to know a distribution of diameters of the contact-holes in the wafer by mapping the compensation current values or the diameters of the contact-holes as a contour line. The contour map display can be performed by storing the compensation current information and the position information thus obtained and displaying them on an image display device or a recording sheet, etc.

When the information is displayed on the image display device with using the compensation current value or the diameter of the opening portion of the contact-hole as a reference, there may be a case where luminance is too high or too low, causing an image on a screen to be hardly looked. Therefore, it is necessary to correct the image display to thereby make the displayed image easily visible. As a correction method of the image display, a regulation of luminance on the basis of a center value may be considered, for example. Further, since defective products are more important than good products in fabrication process, it is preferable to make an information of defective product easier to see.

Quality Determination by Map Display and Process Evaluation

The quality of contact-hole can be classified on the basis of compensation current, diameter of contact-hole or configuration of contact-hole. By classifying every wafer or every plural wafers on the basis of identical etching condition identical processing device or identical processing device used in the preceding step, various information can be acquired. These classification data are preferably displayed by a method similar to the contour display. In such case, it is possible not only to determine the quality of wafer but also to know an etching distribution or other processing state of an etching device, so that it becomes easy to early detect a failure of the processing machine and optimize the processing condition by such as averaging the etching rate of the etching machine.

For example, the contact-hole is usually formed by dry-etching and the etching machine therefor is regulated such that the etching rate becomes equal for a whole area of the machine. Nevertheless, the whole surface includes locations in which etching rate is high and locations in which etching rate is low, inevitably. Comparing contour line displays of results of measurement of contact-holes of a plurality of wafers, the tendency of total etching rate distribution of the etching machine is known. Therefore, it is possible to improve the evenness of etching rate of the etching machine by regulating the machine, for example, changing a tilting angle of the electrode thereof, such that the total etching rate distribution is corrected.

There may be various methods for acquiring the etching rate distribution of a plurality of wafers. For example, the distribution may be obtained by collecting only wafers etched under identical working condition or standardizing wafers etched under different conditions.

One reason for existence of the etching rate distribution is a thickness distribution of an insulating film formed prior to the etching step. The thickness distribution of the insulating film may be due to a state of CVD device. In such case, it is possible to investigate a cause of defective product by collecting data of wafers, whose etching step is performed by using the same machine as that used in a preceding fabrication. By using such data, it becomes possible to specify a problem of the preceding step from the measurement of diameter of contact-hole, with which the etching quality is determined.

In a case where the tendency of the etching machine is known, it is possible to shorten a time required for the measurement, by testing not a whole surface of a wafer but only locations of the surface in which defect tends to occur. For example, it may be possible to measure only portions of the wafer at which the etching rate is high (large compensation current and large opening diameter) or low (small compensation current and small opening diameter).

From the diameter distribution of contact-holes, other information than that mentioned above, which is valuable in newly starting up the etching machine, regulating the etching machine after overhaul and/or confirming repair performed for the etching machine, is obtained and it becomes possible to complete the works such as start-up and regulation of the etching machine within a short time by supplying data necessary for these works from the information. Further, the diameter distribution of contact-hole is also used as a maintenance information of the etching machine. For example, it is possible to perform a precise estimation of an overhaul timing by statistically monitoring deviation of a defective contact-hole distribution from a good contact-hole distribution and increase of defective contact-holes, etc., or using it in an extraordinary substance test to be described later. Further, there is another effect that an abnormality of the etching machine can be detected before the abnormality occurs.

In the usual fabrication of semiconductor wafer, the batch system is employed. That is, a plurality of wafers are fabricated as a batch in each fabrication step. Therefore, the quality determination of wafer may be done for only a first wafer and a last wafer in the batch. When it is confirmed that the first wafer becomes defective in a certain fabrication step, all of wafers succeeding the first wafer may be tested and, at a time when a defect is detected, the fabrication machine used in that step may be regulated or may be regulated on the basis of the measurement result of the first wafer.

Linkage with SEM

Since the contact-hole has a three-dimensional structure, it is very preferable to obtain a test result which can clearly show a feature of the three-dimensional contact-hole. Although a method for obtaining an exact three-dimensional structure of the contact-hole will be described in detail later, the method will be described briefly here.

In the method to be described briefly, a diameter $\alpha$ of an opening portion of a contact-hole, which has a circular cross section usually, a diameter $\beta$ of a bottom portion of the contact-hole and a depth d thereof are specified and a configuration of the contact-hole is roughly represented. That is, an information of a shape or material of the bottom of the contact-hole obtained from the compensation current measured and a shape of the opening portion of the contact-hole obtained from a usual scanning electron image are synthesized. The material information is estimated from an amount of compensation current measured by some acceleration voltages according to the nature that compensation current depends upon an underlying material. The depth of the contact-hole is obtained by an electron beam measurement to be described later. However, it may be obtained by using a thickness of the insulating film in which the contact-hole is formed, practically measured when it is formed.

Figure 14A:
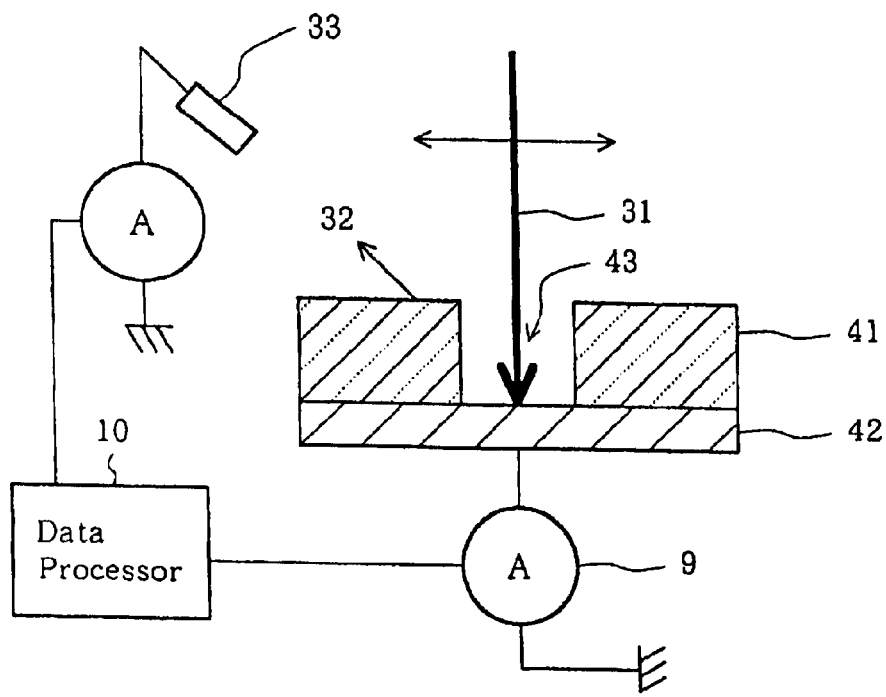
Figure 14B:
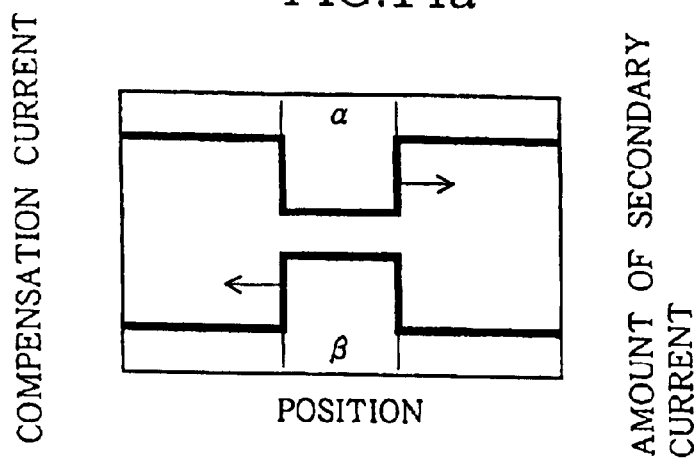
Figure 14C:
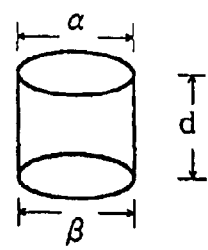
Figure 15A:
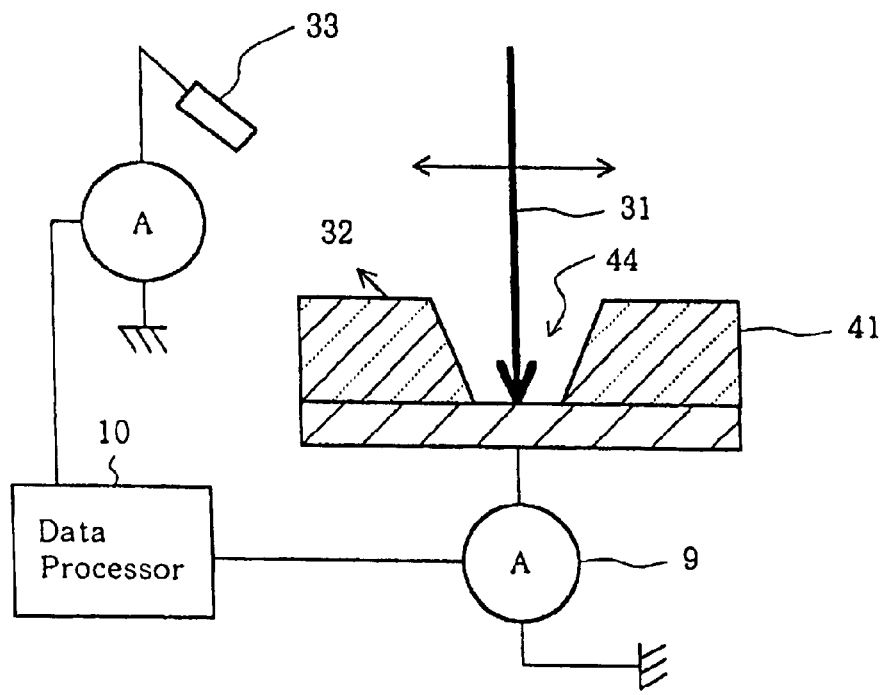
Figure 15B:
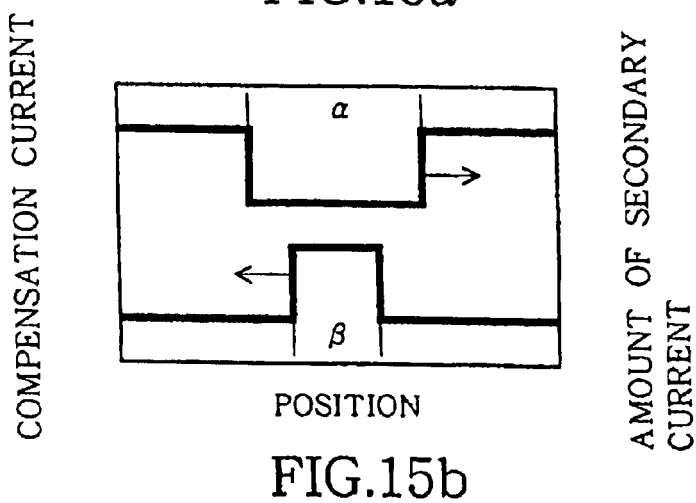
Figure 15C:
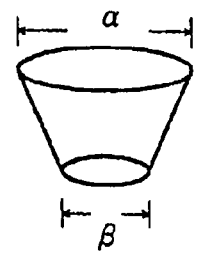

FIGS. 14(a), 14(b) and 14(c) and 15(a) and 15(b) illustrate the measuring method of a contact-hole having a circular cross section and a contact-hole having a tapered contact-hole, respectively, in which FIGS. 14(a) and 15(a) show structures of the circular and tapered contact-holes, respectively, FIGS. 14(b) and 15(b) show relations of secondary electron and compensation current measured along a center line of the contact-hole to electron beam irradiation position and FIGS. 14(c) and 15(c) show three-dimensional displays of restored contact-holes, respectively. For simplicity of description, it is assumed that the contact-hole is scanned once along the center line thereof.

As electron beam scanning a periphery of the contact-hole and an interior thereof, the parallel electron beam obtained by the tester shown in FIG. 1 or FIG. 2 is utilized. When a converging electron beam is used, it is necessary to regulate a focus of the beam to a vertical position which is different between a case where the periphery of the contact-hole is scanned and a case where the bottom of the contact-hole is scanned. However, when the parallel electron beam is used, the focal length becomes infinite and, therefore, there is no need of focus regulation.

The diameter $\alpha$ of the opening portion of the contact-hole 43 shown in FIG. 14(a) is substantially the same as the diameter $\beta$ of the bottom thereof. In this case, the rising and falling positions of the amount of secondary electron and the compensation current are coincident as shown in FIG. 14(b). The three-dimensional configuration of the contact-hole having circular cross section shown in FIG. 14(c) is obtained from the result of measurement and the depth d of the contact-hole, which is obtained from the process data. Further, it is possible to obtain a more precise three-dimensional display by measuring a plurality of cross sectional configurations while changing the scan direction such that it passes the center of the contact-hole. The reduction of cross sectional configuration to a three-dimensional image may be performed by various methods, which are used in the field of three-dimensional computer graphics.

The diameter $\alpha$ of the opening portion of the contact-hole 44 shown in FIG. 15(a) is larger than the diameter $\beta$ of the bottom thereof. In this case, the rising and falling positions of the secondary electron shown by an upper line are different from the rising and falling positions of the compensation current shown by a lower line, respectively, as shown in FIG. 15(b). Width of a region in which the amount of secondary electron is reduced, which corresponds to the opening diameter $\alpha$ is larger than width of a rectangular region in which the compensation current is increased, which corresponds to the bottom diameter $\beta$. By three-dimensionally displaying this together with the depth d of the contact-hole obtained from the process data, the three-dimensional configuration of the contact-hole becomes a reversed cone as shown in FIG. 15(c).

In the case of the tapered contact-hole shown in FIG. 15(a), there may be a case where secondary electron emitted from the tapered portion thereof is detected depending upon a positional relation of the configuration of the tapered portion to the secondary electron detector. However, since the aspect ratio of a practical contact-hole is large, it is usual that secondary electron emitted from the inner wall of the contact-hole is not detected. In FIG. 15(b) and other figures, such secondary electron is neglected unless otherwise noticed.

Linkage with SEM and Slanted Incident Beam

In a case of a reverse-tapered contact-hole having diameter of an opening portion thereof smaller than a diameter of a bottom portion thereof, it is impossible to distinguish the contact-hole from a contact-hole having an opening diameter equal to a bottom diameter when vertical electron beam is directed normally thereto. According to the present invention, the bottom diameter of the contact-hole is measured by slanting an incident electron beam with respect to a sample under test such that electron beam can reach up to a peripheral position of a bottom region of the reverse-tapered contact-hole in order to slant electron beam by a small angle, an electron lens or a deflector for electron beam scanning is utilized. When electron beam is to be slanted by a large angle, a wafer supporting stage is slanted by rotating it about a center axis of the wafer. Since it is easily possible to slant the stage in a range of ± several tens degrees, it is possible to direct electron beam to the reverse-tapered contact-hole at an angle substantially equal to a taper angle of the revere-tapered contact-hole.

Figure 16A:
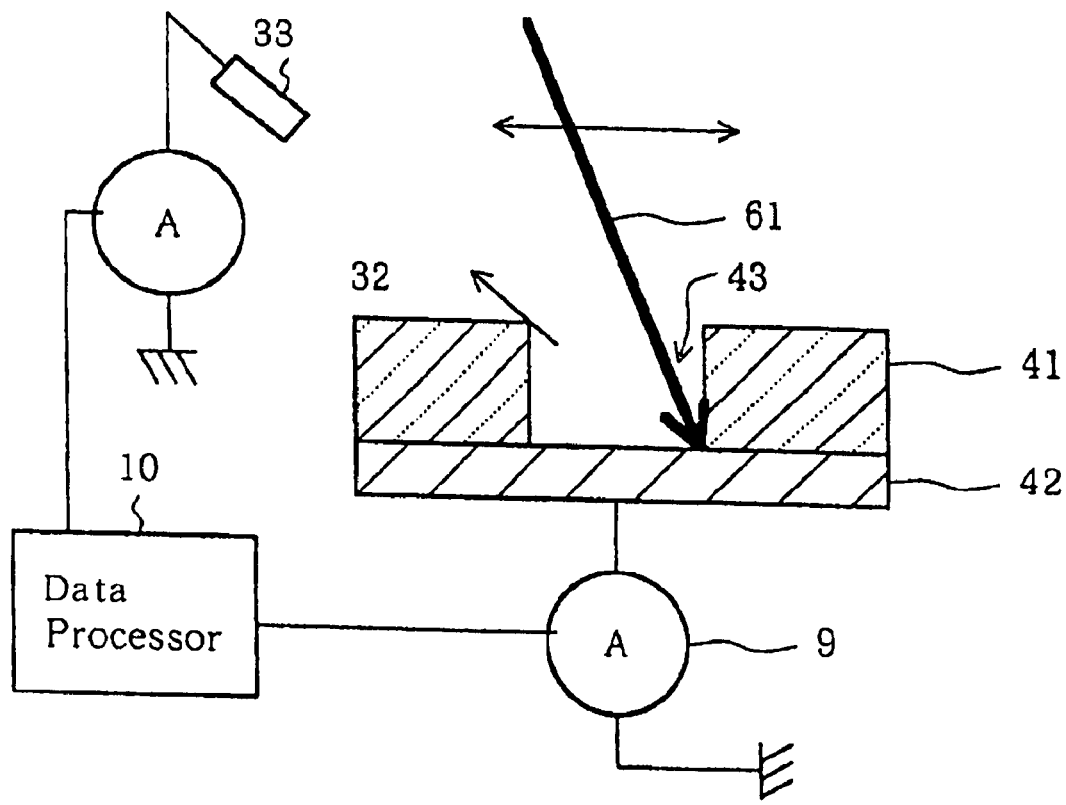
Figure 16B:
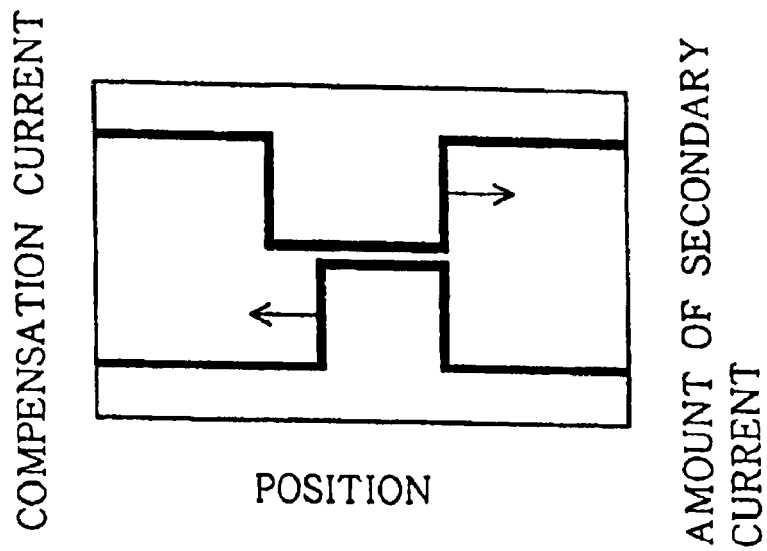
Figure 17A:
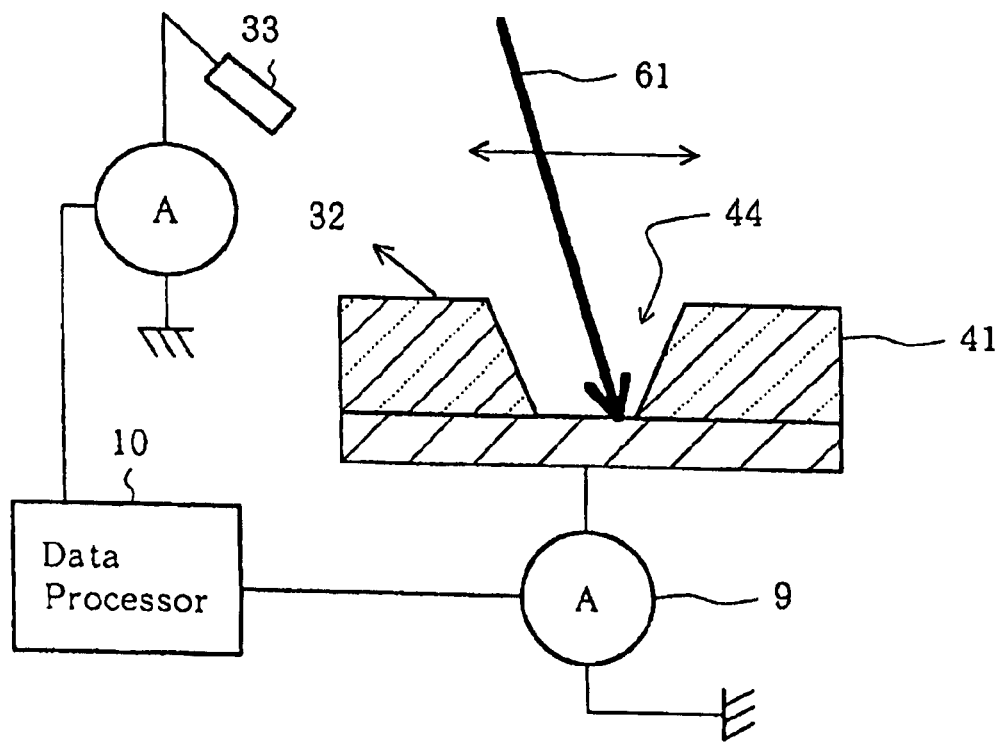
Figure 17B:
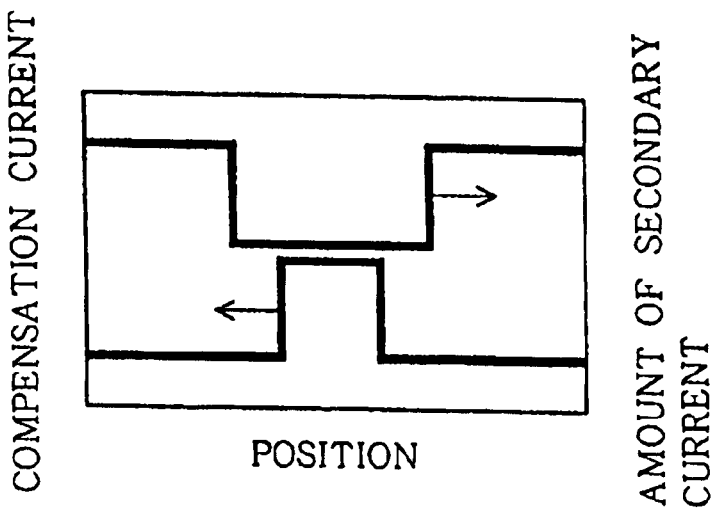
Figure 18A:
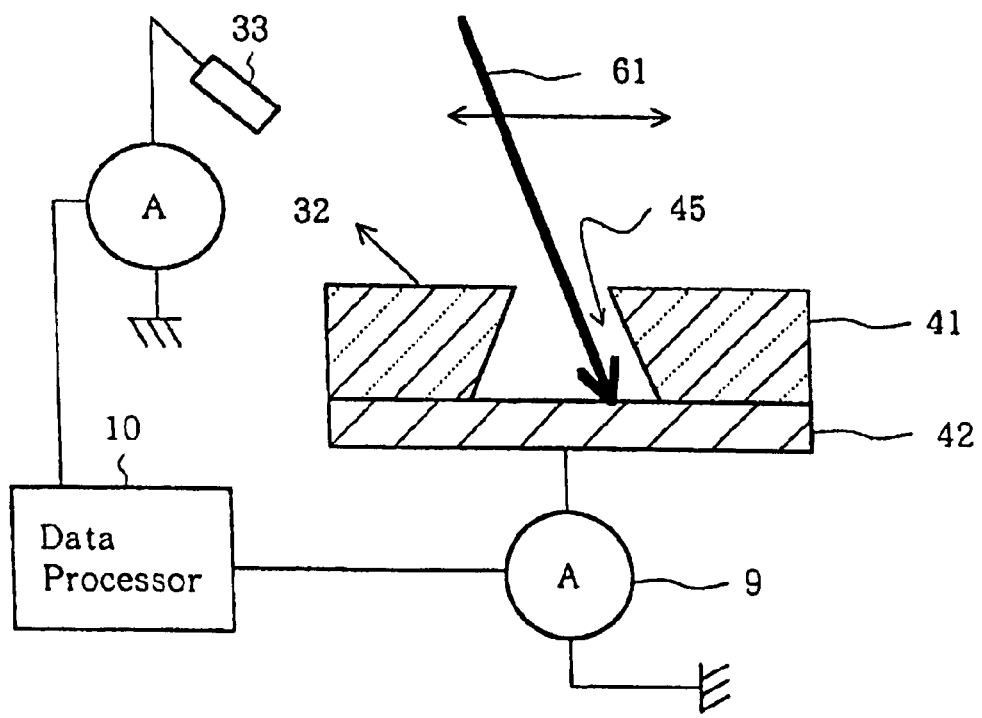
Figure 18B:
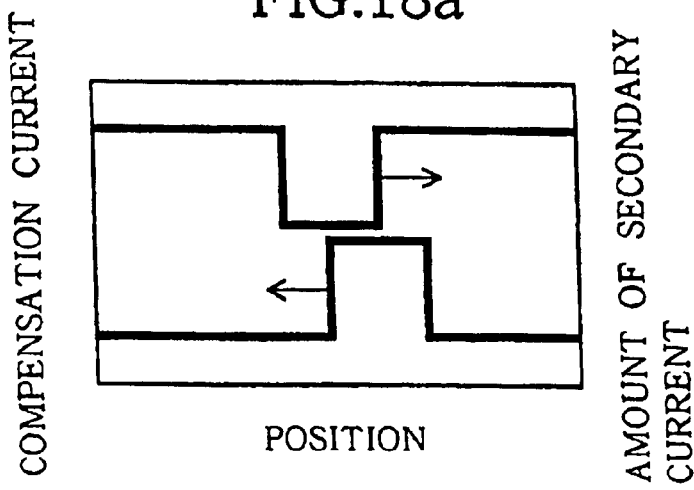
Figure 18C:

FIGS. 16(a) and 16(b), 17(a) and 17(b) and 18(a), 18(b) and 18(c) illustrate examples of measurement of a cylindrical contact-hole, a tapered contact-hole and a reverse-tapered contact-hole, respectively, in which FIGS. 16(a), 17(a) and 18(a) shows structure of the respective contact-holes and measuring systems therefor, FIGS. 16(a), 17(b) and 18(b) show amounts of secondary electron (upper lines) end amounts of measured compensation current (lower lines) with respect to positions irradiated with electron beam. Deviations between measuring points of secondary electron and compensation current caused by the slanted incident beam are corrected to the positions of the contact-holes. FIG. 18(c) shows a three-dimensional configuration of a restored reverse-tapered contact-hole.

When the cylindrical contact-hole 43 (FIG. 16(a)) is irradiated with slanted electron beam 61 while moving the latter along a center axis of the contact-hole, strong secondary electron 32 is observed during a time for which electron beam 61 irradiates a region of an insulating film 41 reaches an edge region of the contact-hole 43, secondary electron is reduced sharply. Secondary electron is not observed during a time for which electron beam 61 irradiates a bottom of the contact-hole 43. When electron beam 61 reaches the insulating film 41 again on the opposite side of the contact-hole 43, secondary electron is detected again. On the other hand, compensation current is not observed during a time for which electron beam 61 irradiates the insulating film 41 and is detected when electron beam 61 reaches the edge of the contact-hole 43. An amount of compensation current is sharply increased when electron beam 61 irradiates the bottom of the contact-hole 43 and sharply reduced when electron beam 61 reaches the insulating film 41 again.

For the tapered contact-hole 44 (FIG. 17(a)), considerable secondary electron is detected during a time for which electron beam 61 irradiates an insulating film 41 and is sharply reduced when electron beam 61 reaches an edge of the contact-hole 44. Substantially no secondary electron is detected during a time for which electron beam 61 irradiates a bottom of the contact-hole 44. When electron beam 61 reaches the insulating film 41 again on the opposite side of the contact-hole 44, secondary electron is observed. On the other hand, compensation current is not detected during a time for which electron beam 61 irradiates a portion of the insulating film 41 surrounding the contact-hole 44 and considerable secondary electron is detected during a time for which electron beam 61 irradiates the bottom of the contact-hole 44. When electron beam 61 irradiates the taper portion again, compensation current is sharply reduced.

In the case of the reverse-tapered contact-hole 45 shown in FIG. 18(a), a large amount of secondary electron is detected during a time for which electron beam 61 irradiates the insulating film 42 surrounding the contact-hole 45 and the amount of secondary electron is sharply reduced when electron beam 61 reaches the edge of the contact-hole 45. Substantially no secondary electron is detected while electron beam 61 irradiates the bottom of the contact-hole 45 and secondary electron is detected at a time when electron beam 61 starts to irradiate the insulating film on the opposite side of the contact-hole 45. On the other hand compensation current is not detected when electron beam 61 irradiates the surface of the insulating film 42. Compensation current is detected only a time period for which electron beam 61 irradiates the bottom of the contact-hole 46. When electron beam 61 irradiates the insulating film 42 or the reverse-tapered portion of the contact-hole again, compensation current is not detected.

When the taper angle of the contact-hole coincides with the tilting angle of incident electron beam, increase or decrease of the amount of secondary electron and decrease or increase of compensation current occurs at the same beam irradiating position. Therefore, in order to obtain a bottom diameter of a reverse-tapered contact-hole, it is necessary to find an incident electron beam angle with which compensation current is detected at outermost position by performing an experiment with using various electron beam incident angles. Since the depth d of the contact-hole is known, it is possible to obtain a distance from the edge of the opening portion of the contact-hole to the outermost periphery of the bottom of the contact-hole, which is outside of the opening portion, from the incident angle of the electron beam and the depth d of the contact-hole and the bottom diameter of the contact-hole is calculated by adding the distance value to the diameter of the opening portion. By using this value additionally, the three-dimensional display of the contact-hole shown in FIG. 18(c) is obtained.

Detection of Extraordinary Substance

Figure 19A:
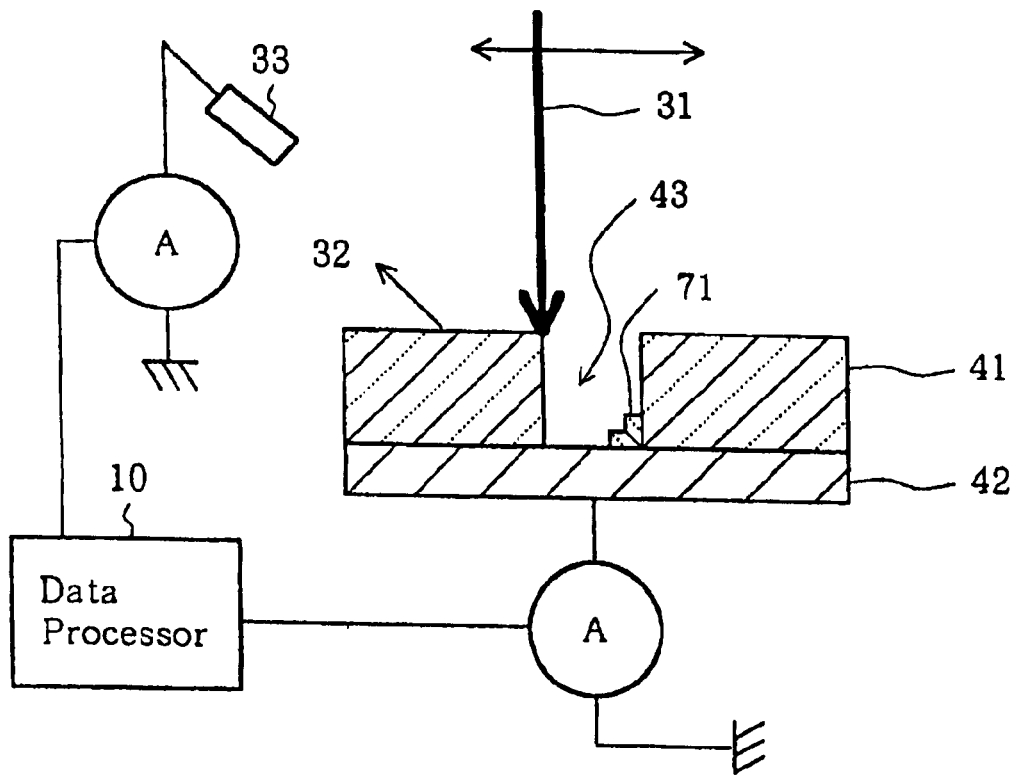
Figure 19B:
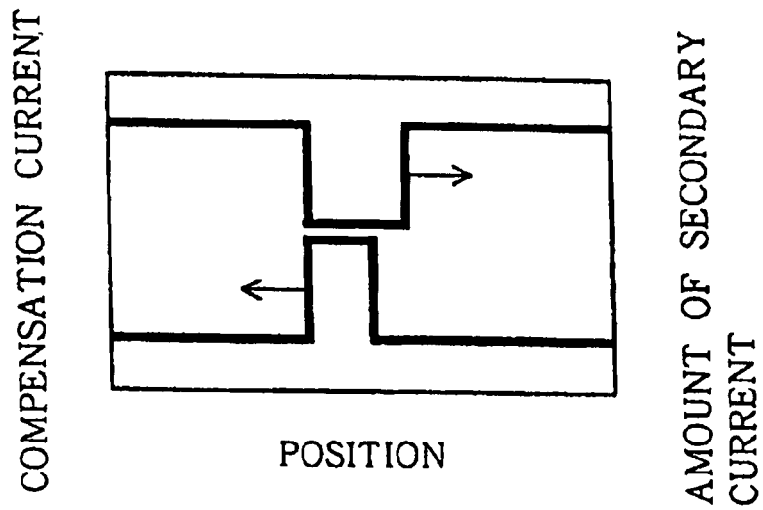
Figure 20A:
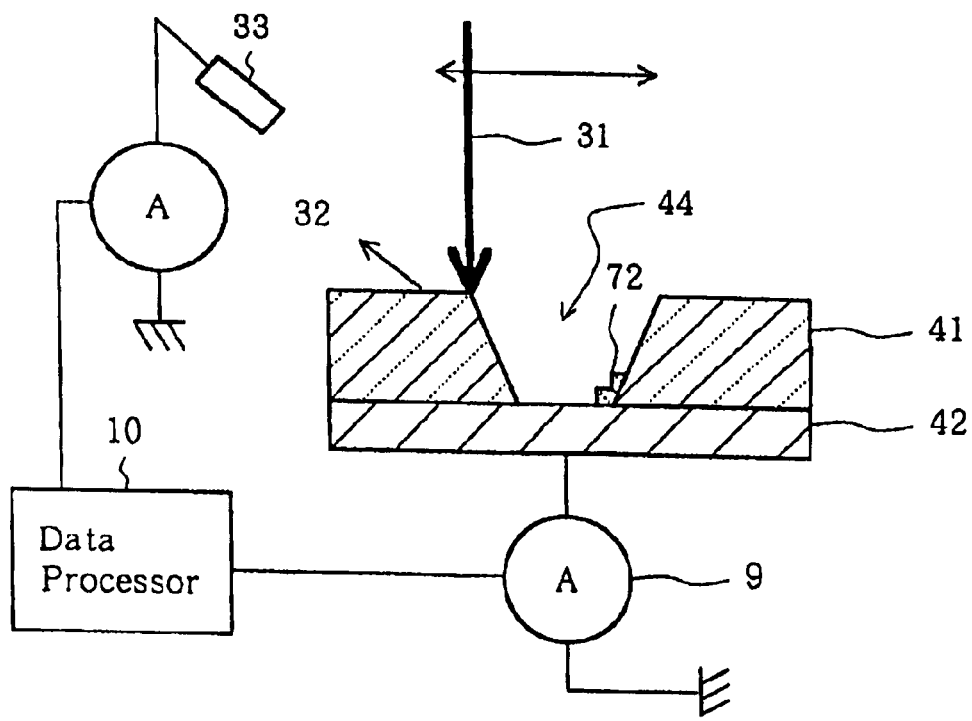
Figure 20B:
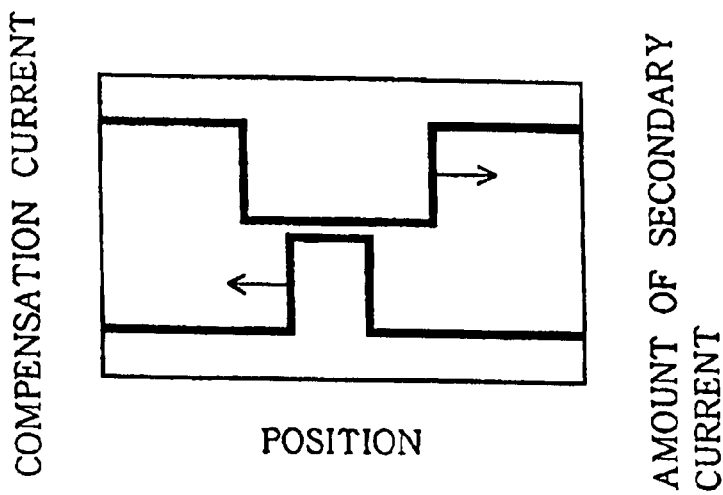
Figure 21A:
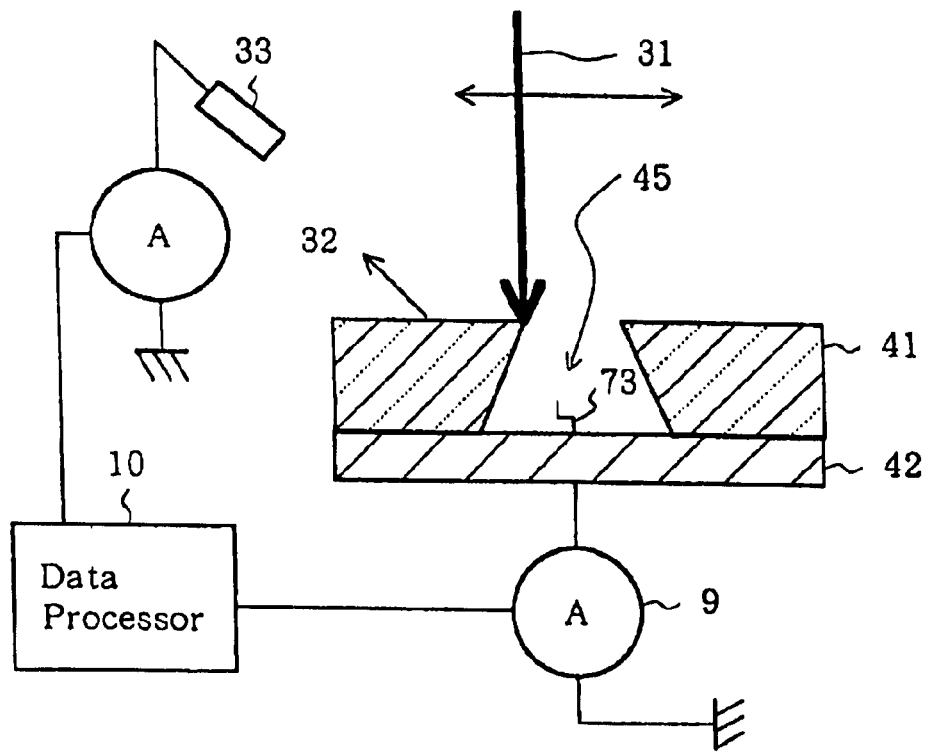
Figure 21B:
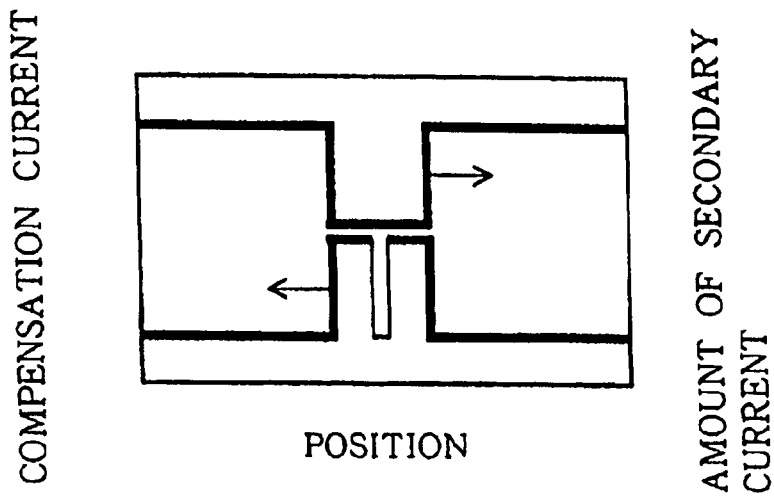

FIGS. 19(a) to 21(b) illustrate a method for detecting and specifying an extraordinary substance in a contact-hole, in which FIGS. 19(a), 20(a) and 21(a) show structures to be tested and measuring systems therefor, respectively, and FIGS. 19(b), 20(b) and 21(b) show amounts of measured secondary electron and compensation currents with respect to the electron beam irradiating position, respectively.

There may be various extraordinary materials such as dregs of resist used in etching the contact-hole, particles or dust produced in other processes left on a bottom of the contact-hole. When such extraordinary substance exists in the contact-hole, the amount of filler such as tungsten, aluminum or polysilicon filling the contact-hole as a plug for electrically connecting elements mutually becomes insufficient, resulting in defective contact. Therefore, it is necessary in the semiconductor process to detect such extraordinary substance prior to the formation of the plug.

Since thickness of dust in question is usually 500 Å or more depending upon material thereof, it prevents incident electron beam from reaching a bottom of the contact-hole. Therefore, if there is an extraordinary substance on the bottom of the contact-hole, compensation current observed becomes smaller than that produced in a normal contact-hole.

In the example shown in FIGS. 19(a) and 19(b), small dust 71 exists outside a contact-hole 43 having a constant cross sectional area. When the sample is scanned with vertical thin electron beam 31 generated by the method shown in FIG. 1 or 2 from a left side position along the contact-hole 43 in FIG. 19(a), compensation current is not observed during a time for which electron beam 31 irradiates an insulating film 41 surrounding the contact-hole 43. When electron beam 31 reaches an edge of the contact-hole 43, the detection of compensation current is started. For a time for which electron beam 31 irradiates a bottom of the contact-hole 43, compensation current is observed. When electron beam 31 irradiates the dust 71, no compensation current is detected. In the example shown in FIG. 19(a), the dust 71 is concentrated on one end of the bottom of the contact-hole 43. However, in a case where the dust exists on a center portion of the bottom of the contact-hole and electron beam 31 passes through a region in which the dust exists, compensation current becomes observed again. FIG. 19(b) shows a result of measurement of compensation current obtained by changing the irradiating position of electron beam 31. The size of dust 71 can be obtained by comparing the result of measurement with a result of measurement performed for a contact-hole having no dust. Thus, existence or absence of dust in a contact-hole or size of dust can be detected by measuring compensation current.

FIGS. 20(a) and 20(b) show an example when dust 72 is deposited on a bottom of a tapered contact-hole 44. When the scanning of the sample with vertical thin electron beam 31 is started from a left side position in FIG. 20(a), compensation current is not observed during a time for which electron beam 31 irradiates an insulating film 41 surrounding the contact-hole 44. When electron beam 31 irradiates the tapered portion, no compensation is detected since the thickness of the insulating film is large. On the other hand, when electron beam 31 reaches an edge of the contact-hole 44, compensation current is detected. Although a constant compensation current is detected for a time for which electron beam 31 irradiates a bottom of the contact-hole 44, no compensation current is observed when electron beam 31 irradiates the dust 72. Existence or absence of dust or size of dust can be obtained by comparing the result of measurement with a result of measurement performed for a contact-hole having no dust.

FIGS. 21(a) and 21(b) show an example when dust 73 exists on a center portion of a bottom of a reverse-tapered contact-hole 45. When the scanning of the sample with electron beam 31 is started, compensation current is not observed during a time for which electron beam 31 irradiates an insulating film 41 surrounding the contact-hole 45. When electron beam 31 reaches the bottom of the contact-hole 45 large compensation current is detected. When electron beam 31 reaches the dust 73, no compensation current is detected. When electron beam 31 passes over the dust 73 and irradiates the bottom of the contact-hole 45, compensation current is detected again. When electron beam 31 reaches an edge of the contact-hole 45, no compensation current is detected. The position of the sample, at which no compensation current is detected, corresponds to a region in which the dust 73 exists and the size of the dust 73 can be estimated from a width of this region.

In the dust detection method mentioned above, the ratio of secondary electron to the irradiating electron beam (primary electron) depends upon a sample material and has a dependency of irradiating electron beam, which is different upon atomic number thereof. Therefore, after the existence or absent of dust in a bottom of a contact-hole is specified, a variation of compensation current is detected by irradiating the sample with electron beam accelerated by various acceleration energies. It is possible to specify an object to be measured by preliminarily determining the acceleration energy dependency of compensation current by performing similar experiment for expected extraordinary substances and obtaining the degree of approximation of the acceleration energy dependency by utilizing a technique such as neutral network.

Measurement with Electron Beam having Large Cross Sectional Area

Figure 22A:
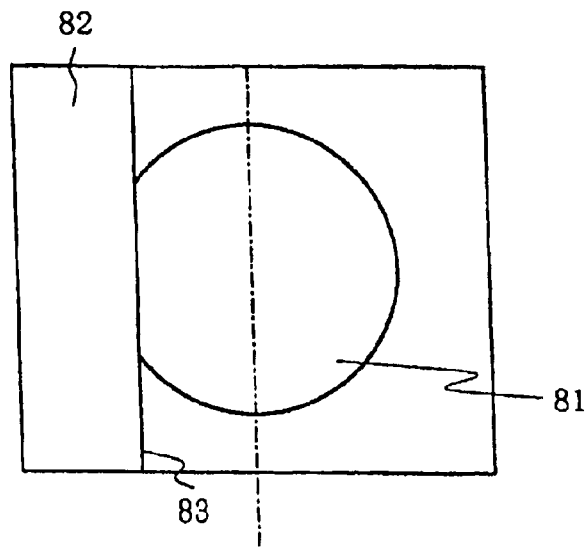
Figure 22B:
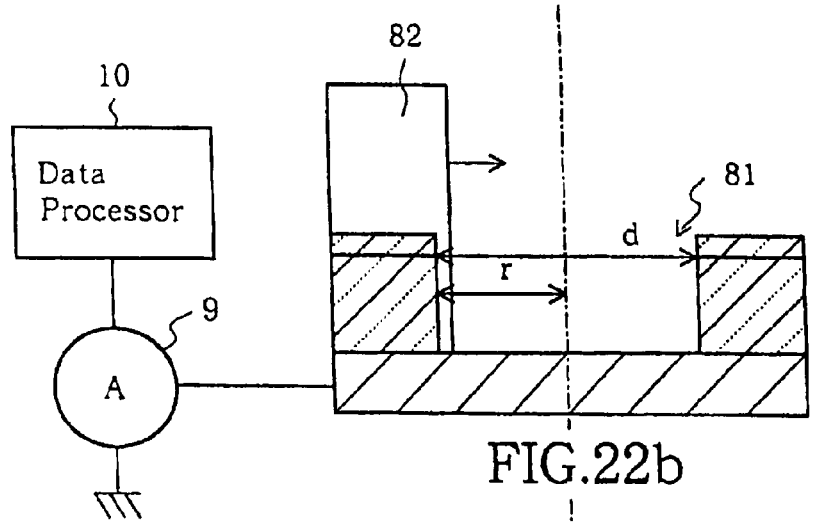
Figure 22C:
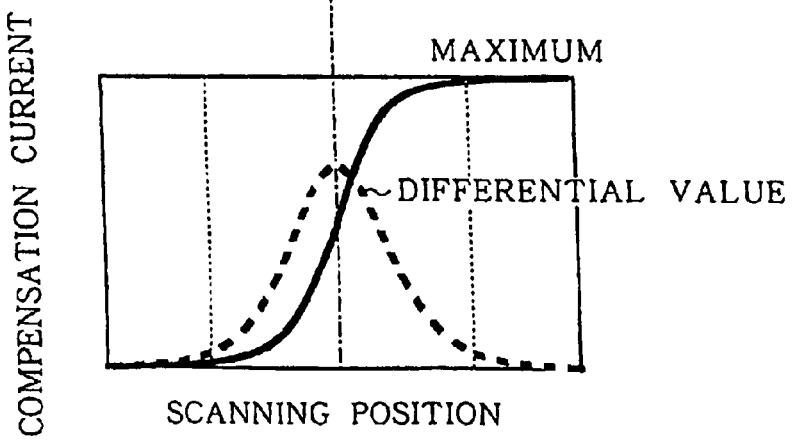

FIGS. 22(a), 22(b) and 22(c) illustrate an example of measurement utilizing electron beam having a large cross sectional area, in which FIG. 22(a) is a plan view showing a relation between a contact-hole 81 and electron beam 82, FIG. 22(b) is a cross section thereof and FIG. 22(c) shows compensation current obtained with respective to compensation current obtained with respect to the scanning position of electron beam and a differentiation thereof.

In this example, electron beam 82 having rectangular cross sectional area larger than an area of a contact-hole and incident on a sample vertically is used. As shown in FIGS. 22(a) and 22(b), the sample is scanned by electron beam 82 from one side of a sample region containing a single contact-hole 81 to the other while maintaining an irradiation axis vertically with respect to the sample and holding a beam axis fixed. Alternatively, it is possible to scan electron beam 82 itself or to move the sample wafer horizontally while fixing the irradiation axis of electron beam 82 at a constant angle with respect to the sample wafer. Although electron beam 82 used in this case is parallel beam, it is possible to scan the parallel beam by shifting the beam horizontally by utilizing a pair of deflectors. Magnitude of compensation current detected in this case is proportional to an area of electron beam irradiating a bottom of the contact-hole 81. Therefore, a value obtained by differentiating the compensation current indicates an amount of compensation current at a position in the vicinity of a beam edge 83 at which rectangular electron beam 82 is about to be scanned.

In this example, the scan is performed by gradually shifting electron beam 82 such that it irradiates the sample wafer from a region surrounding the contact-hole 81 to the bottom of the contact-hole 81 as shown in FIGS. 22(a) and 22(b). There is no compensation current detected when electron beam 82 irradiates the region surrounding the contact-hole 81. When electron beam 82 reaches an edge of the bottom of the contact-hole 81, compensation current is increased sharply. The amount of compensation current is increased gradually during a time when electron beam 82 passes the bottom of the contact-hole 81 and becomes maximum when electron beam 82 covers the whole contact-hole 81. When electron beam 82 passes through the bottom and the other side beam edge reaches the contact-hole 81, compensation current starts to reduce and, when electron beam 82 leaves the region of the contact-hole 81, compensation current disappears.

A distance between a rising position of the measured compensation current and a peak of a mountain indicating the maximum value of compensation current corresponds to a distance between one end of the bottom of the contact-hole 81 and the other end thereof. The distance measured by this method corresponds to a distance obtained when a circle is pinched by two parallel lines. Therefore, it is possible to measure a precise diameter of the circle even when electron beam 82 is not aligned in position precisely with the contact-hole 81.

Further, assuming that the contact-hole 81 is circular, an increasing rate of area of a circle becomes maximum in a position of a center line of the circle. Therefore the position in which the increasing rate of compensation current becomes maximum corresponds to the position of the center line of the circle. Consequently, it is possible to obtain the diameter of the bottom of the contact-hole 81 by performing a measurement up to the position in which the increasing rate of compensation current becomes maximum, without necessity of scanning the whole contact-hole 81. That is, it is possible to measure the bottom diameter of the contact-hole for a time which is substantially a half of the time required to scan the whole contact-hole. Further, since the peak point of the differentiated value is clearly known, the distance is obtained precisely.

The use of thick electron beam is advantageous in that the construction of the electron beam system of the tester is simpler than that in a case where thin electron beam is used.

Measurement Using Thin and Thick Electron Beams

Figure 23:
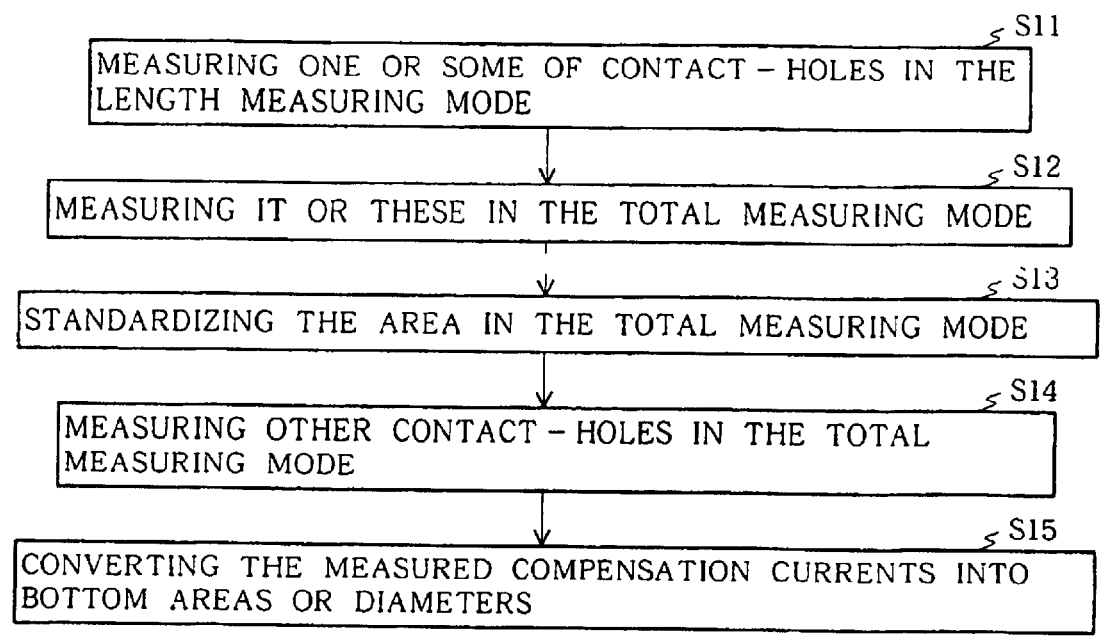
FIG. 23 is a flowchart of a measuring method using a combination of a length measuring mode and a total measuring mode.
Figure 24:
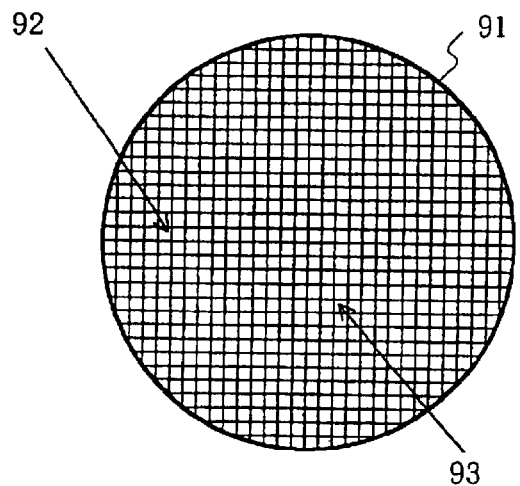
FIG. 24 shows an example of a positional relation between a region on a wafer to which the length measuring mode is applied and a region on the same wafer to which the total measuring mode is applied.

FIGS. 23 and 24 illustrate a measuring method employing a combination of a length measuring mode for precisely measuring a length by using thin electron beam and a total measuring mode for obtaining the bottom diameter within a short time by using thick electron beam, in which FIG. 23 is a flowchart thereof and FIG. 24 shows an example of a positional relation between a region 92 on a wafer 91 to be measured by the length measuring mode and a region 93 to be measured by the total measuring mode.

In the fabrication of semiconductor device, it is necessary to measure the bottom diameter of contact-hole precisely at high speed. Generally, in the length measuring mode in which one contact-hole is scanned with a precise thin electron beam and the bottom diameter of the contact-hole is measured from a distance between positions at which the amount of compensation current is changed, the relative change of compensation current is used. Therefore, influence of sophisticated variation of the underlying thing is small and the preciseness of measurement of the diameter of contact-hole is high. However, since various information is acquired by performing the fine electron beam scanning for each contact-hole, a considerably long time and a considerable amount of data processing are required to perform a test of a number of contact-holes.

In order to solve this problem, the length measuring mode for precisely measuring a length by using thin electron beam and the total measuring mode for obtaining the bottom diameter within a short time by using thick electron beam are combined. With such combination, it is possible to keep the preciseness of test high and increase the test speed.

Describing the combination of the length measuring mode and the total measuring mode in detail with reference to FIGS. 23 and 24, the precise measurement of bottom diameter is performed for one of contact-holes under test or a relatively small number of contact-holes (within a region 92 in which the length measuring mode is to be applied) thereof in the length measuring mode (S11). Then, the total measuring mode is applied to the same contact-hole to obtain a relation between compensation current flowing through the contact-hole and the bottom diameter thereof (S12) to thereby standardize the area in the total measuring mode (S13). The relation between the diameter of the contact-hole and compensation current in the object to be measured is determined by this measurement. Thereafter, the total measuring mode is applied to other contact-holes (in a region 93 in which the total measuring mode is to be applied) sequentially to measure compensation currents for the respective contact-holes (S14) and the measured compensation currents are converted into bottom areas or diameters of the contact-holes on the basis of the previously obtained relation between the compensation current and the bottom diameter of the contact-hole S15). Thus, it is possible to measure the bottom diameter of contact-hole precisely at high speed.

Comparative Test of Two Regions

Figure 25:
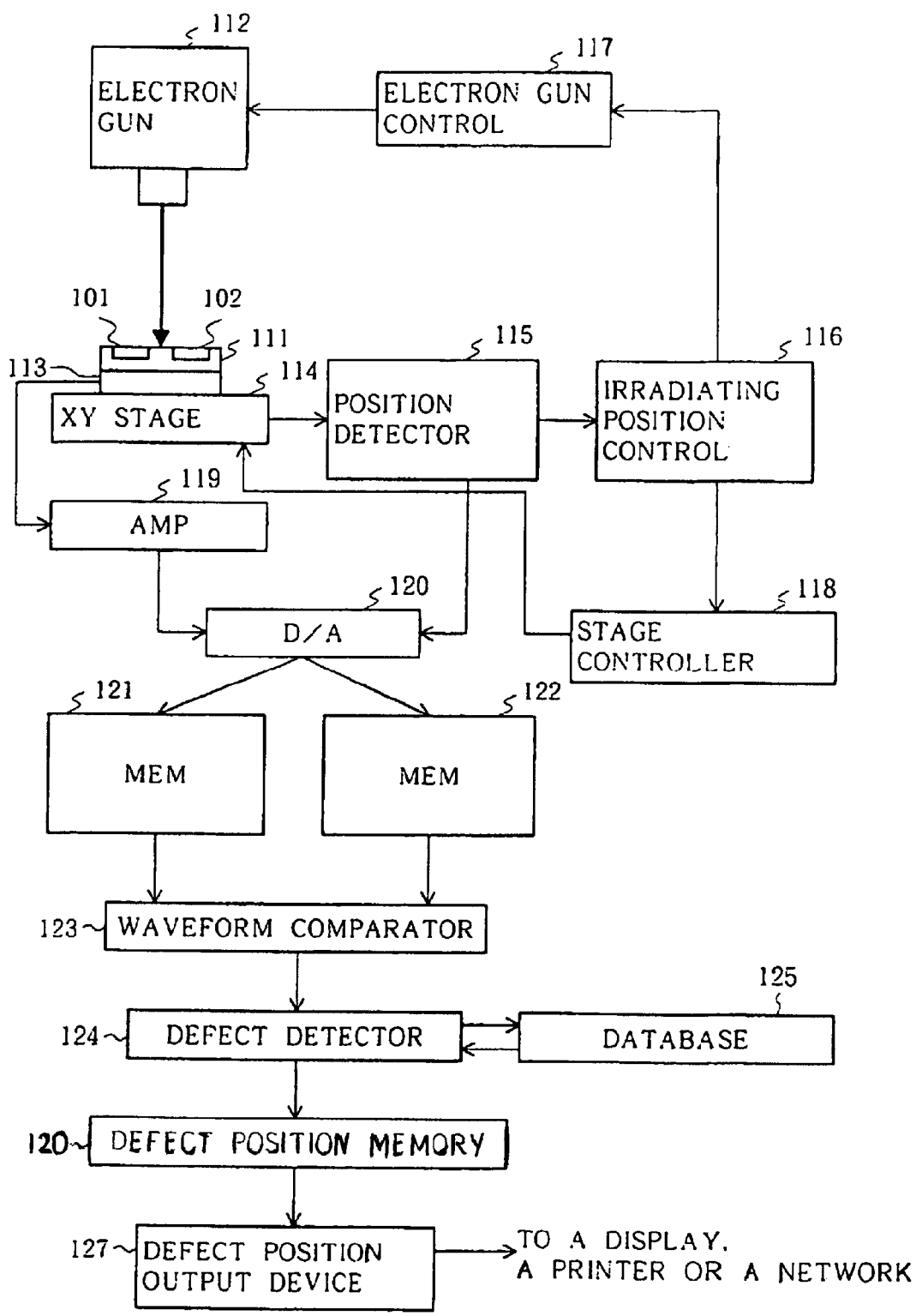
FIG. 25 shows a construction of an apparatus for performing a comparative test by utilizing two test samples.
Figure 26:
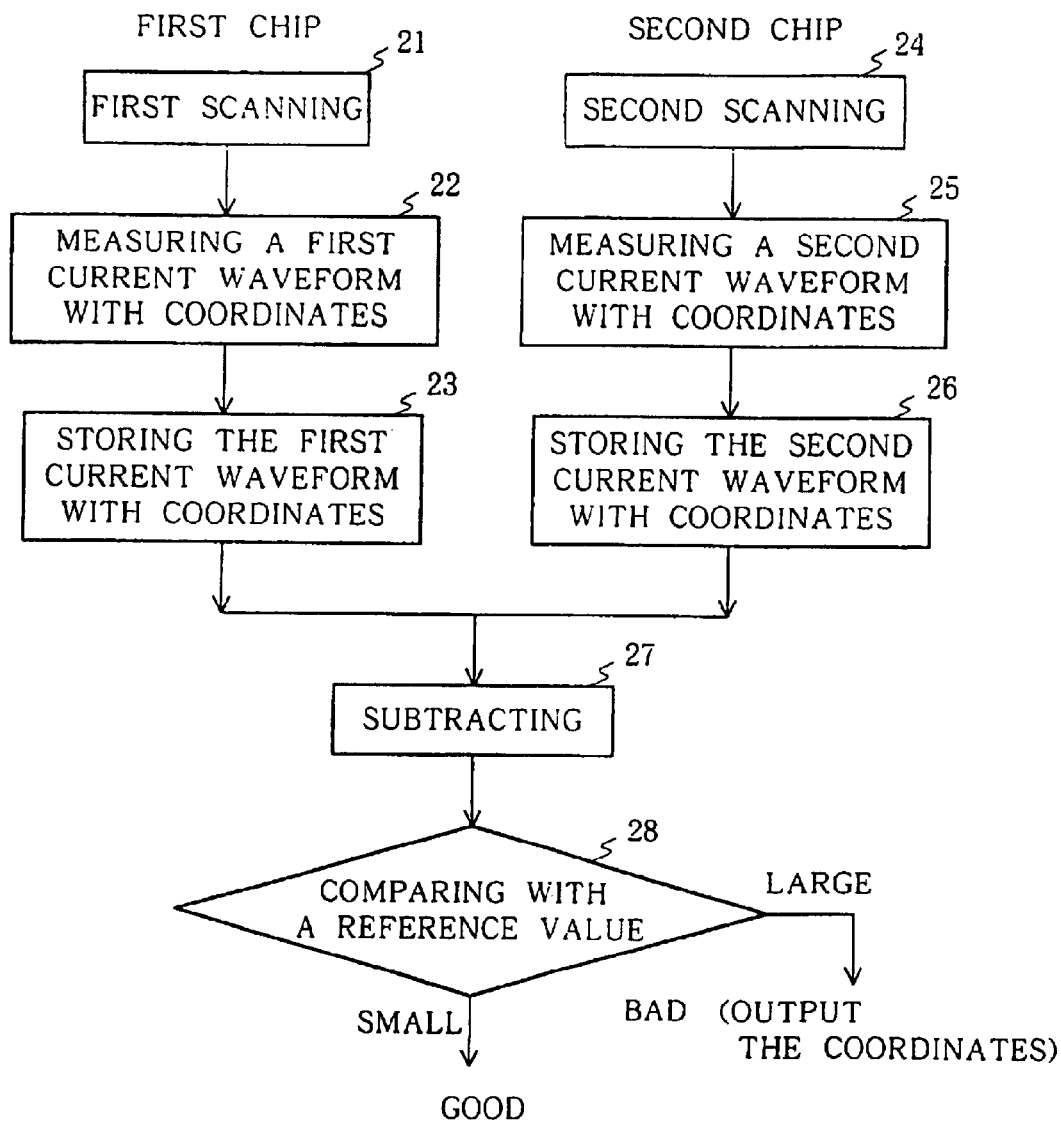
FIG. 26 is a flowchart for the comparative test.
Figure 27:
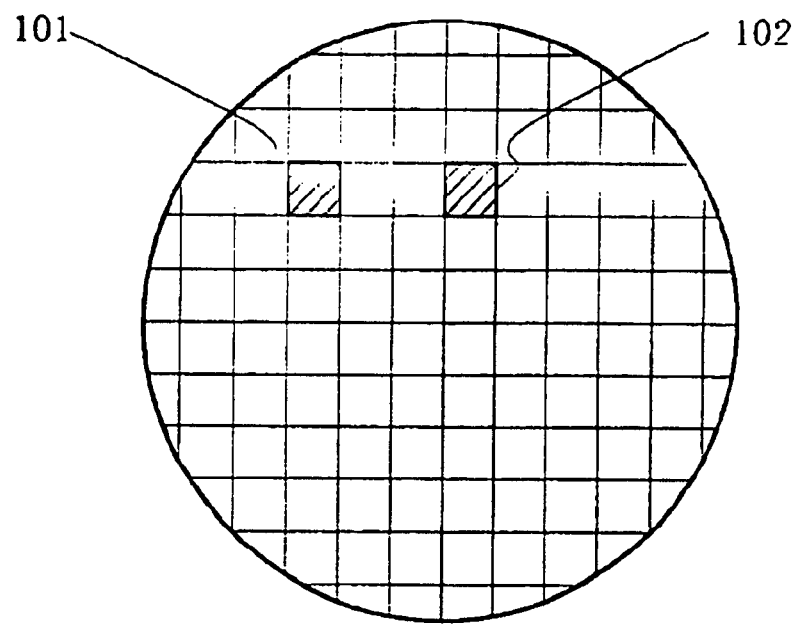
FIG. 27 is a figure for explaining a principle of the comparative test.
Figure 28:
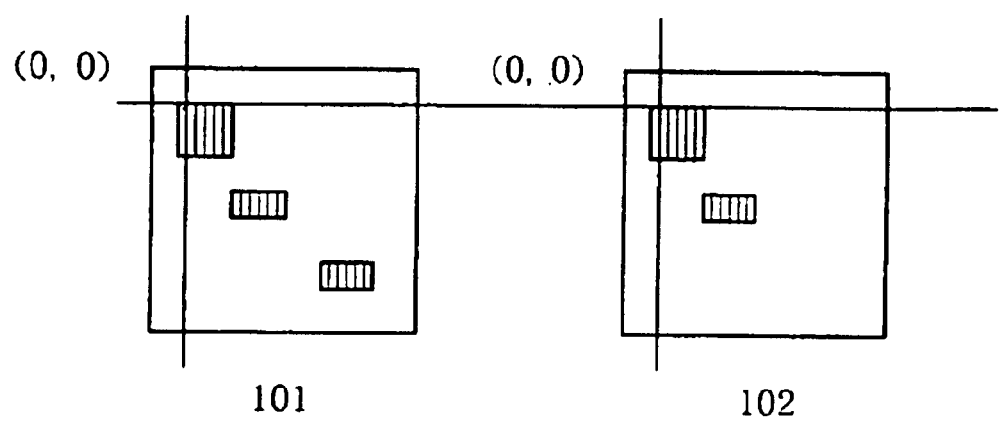
FIG. 28 shows a portion of FIG. 27 in an enlarged scale.

FIG. 25 shows a construction of an apparatus for performing a comparative test by utilizing two samples under test, FIG. 26 is a test flowchart hereof, FIG. 27 is a figure for explaining the principle of the comparative test and FIG. 28 shows a portion of FIG. 27 in enlarged scale.

A circuit pattern of a semiconductor LSI is fabricated by utilizing an exposing device called "stepper". Therefore, the interval between adjacent chips or the layout within the chip are made precisely identical through the circuit pattern. Describing this with reference to FIGS. 27 and 28, the layout within a chip represented by a relative coordinates having one of corners of a first sample 101 on a wafer as an original point (0, 0) is to be precisely coincident with the layout within a chip represented by a relative coordinates having one of corners of a second sample 102 on the same wafer as an original point (0, 0). These layouts are compared and, when there is a difference therebetween, which exceeds a certain constant reference, the region is considered as containing some abnormality. It is possible to specify a position of a defective wiring by using such test regardless of arrangement of a wiring, without necessity of knowing a layout information of the sample from a CAD data. Incidentally, the first sample 101 and the second sample 102 are formed on one and the same substrate and cut away finally as chips.

In FIG. 25, the apparatus for performing the comparative test includes an electron gun 112 for producing electron beam vertically irradiating test samples on a wafer 111, a compensation current measuring electrode 113 on which the wafer 111 is mounted with a bottom surface thereof in contact with an upper surface of the electrode, an XY stage 114 mounting the electrode 113, for determining a positional relation between the wafer 111 on the electrode and electron beam irradiating the wafer, a position detector 115 for precisely measuring the position of the sample irradiated with electron beam, an irradiating position control device 116 for producing a control signal for controlling the irradiating position of electron beam on the basis of a result of detection from the position detector 115 an electron gun control device 117 for controlling the electron gun 112 on the basis of the control signal from the irradiating position control device 116, a stage controller 118 for controlling the XY stage 114 on the basis of the control signal from the irradiating position control device 116, a current amplifier 119 for amplifying compensation current of the electrode 113, a D/A converter 120 for converting an output of the current amplifier 119 into a digital signal, a first and second memories 121 and 122 for storing the digital signal as current waveforms correspondingly to positional coordinates, a waveform comparator 123 for comparing the stored waveforms, a defect detector 124 for determining the quality of wiring on the basis of a result of the comparison, a database 125 storing an information for determining the quality, a defect position memory 126 for storing positions which are determined as defective and a defect position output device 127 for displaying and/or printing the defect position or outputting the defect position to other processors on a network. The irradiating position detector 125 may be, for example, an optical precision distance measurement device.

Although the memories 121 and 122 for storing waveforms corresponding to the respective chips are shown in FIG. 25 as discrete memories, they may be embodied as a common memory. Further, although the defect position memory 126 is shown in FIG. 25 as an independent memory, it may be possible to provide it by using another memory region of the common memory functioning as the memories 121 and 122.

On demand, the defect position memory 126 can classify defects and store the position information thereof according to the classification.

The electron gun 112 is fixed in a specific position and electron beam scanning is performed by moving the XY stage 114 with respect to the position of the electron gun 112 (S21 in FIG. 26). By measuring the position of the XY stage 114 by means of the electron beam irradiating position detector 115, a position to be irradiated with electron beam can be measured with preciseness of 100 Å. During a time for which electron beam scans the first test sample 101 on the wafer 111 along a linear line, current produced in the sample is measured as a first current waveform by the current amplifier 119 and the D/A converter 120 (S22) and the first current waveform is stored in the first memory 121 together with the coordinates of the first electron beam irradiating position calculated from the position of the XY stage 114 (S23). The same measurement is performed for the second test sample 102, which is in a position of an identical pattern to the pattern of the first test sample of another chip, to acquire a second current waveform and the second current waveform is stored in the second memory 122 together with the coordinates of a second electron beam irradiating position (S24 to S26). The quality of the pattern is determined by the quality determination device 124 on the basis of a difference between the current waveforms stored in the first memory 121 and the second memory 122, respectively, and a result is stored in the defect position memory 125 (S27, S28). On demand, the result is outputted from the defect position output device 127 to a display or a printer or to other devices on the network such that the data can be used for other analysis.

In the case of the measurement using compensation current, electron beam irradiating other portion than the wiring does not cause effective current unlike the case of the measurement using secondary electron. Therefore, noise contained in the detection signal is small compared with the case of secondary electron.

Timing of the comparison between normal chip and defective chip depends upon memory capacities of the waveform memories 121 and 122. In a case where the comparison is performed every line, it is enough that the waveform memory 121 as well as the waveform memory 122 has a memory capacity capable of storing a waveform of one line. In a case where, after a normal chip is measured completely, a defect chip is measured, the memory capacity of the waveform memory 121 as web as the waveform memory 122 has to have a memory capacity capable of store a whole information corresponding to one chip. Since it takes a long time to move the electron beam irradiating position between chips remote from each other by a certain physical distance, it is preferable in order to improve the test speed to measure one chip after the measurement of a preceding chip is completed, so that it is preferable to use the waveform memories having memory capacities as large as possible.

Figure 29A:
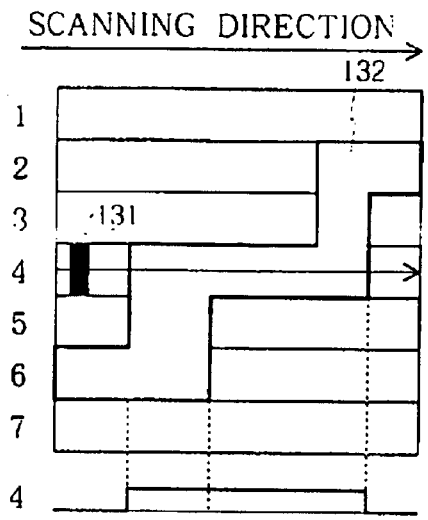
Figure 29B:
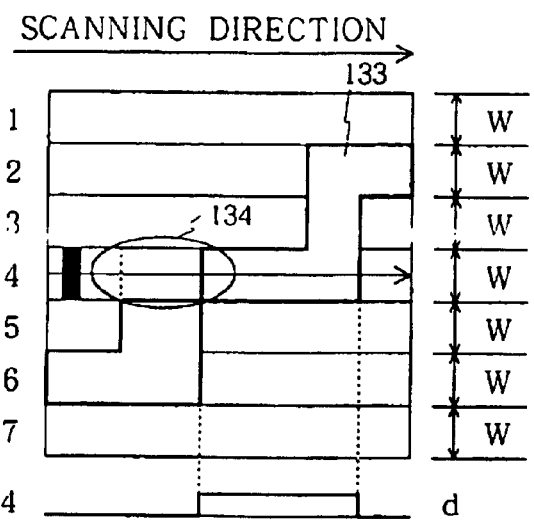

FIGS. 29(a) and 29(b) show a test example, in which FIG. 29(a) shows an example of measurement of a normal chip and FIG. 29(b) shows an example of measurement of a defective chip. In FIGS. 29(a) and 29(b), left side numerals indicate the line number of electron beam having a width and each right side letter W indicates the width of electron beam scanning one time. Further, in the lowest line in FIGS. 29(a) and 29(b), compensation currents observed in the fourth electron beam scan related to a defective pattern are shown. In this example, it is assumed that the size of the wiring under test is constant (for example, 0.15 microns) as in the usual semiconductor device. In general, an interval between wiring lines of the semiconductor device is larger than the diameter of the wiring line due to limitation caused by the exposing technique and the etching technique. In this example, the wiring lines are arranged randomly and have not a constant periodicity.

The chips used in FIGS. 29(a) and 29(b) have the nature described with reference to FIGS. 27 and 28 and are arbitrarily selected from a plurality of chips simultaneously formed on a semiconductor wafer. The chips to be compared with each other depend upon a case. However, it is general that the chips are adjacent ones or that the test is performed by selecting a specific chip, which may be a normal chip, as the first sample, with sequentially changing other chips as the second sample. It may be possible to compare test results of three chips or more and determine a chip or chips, whose test results indicate many coincidences with those of the specific chip, as normal chips.

The quality determination of wiring using electron beam utilizes the change of magnitude and/or polarity of current produced when irradiated with electron beam. For simplicity of description, it is assumed here that, since there is a pattern defect in a defective wiring, current observed for the defective wiring is substantially smaller than that observed for the normal wiring.

The test method will be described in detail. First, the position coordinates of a chip, which becomes a sample under test, is made coincident with a coordinates of a position to be irradiated with electron beam. Since the size of a wiring of the most recent device as the test sample is 0.2 microns or less, the alignment is performed with positional preciseness of 1000 521 or higher with which the position coordinates can be reproduced. This is performed by utilizing an alignment mark formed on the wafer.

There are several methods for utilizing the alignment mark. In one of them, an alignment mark for a mask alignment, which is usually utilized in a semiconductor fabrication process. The alignment mark is formed on a surface of a substrate as an oxide film or a metal film and is transformed to a secondary electron image by using a scanning microscope provided in the tester. Since a position looked in the image is just the position irradiated with electron beam, the position coordinates of the electron beam scanning system is made coincident with it such that the position of the alignment mark becomes an original point.

In another method, which does not use the scanning microscope, current flowing through the alignment mark is measured. In such method, a conductor similar to a wiring of a sample under test is formed separately as an alignment mark. The size of the conductor may be similar to the size of the wiring or in order to improve the measuring preciseness, smaller than that of the wiring. Similarly, to the principle of the wiring measurement, current observed during a time for which electron beam irradiates other portion than the wiring is small and is increased when the wiring is irradiated with electron beam. When the electron beam irradiating position is coincident with the mark, current observed becomes maximum. This position is utilized as a position coincident with the alignment.

After the alignment is completed, line shaped, vertical electron beam 131 having a length corresponding to the width of the wiring scans the region of the first test sample, in which the wiring 132 is formed, from left to right along a line "1". When the electron beam 131 reaches an end of the test region, the irradiation position of the electron beam 131 is shifted by a distance corresponding to the width W in a direction perpendicular to the scanning direction and the test sample is scanned with it along a line "2". The scanning direction may be S-shape or meander-shape. Alternatively, the electron beam may be returned to the initial position and then scan the sample from left to right. The shift amount W of the electron beam in vertical direction is set to a value substantially equal to the width of the wiring. Similar scanning is performed along lines "3", "4", "5", "6" and "7" to scan the whole test sample.

As shown in FIGS. 29(a) and 29(b), when electron beam reaches a position corresponding to a wiring 132, which is a normal, current is observed in the scan along the line "4". However, there is no current observed for a wiring 133, which is defective. That is, an existence of defective wiring can be known since the current waveform obtained for the sample having defective wiring becomes different from that obtained for the sample having normal wiring in a region indicated by a reference numeral 134.

In the above mentioned test method, it is possible to specify a position of defective wiring even when the position of wiring in the test sample is unknown.

Comparative Test Using Thin Electron Beam

Figure 30A:
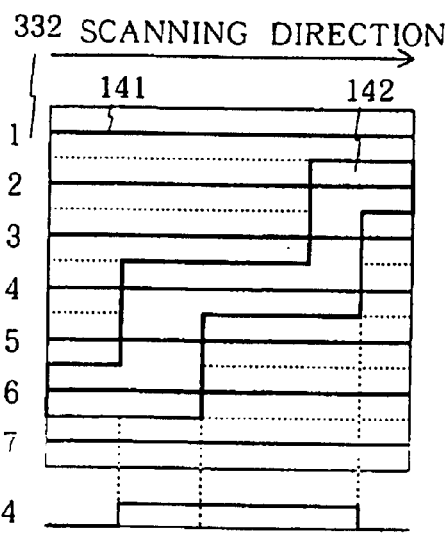
Figure 30B:
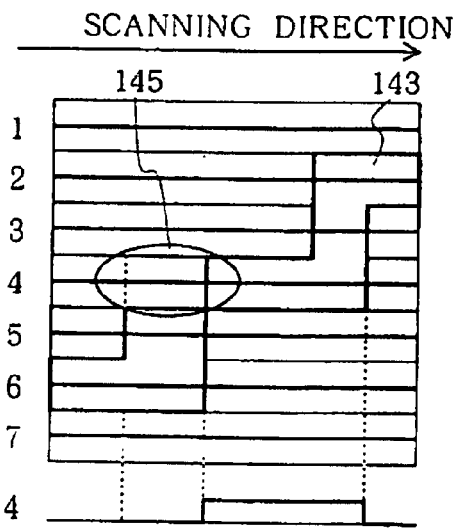

FIGS. 30(a) and 30(b) show another test example, in which FIG. 30(a) shows an example of measurement of a normal chip and FIG. 30(b) shows an example of measurement of a defective chip. In FIGS. 30(a) and 30(b), left side numerals indicate the line number of electron beam and compensation currents observed in the fourth electron beam scan related to a defective pattern are shown in lower portions of the respective figures.

When compensation current flowing through a wiring is to be measured, compensation current per unit area is the same regardless of portion of the wiring, which is irradiated with electron beam, if a material of the wiring is uniform. Therefore, in order to test the quality of the wiring, it is not always necessary to irradiate the whole wiring with electron beam simultaneously. Further, since the pattern defect occurs in a peripheral portion of the wiring, the defect detection sensitivity becomes high when the position to be irradiated with electron beam is set in the peripheral portion. On the other hand, if the position to be irradiated with electron beam is set to a center of the wiring, the sensitivity becomes low. In the example shown in FIGS. 30(a) and 30(b), the wiring is scanned with parallel electron beam 141 having spot size sufficiently smaller than a width of the wiring with a scan interval L, which is substantially the same as the width of the wiring.

Similarly to the test shown in FIGS. 29(a) and 29(b), this test can be performed according to the test flowchart shown in FIG. 26 by using the device shown in FIG. 25. The electron gun 112 capable of generating parallel electron beam having spot size substantially smaller than the width of the wiring.

In this test, an alignment is performed similarly to that in the test described with reference to FIGS. 29(a) and 29(b), vertical electron beam 141 having a spot size substantially smaller than the width of the wiring scans the region of the first test sample, in which the wiring 142 is formed, along a line "1". Since, as described above, the electron beam irradiating position influences the sensitivity of defect detection, the position to be irradiated with electron beam is set in the peripheral portion when high sensitivity is required or in a center portion of the wiring if the sensitivity can be low. When the electron beam 141 reaches an end of the test region, the irradiation position of the electron beam 141 is shifted by a distance corresponding to the scan interval L in a direction perpendicular to the scanning direction and the test sample is scanned with it along a line "2". The scanning direction may be S-shape or the electron beam may be returned to the initial position and then scan the sample in the same direction. The scan interval L is set to a value substantially equal to the width of the wiring. Similar scanning is performed along lines "3", "4", "5", "6" and "7" to scan the whole test sample. The above mentioned measurement is performed for a second test sample which is an identical pattern forming location of another chip and respective current waveforms are stored correspondingly to coordinates of the electron beam irradiating positions, respectively.

As shown in FIGS. 30(a) and 30(b), when electron beam reaches a position corresponding to a wiring 142, which is a normal, current is observed in the scan along the line "4". However, there is no current observed for a wiring 143, which is defective. By detecting such difference of compensation current, it is possible to detect the pattern defect 143 of the wiring.

Comparative Test Using Line-Shaped Electron Beam

Figure 31A:
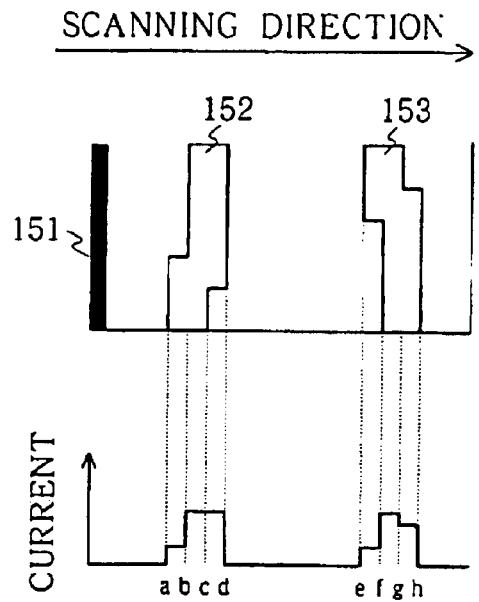
Figure 31B:
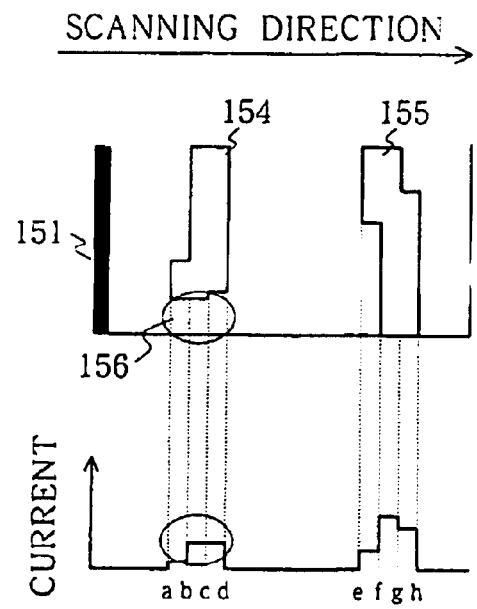

FIGS. 31(a) and 31(b) illustrate an example in which a plurality of randomly arranged wiring lines are simultaneously irradiated with electron beam having a line shaped cross section, in which FIG. 31(a) shows an example of measurement for a normal chip and FIG. 31(b) shows an example of measurement for a defective chip. Electron beam used has a rectangular cross section having length of one side in a scan direction is as small as, for example, 100 Å and length of a side perpendicular to the scan direction is several microns so that it covers a plurality of wiring lines. An amount of irradiating current of electron beam 165 is in a range from several pA to several nA and acceleration voltage thereof is in a range from several hundreds kV to several thousands kV.

In the normal sample shown in FIG. 31(a), when electron beam 151 reaches a wiring 153 at a position a, current starts to flow. Further, when the electron beam reaches a position b, the current is increased since a region of the wiring 152 irradiated thereby is increased. When the electron beam reaches a position c, current is decreased since a region irradiated thereby is decreased. When the electron beam 151 reaches a position d, the electron beam 151 can not irradiate the sample, causing no current to flow. On the other hand, in the defective sample shown in FIG. 31(b), current obtained in the wiring 154 is small. The current waveform obtained at a position of the defective sample is different from that obtained at an identical position of the normal sample, due to a pattern defect 156 of the defective sample. On the other hand, current waveforms of the normal and defective samples obtained at positions e, f, g and h at which normal wiring lines 153 and 155 are formed are the same.

As such, when a plurality of wiring lines are irradiated with electron beam, current produced in each wiring line is measured independently and current waveform related to a normal wiring line becomes substantially different from that relate to a defective wiring line. Therefore, it is possible to detect a defective wiring line by comparing the current waveform thereof with that of the normal wiring line.

This test can be done according to the test flowchart shown in FIG. 26 by using the device shown in FIG. 25 in the case shown in FIGS. 29(a) and 29(b) and FIGS. 30(a) and 30(b). In this test, however, the electron gun 112 generates the line-shaped electron beam.

Figure 32A:
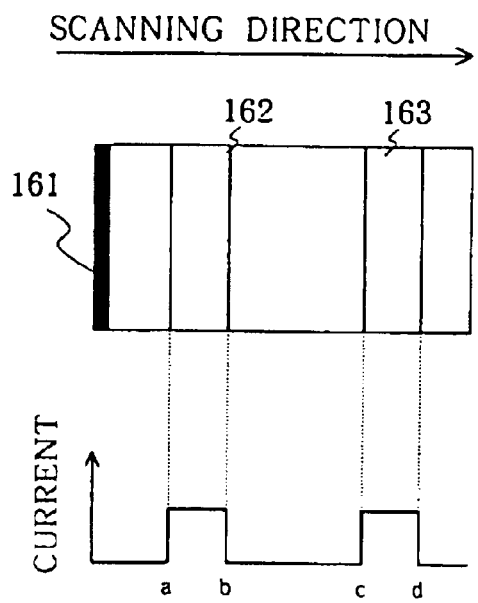
Figure 32B:
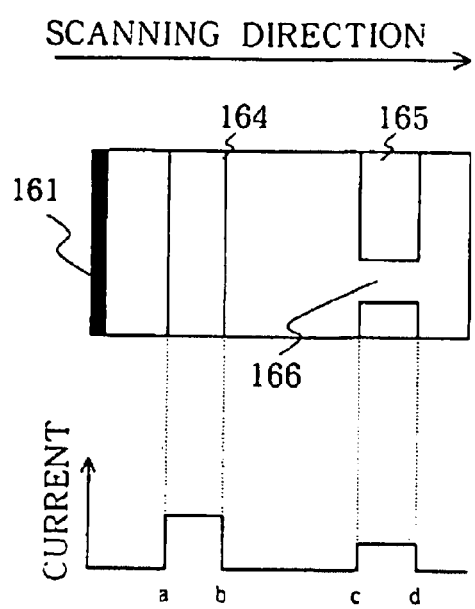

FIGS. 32(a) and 32(b) illustrate an example of test for a sample including vertical wiring lines having identical shapes, in which FIG. 32(a) shows an example of measurement for a normal chip and FIG. 32(b) shows an example of measurement for a defective chip. Electron beam used has a rectangular cross section having length of one side in a scan direction is as small as, for example, 100 Å and length of a side perpendicular to the scan direction is several microns so that it covers a plurality of wiring lines.

Current obtainable by the current measuring method, which is the principle of measurement of the present invention, is measured as a total value of currents produced in the wiring lines irradiated simultaneously with electron beam. That is, currents produced in the respective wiring lines when irradiated with thin electron beams are measured by the line shape electron beam totally.

In the example shown in FIGS. 32(a) and 32(b), currents produced in the wiring lines 162 and 164 when the electron beam 161 passes through a position a to a position b have similar waveforms regardless of the quality of the samples. On the other hand, when the electron beam 161 passes from a position c to a position d, a current produced in the wiring line 163 of the normal sample is observed while current produced in the wiring 165 of the defective sample is small. Therefore, there is a large difference in current waveform between the normal sample and the defective sample, from which an existence of a pattern defect 166 can be detected. That is, it is possible to detect a defect and specify a position of the defect by using the device shown in FIG. 25 and the procedures shown in FIG. 26 even if positions of wiring lines are overlapped with respect to the electron beam scanning.

FIGS. 33(a) and 33(b) illustrate an example of test in a case where a wiring having an axis-symmetrical width variation exists, in which FIG. 33(a) shows an example of measurement for a normal sample and FIG. 33(b) shows an example of measurement for a defective sample. In this test, currents produced in the respective wiring line portions when irradiated with thin electron beams are measured totally by using a line-shaped electron beam similar to that used in the test shown in FIGS. 32(a) and 32(b).

For a normal sample shown in FIG. 33(a), current is obtained in a wiring 172 when electron beam 171 reaches a position a. On the contrary, no current is observed for a defective sample 173 having a pattern defect 174 even when electron beam 171 reaches a position a as shown in FIG. 33(b). Current produced at a position b in the defective sample 173 is small compared with current produced at the position b in the normal sample, due to the pattern defect 174. As described, in the case of the wiring having an axis-symmetrical width variation, there is a difference in current waveform between the normal chip and the defective chip when the both chips are measured simultaneously, so that it is possible to detect the defect.

FIGS. 34(a) and 34(b) illustrate an example of test in a case where wiring lines having different widths are arranged randomly, in which FIG. 34(a) shows an example of measurement for a normal sample and FIG. 34(b) shows an example of measurement for a defective sample. When these samples are scanned with line-shaped electron beam 181, amounts of currents measured at positions b of the wiring 182 of the normal chip and a wiring 183 of the defective chip, which has a pattern defect 184, are different. By detecting the different, it is possible to detect the defect.

Current Waveform Comparison by Integration

The case where the current waveforms obtained by irradiating the samples with electron beam are compared directly has been described. However, there are other methods for comparing two current waveforms.

Figure 35:
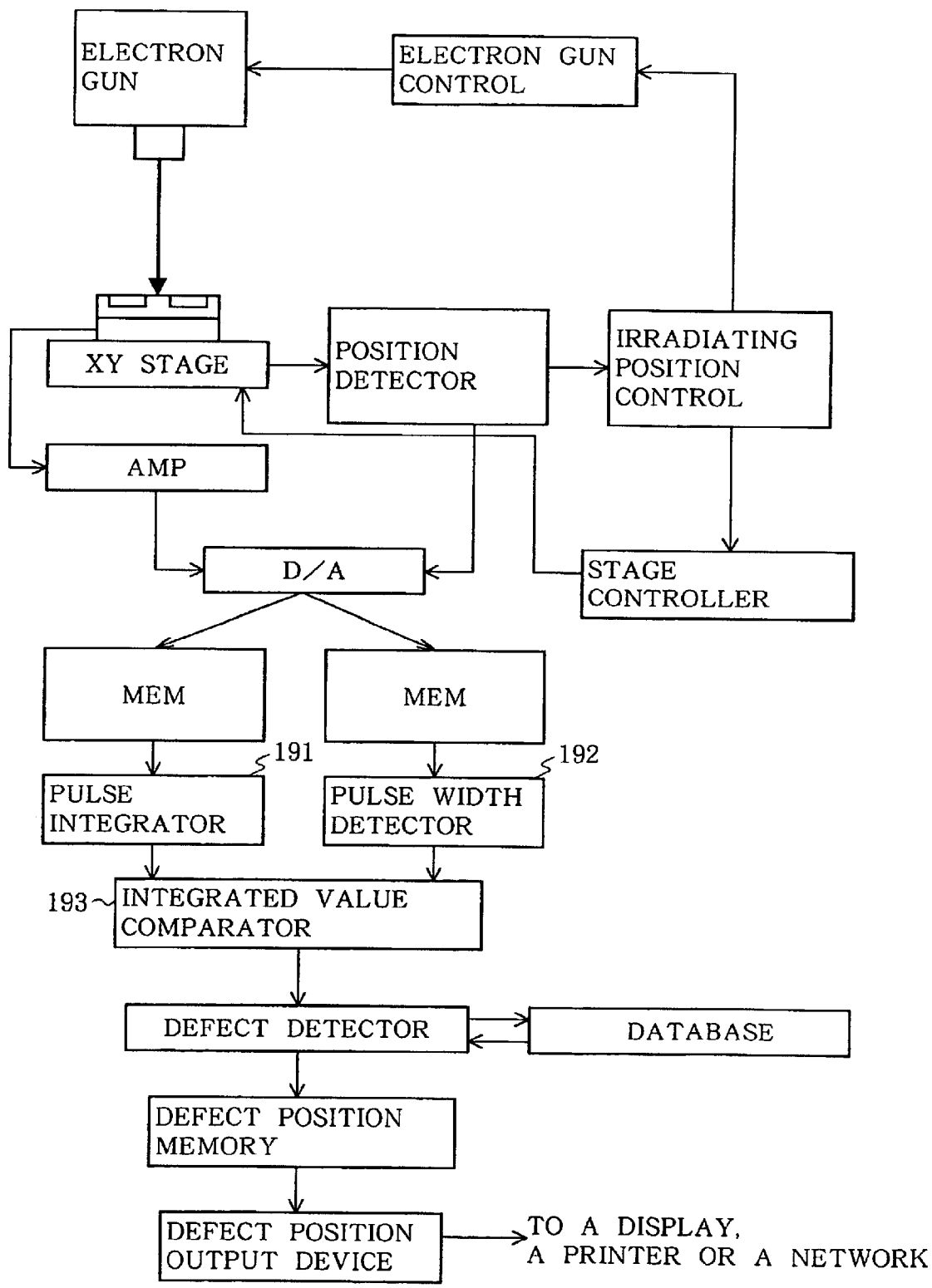
FIG. 35 shows a construction of an apparatus for performing a comparative test by comparing integrated values of current waveforms.
Figure 36:
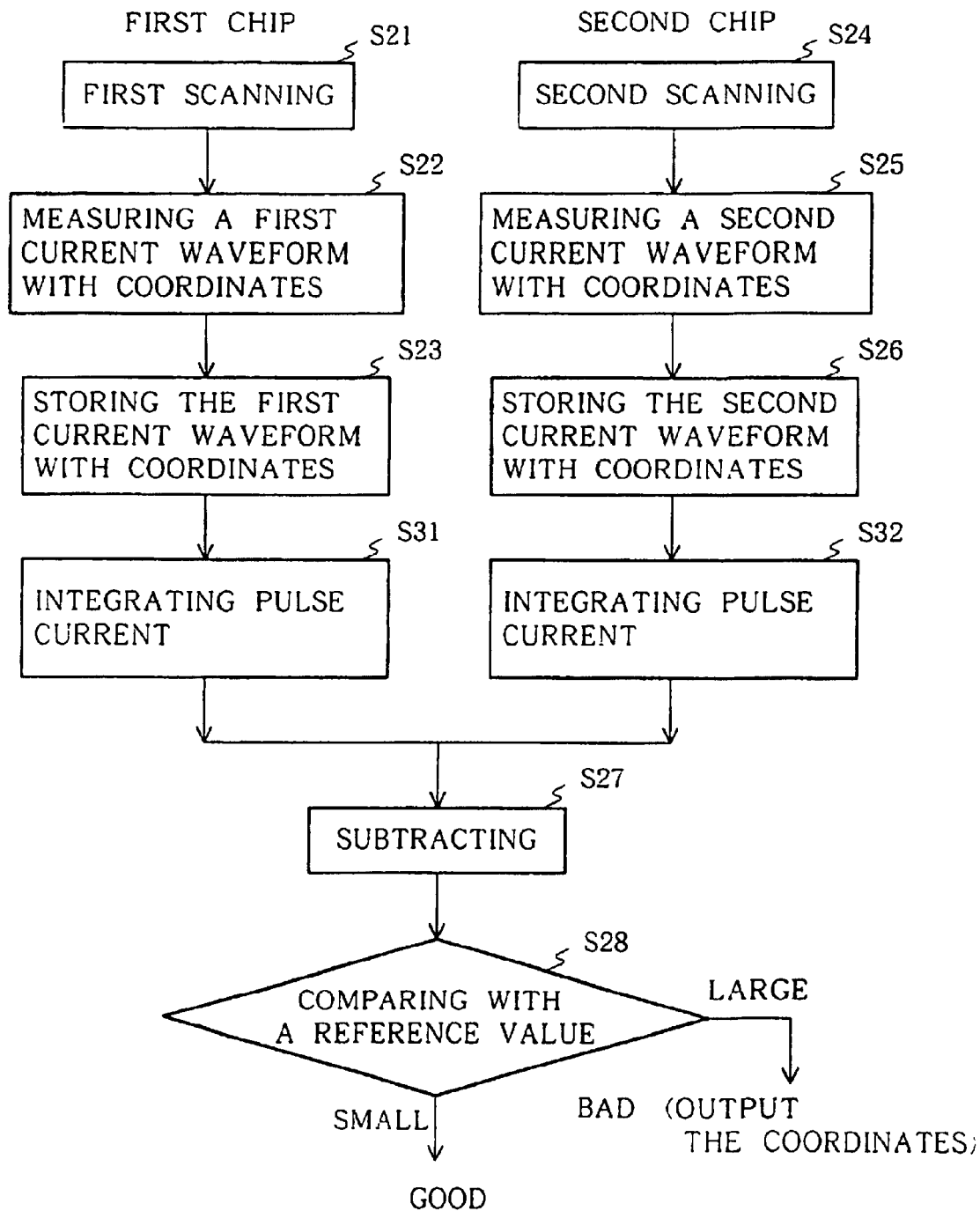
FIG. 36 shows a flowchart of the apparatus shown in FIG. 35.

FIG. 35 shows an example of a construction of a test device for comparing current waveforms by integrating them and FIG. 36 shows a flowchart used therein. The test device shown in FIG. 35 is similar to that shown in FIG. 25. Instead of the waveform comparator 123 of the test device shown in FIG. 25, the test device shown in FIG. 35 includes pulse integrators 191 and 192 and an integrated value comparator 193. The pulse integrators 191 and 192 integrate currents produced by one pulse of waveforms acquired by the wiring test, respectively, (S31, S32) and resultant integrated values are compared by the integrated value comparator 193 (S27).

Comparison of Current Value Per Unit Area

Since positional coordinates of CAD, etc., is not utilized in the comparison test, electron beam utilized in the test does not always irradiate the wiring completely. Therefore, current value per unit area of the wiring may be used as a reference.

Figure 37:
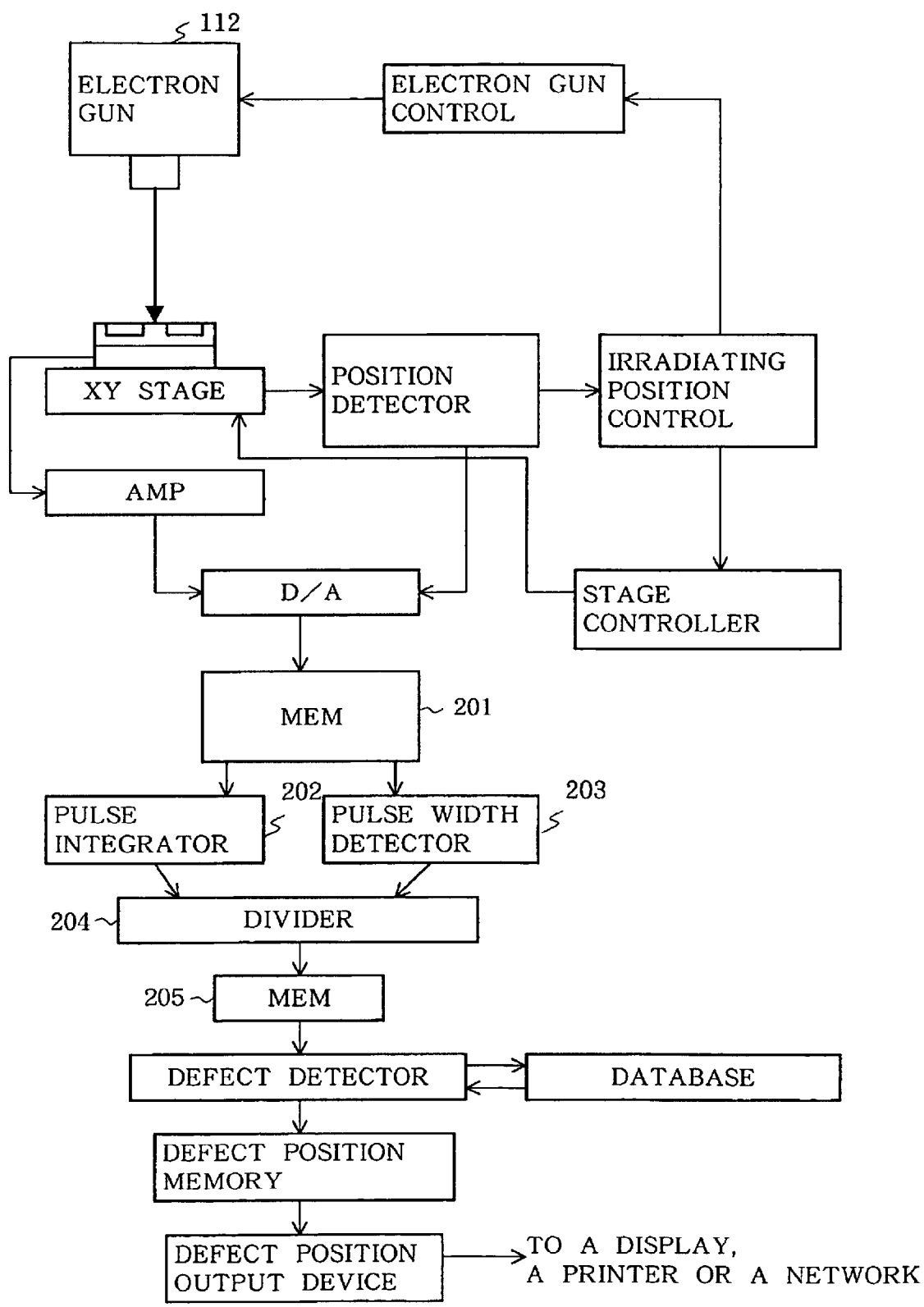
FIG. 37 shows a construction of an apparatus for performing a comparative test on the basis of current value per unit area.
Figure 38:
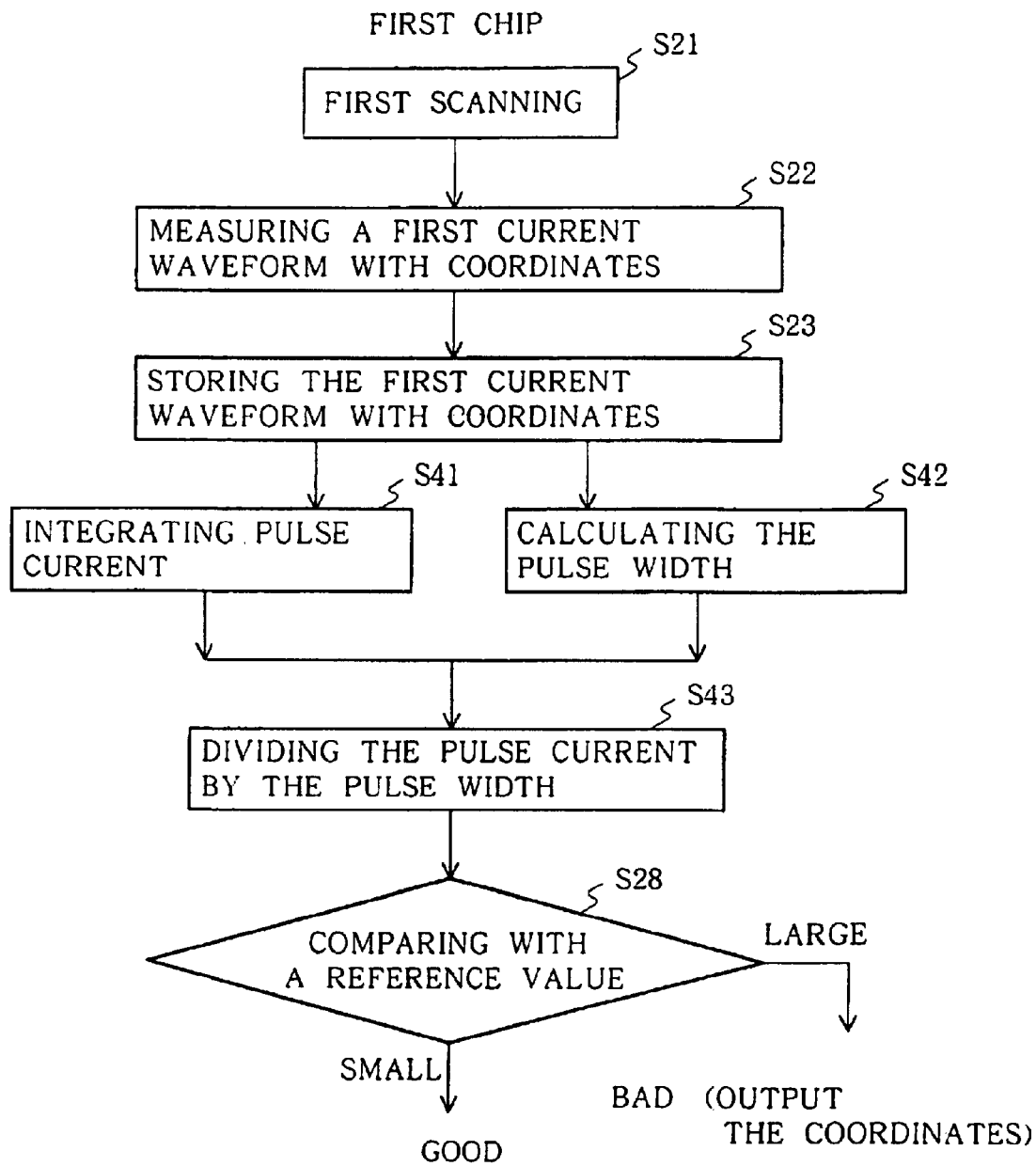
FIG. 38 shows a flowchart of the apparatus shown in FIG. 37.

FIG. 37 shows an example of a construction of a test device for comparing current values per unit area, which is similar to the test device shown in FIG. 25, and FIG. 38 shows a flowchart thereof. Instead of the memories 121 and 122 and the waveform comparator 123 of the test device shown in FIG. 25, the test device shown in FIG. 37 includes a memory 201, a pulse integrator 202, a pulse width detector 203, a divider 204 and a memory 205. Measured current waveform is stored in the memory 201 (S23 in FIG. 38) and the pulse integrator 202 integrates an amount of current flowing in a time from a rising edge to a falling edge of one pulse belonging to the stored waveform to obtain a total amount of current flowing during the one pulse (S41). The pulse width detector 203 obtains a width of the wiring from the pulse width of the current waveform stored in the memory 201 (S42). The divider 204 divides the total amount of current obtained by the pulse integrator 202 by the wiring width obtained by the pulse width detector 203, resulting in a current value per unit area, which has no relation to the wiring width (S43). A quality determination device 124 compares the value obtained by the divider 204 with a reference value which is preliminarily obtained and stored in a quality determination database 125 to determine whether the quality of the sample is good or bad according to a difference (S28).

Figure 39A:
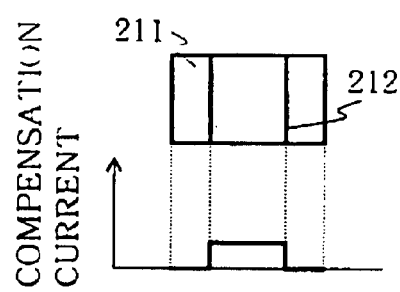
Figure 39B:
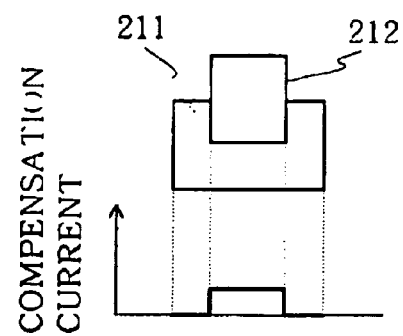

FIGS. 39(a) and 39(b) illustrate a relation between a coverage of electron beam for a wiring and a current waveform, in which FIG. 39(a) is 100% coverage in which electron beam passes through one wiring while covering the wiring completely and FIG. 39(b) is 50% coverage in which electron beam passes through one wiring while covering a half of the wiring. When the wiring 212 is completely contained in an electron beam scanning band 211, which is a scanning region of the electron beam, an identical current waveform is obtained every scan. On the contrary, when the wiring 212 is deviated from the electron beam scanning band 211, a current waveform obtained in the wiring 212 in one scan may become different from that in another scan. However, since an amount of current per unit area of a normal contact wiring is constant, it is possible to determine the quality of a test sample by comparing a current per unit area obtained by the test sample with the constant current.

A reference value used in this case for determining the quality of the test sample is the amount of current per unit area of the normal wiring. Therefore, the reference value may be a value corresponding to a wiring of a chip of another wafer processed through an identical step, data obtained from a test pattern or a value obtained by such as simulation, etc. The use of the value corresponding to the wiring of the chip of the other wafer as a reference value is effective when the yield of wiring in a wafer fabricated in a trial is very low.

Comparison by Current Value Per Unit Area in Mass-Production Factory

Figure 40:
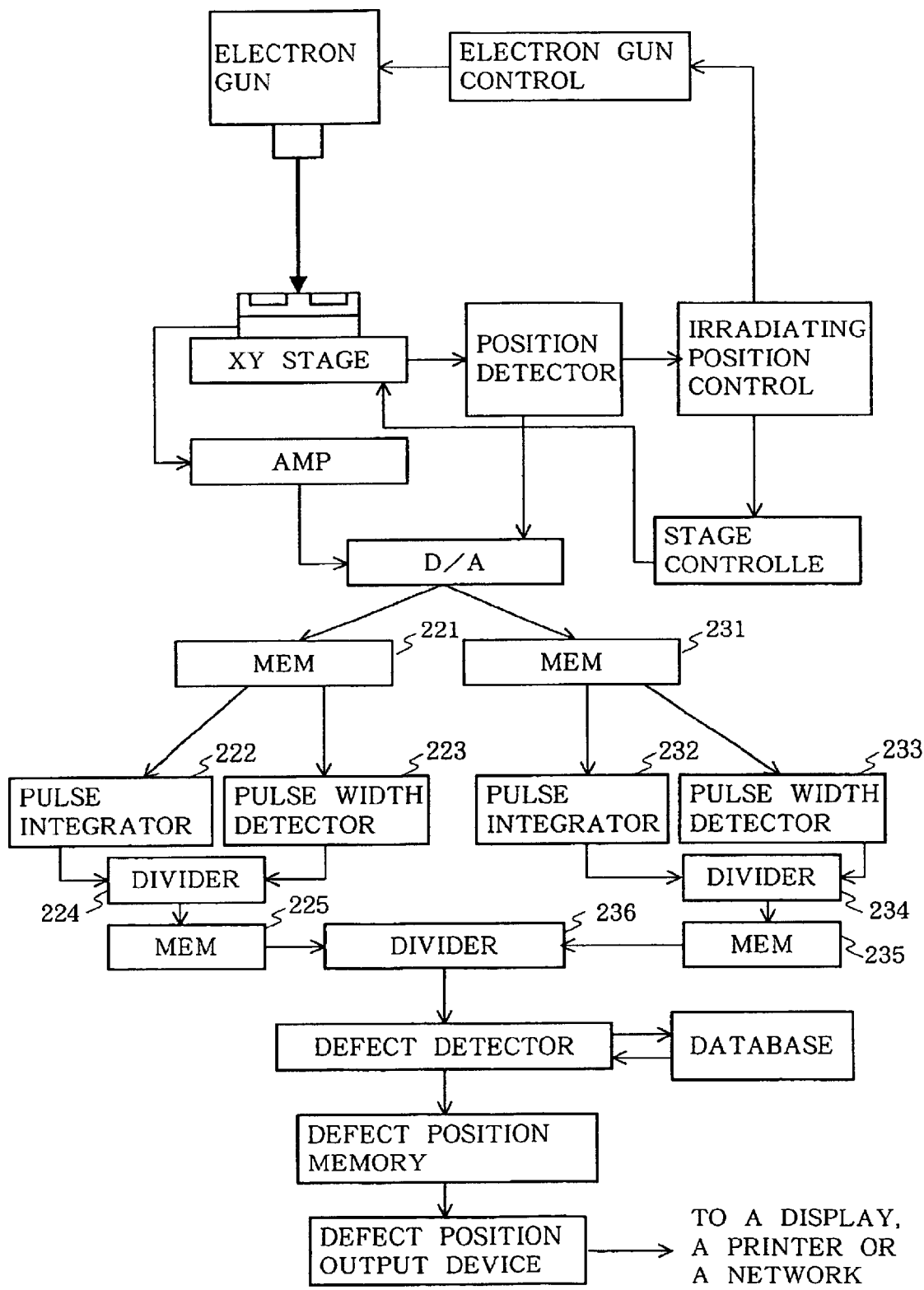
FIG. 40 shows a construction of an apparatus for performing a comparative test by using a plurality of chips on a common substrate.
Figure 41:
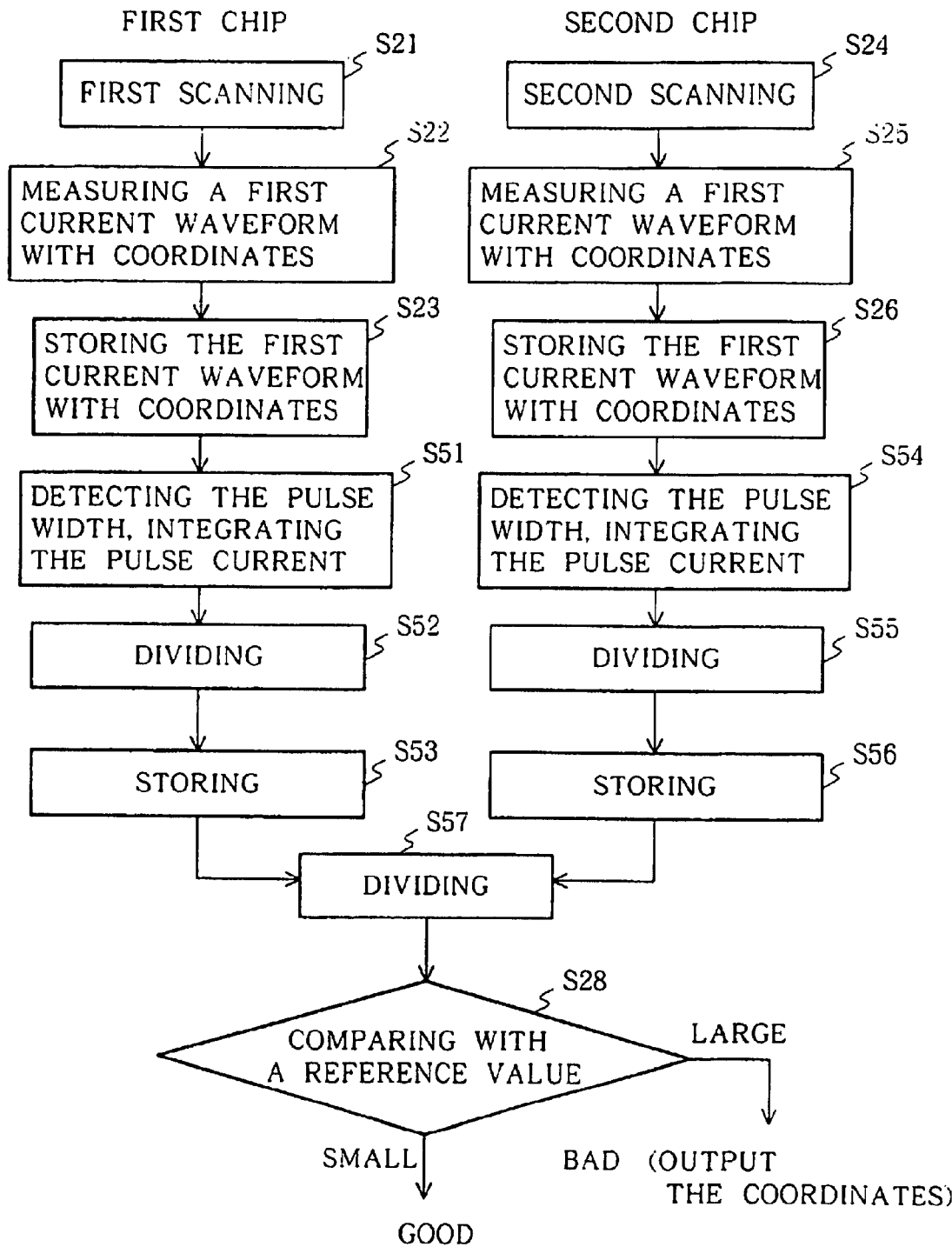
FIG. 41 shows a flowchart of the apparatus shown in FIG. 40.

FIG. 40 shows a construction of a semiconductor device tester for performing a comparative test by using a plurality of chips on one and the same substrate and FIG. 41 shows a test flowchart used therein. The semiconductor device tester is similar to the semiconductor device tester shown in FIG. 37 and includes two parallel measuring circuits each similar to the circuit shown in FIG. 37 and including the memory 201, the pulse integrator 202, the pulse width detector 203, the divider 204 and the memory 205. That is, the semiconductor device tester shown in FIG. 40 includes memories 221 and 231, pulse integrators 222 and 232, pulse width detectors 223 and 233, dividers 224 and 234, memories 225 and 235 and a divider 236 for dividing values stored in the memories 225 and 235.

This semiconductor device tester is effectively used in a mass-production factory, in which the amount of production is relatively stable, to comparatively test a plurality of chips on a common substrate. That is, the amount of current per unit area, which has no relation to the width of wiring, is obtained by obtaining a current waveform by irradiating a first test sample with electron beam, storing the current waveform the memory 221, obtaining a total amount of current during a time from a rising edge to a falling edge of one pulse belonging to the measured current waveform by integrating the current by the pulse integrator 222, obtaining a pulse width between the rising edge and the falling edge of the pulse waveform equal to a width of a wiring by the pulse width detector 223 and dividing the total amount of current obtained by the pulse integrator 222 by the pulse width obtained by the pulse width detector 223. The current per unit area thus obtained is stored in the memory 225. The same operation is performed for a second test sample and a resultant current per unit area for the second test sample is stored in the memory 235. The content of one of the memories 225 and 235 is divided by the content of the other memory by the divider 236 and a resultant quotient is compared with a reference value preliminarily stored in the quality determination database 125 by the quality determination device 124. The reference value defines a difference tolerable between chips. When a result of comparison is large, it is considered that there is a defect in that position.

Comparison of Position of Current Waveform

Figure 42:
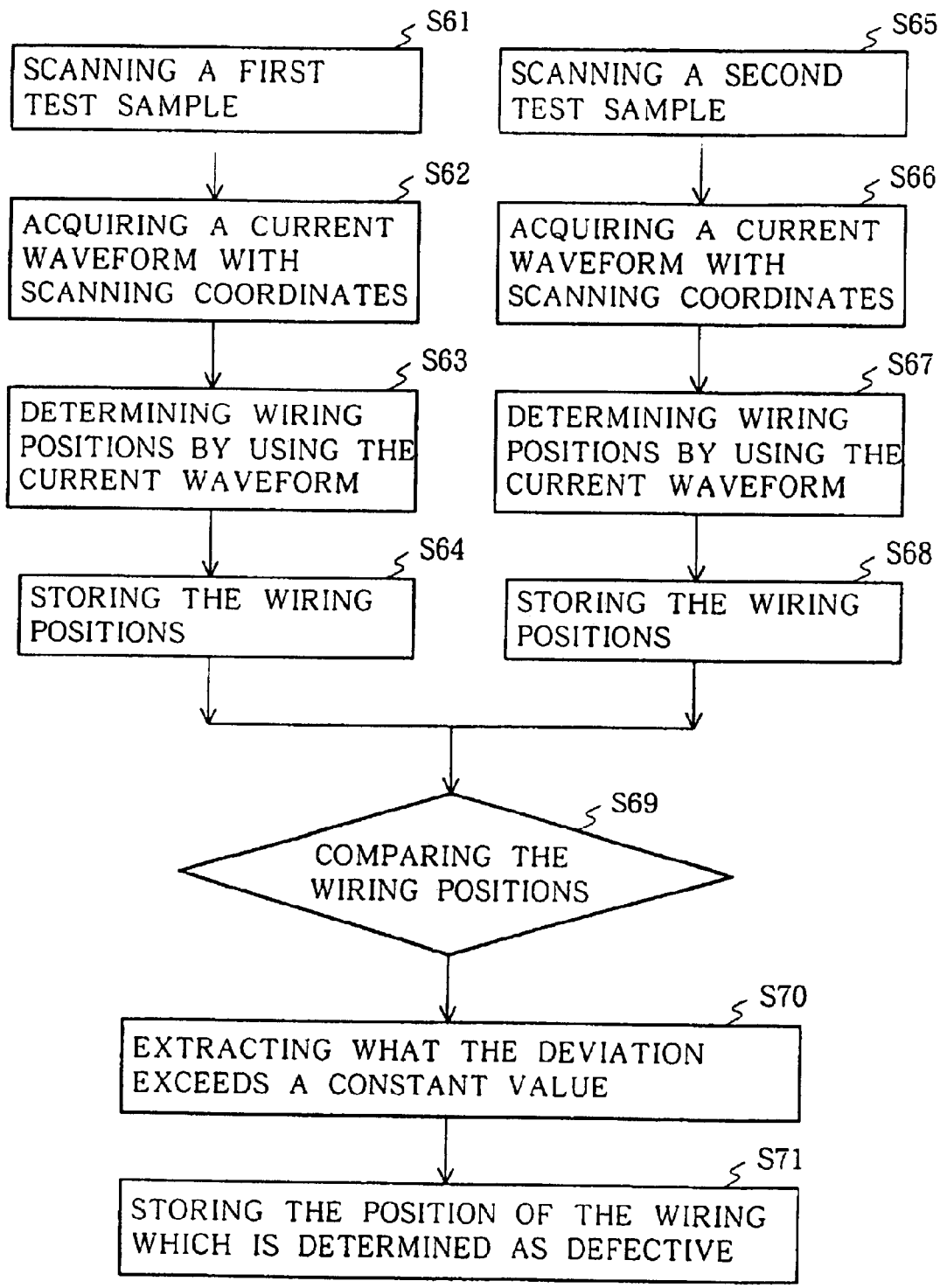
FIG. 42 is a flowchart of a test in which quality of wiring is determined by a rising and a falling edges of current waveform.

FIG. 42 is a flowchart for determining the quality of wiring by using a rising and falling edges of an acquired current waveform. In this test, the quality of wiring is determined by utilizing the fact that the rising and falling edges of the current waveform corresponds to respective edges of the wiring. That is, a current waveform is acquired by scanning a first test sample with electron beam (S61, S62), with which wiring positions of the first test sample are determined (S63, S64). Then, a current waveform is acquired by scanning a second test sample (S65, S66), with which wiring positions of the second test sample are determined (S67, S68). A deviation of each wiring position of the first test sample from the corresponding wiring position of the second test sample is measured by comparing the rising and falling edges of the waveforms (S69). When the deviation exceeds a constant value, the wiring of the first or second test sample is determined as defective (S70) and the position of the defective wiring is stored in a memory (S71).

Figure 43A:
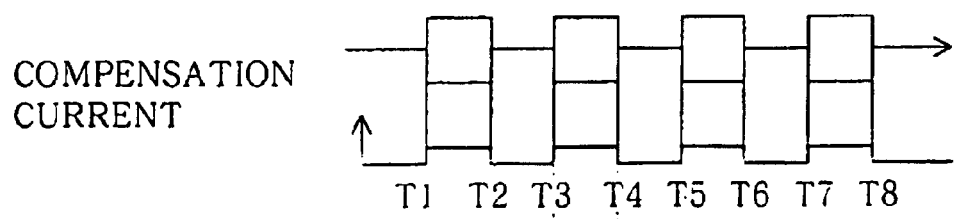
Figure 43B:
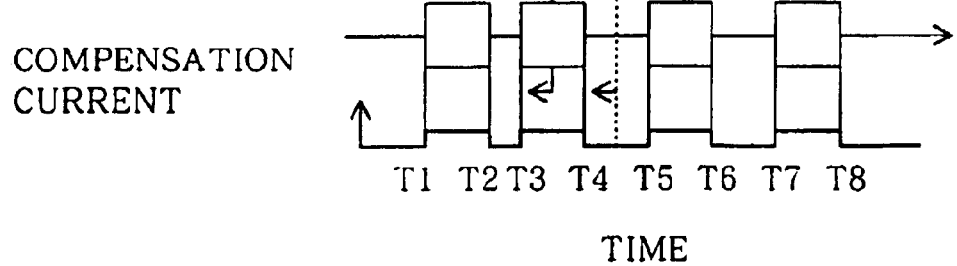

FIGS. 43(a) and 43(b) show an example of the test, in which FIG. 43(a) shows a test result of a normal sample and FIG. 43(b) shows that of a defective sample. For the normal sample, a wiring 241 is formed periodically and a rising and falling edges of the current waveform are observed periodically at electron beam irradiating positions T1 to T8 correspondingly to the periodicity of the wiring. For the defective sample, on the other band, a rising edge of a current waveform at the position T3 is deviated from that of the normal sample.

Figure 44:
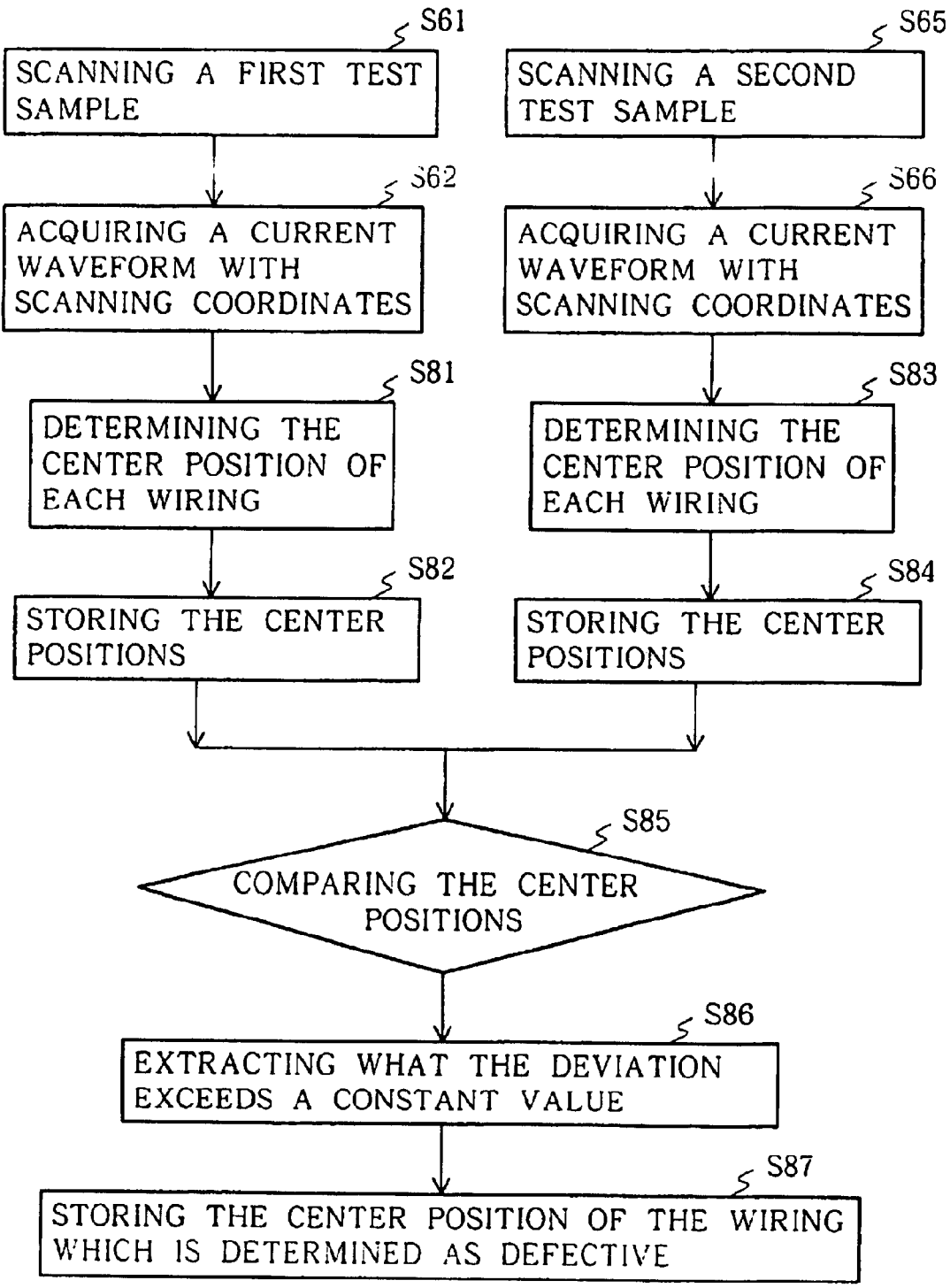
FIG. 44 is a flowchart of a test in which quality of wiring is determined by a center position of a rising and a falling edges of current waveform.

FIG. 44 is a flowchart for determining the quality of wiring by using a center position of a rising and falling edges of an acquired current waveform. In this test, a current waveform is acquired by scanning a first test sample with electron beam (S61, S62), with which a center position of the wiring is determined by calculating center coordinates between rising and falling coordinates of an acquired current waveform (S81, S82). Then, a current waveform is acquired by scanning a second test sample (S65, S66), with which a center position of the wiring is determined by calculating center coordinates between rising and falling coordinates of an acquired current waveform (S83, S84). The center position of the wiring of the first test sample is compared with the center position of the wiring of the second test sample (S85). When the deviation exceeds a constant value (S86), the position of at least one of the wiring center positions is stored in a memory (S87).

Electron Beam Sub-Scan

Figure 45:
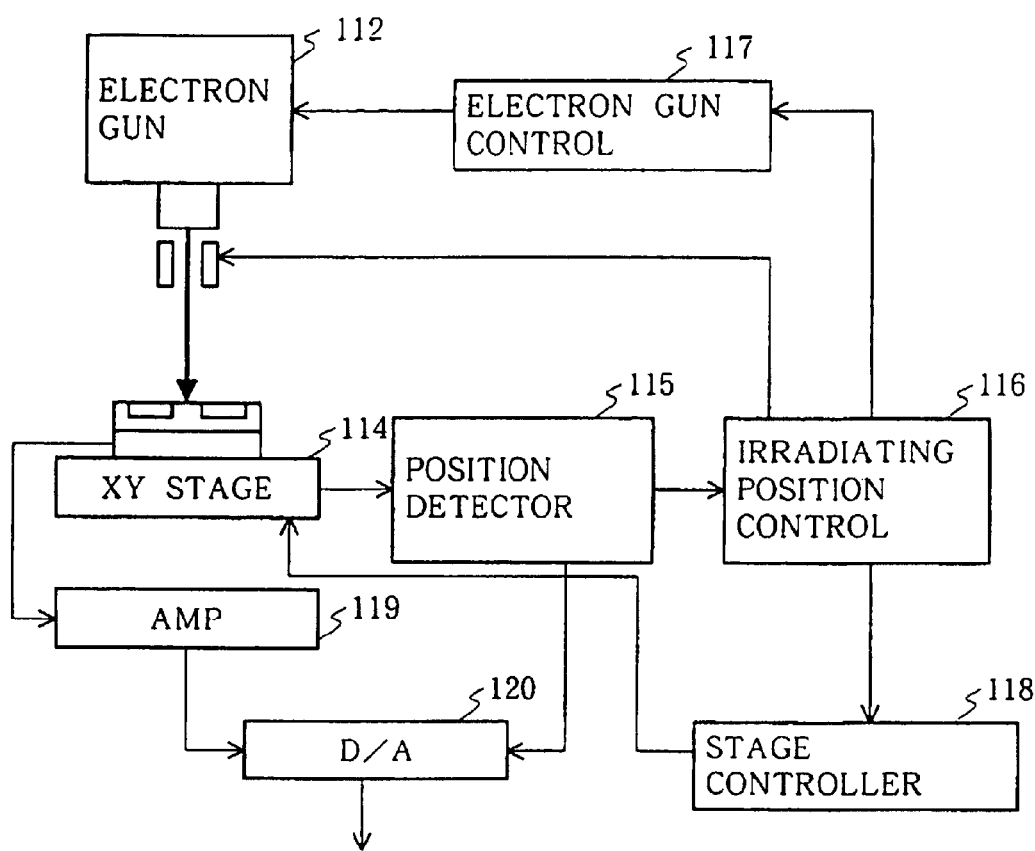
FIG. 45 shows a construction of an apparatus for performing electron beam sub scan.

FIG. 45 shows a construction of a semiconductor device tester for substantially improving the test speed when a test is performed by utilizing thin electron beam. In this construction, a deflector 251 for the sub-scan is included such that a sub-scan by the deflector 251 is performed simultaneously with a main scan performed by moving a wafer by an XY stage 114.

Since the main scan is performed by moving the XY stage 114, it is difficult to stably move it at a speed exceeding 1 m/sec by using a currently available technique. Therefore, even if a processing speed in the current measuring system is very high, an upper limit of the test speed is determined by the electron beam scanning speed. In order to solve this problem, the sub-scan is performed at high speed in a direction perpendicular to the main scan direction simultaneously with the main scan, such that the scan speed is substantially improved. Since the sub scan is performed by deflecting electron beam, the sub scan speed can be substantially higher than the moving speed of the XY stage.

When a distance of sub scan is small, an incident angle of electron beam is substantially 90 degree and does not affect the test. Therefore, a usual electron beam deflector is utilized therefor. When the distance of sub scan is large, a beam shifter is used therefor in order to move the beam in parallel.

Figure 46:
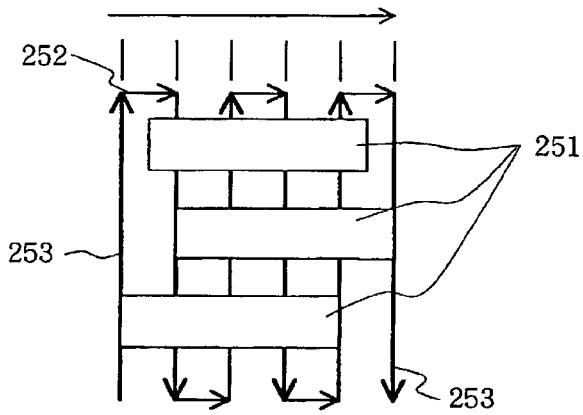
FIG. 46 shows an example of scan locus.

FIG. 46 shows an example of a scan locus. A sub scan 253, which reciprocates with a constant width at high speed, is performed while the main scan 252 progresses with respect to a wiring lines 251 in a constant direction at low speed. The sub scan 253 is performed in parallel with an interval corresponding to a width of wiring under test. In such case, the scan is performed at an apparent speed, which is the main scan speed multiplied with the sub scan speed, so that the test speed can be improved by leaps and bounds.

Speed-up of Array Region Test

Figure 47:
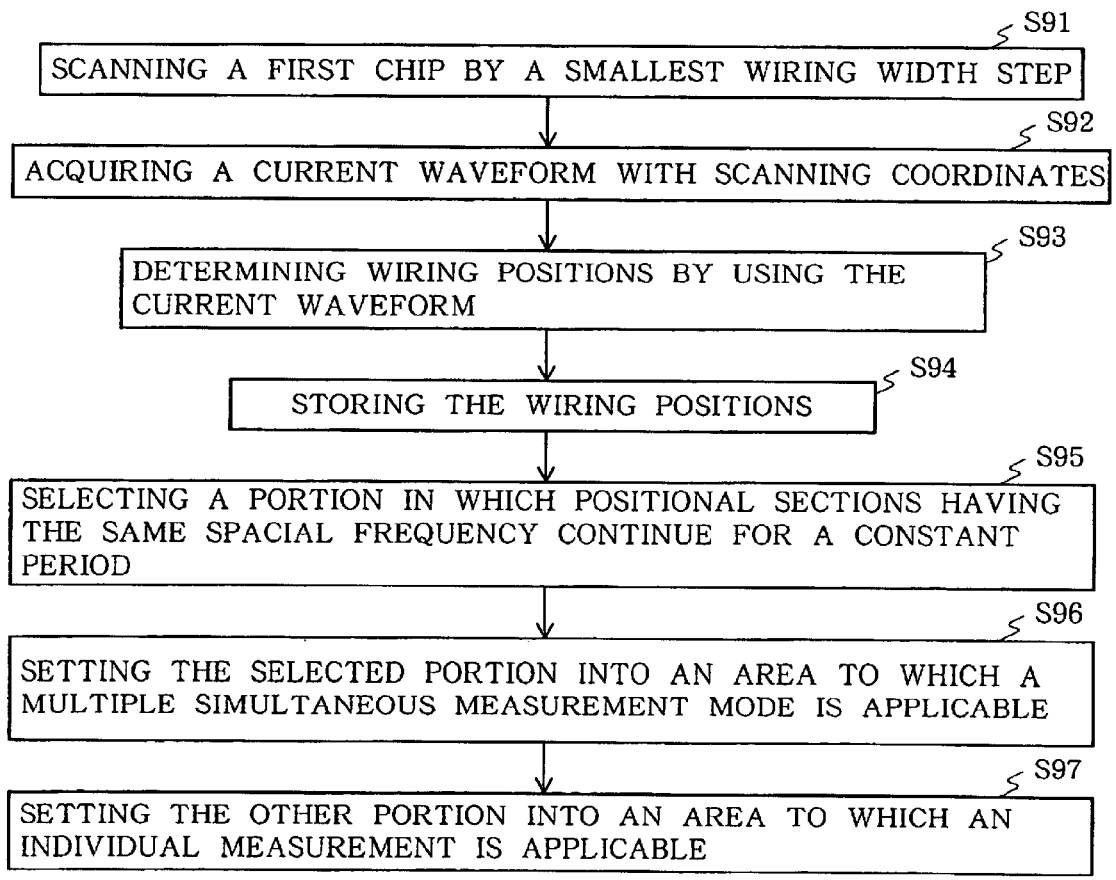
FIG. 47 shows a test flowchart with which a test speed of an array region is increased.

FIG. 47 is a test flowchart for increasing a test speed. In an SOC device, etc., there may be a ray regions, in which long contact wiring lines of such as a memory are arranged equidistantly together with random logics. Such array regions are automatically extracted from a test sample without requiring a layout information from a CAD, etc., and the extracted portion is tested by an independent speed-up method specific to the array. In order to do it, it is first to check an initial chip to acquire current waveforms of all of the regions to be tested (S91, S92). Then, positions of wiring lines appearing along the scan direction are detected from rising and falling edges of the current waveforms and stored (S93, S94). Thereafter, spacial distribution of the wiring positions is frequency-analyzed every certain specific section (for example, from several tens to several hundreds microns).

Figure 48:
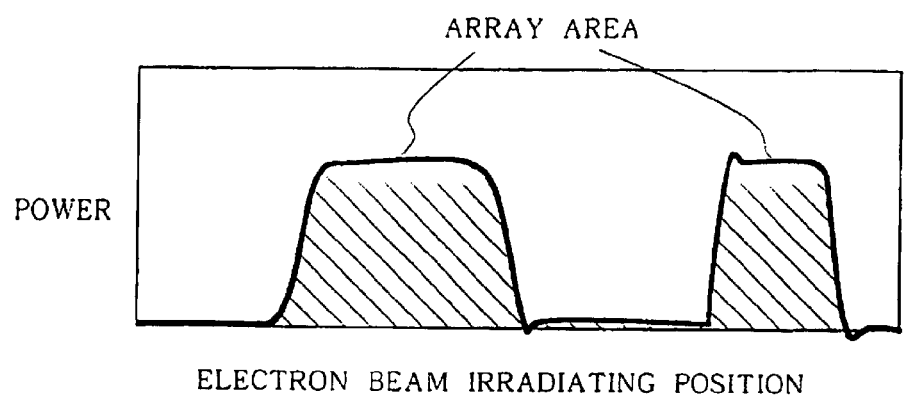
FIG. 48 shows an example of a power spectrum obtained by a frequency analysis.

FIG. 48 shows an example of a power spectrum obtained by the frequency-analysis. The power spectrum has a position dependency. A region in which power is large corresponds to a strong correlation to current waveform and an existence of an array is detected in that region. On the contrary, a region in which power is small can be considered as a random logic region.

The array portion thus detected is irradiated with electron beam to obtain a rate of defective wiring in the lump. Thus, the test speed is improved.

Measurement of Three-dimensional Configuration

Figure 49:
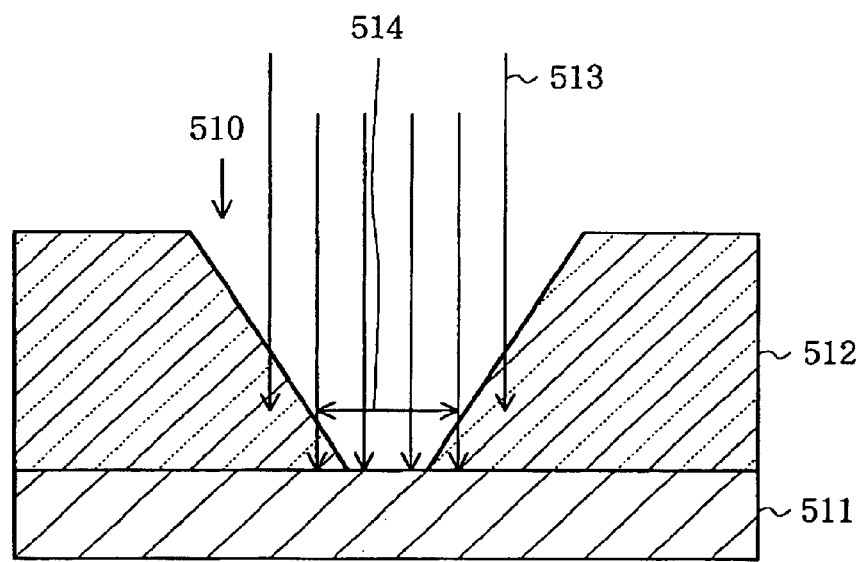
FIG. 49 illustrates a measurement of a three-dimensional configuration of a contact-hole.
Figure 50:
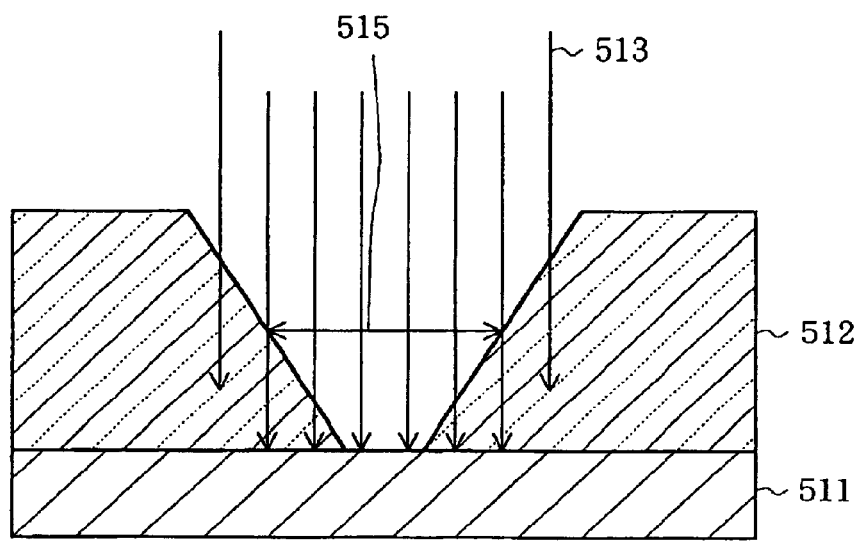
FIG. 50 illustrates a measurement of a three-dimensional configuration of a contact-hole.

According to the present invention, it is possible to measure not only the bottom diameter of a contact-hole but also the three-dimensional configuration thereof. That is, the present invention utilizes variations and distribution of electron beam irradiating the bottom of the contact-hole by changing acceleration voltage of the electron beam and the tilting angle of the wafer. This will be described with reference to FIGS. 49 and 50. When the acceleration voltage of electron beam irradiating a tapered contact-hole 510 is low, electrons 513 hardly penetrate an insulating film 512, so that a portion of the wafer other than a bottom portion 514 of the contact-hole 510 hardly attributes to the current measured as shown in FIG. 49. When the acceleration voltage of electron beam is increased, electrons 513 penetrate through a portion 515 of the insulating film 512 surrounding the bottom portion of the contact-hole 510 as shown in FIG. 50, so that the measured current value is changed. By utilizing this phenomenon, it is possible to measure an edge of the contact-hole or a thickness of the insulating film.

Figure 51:
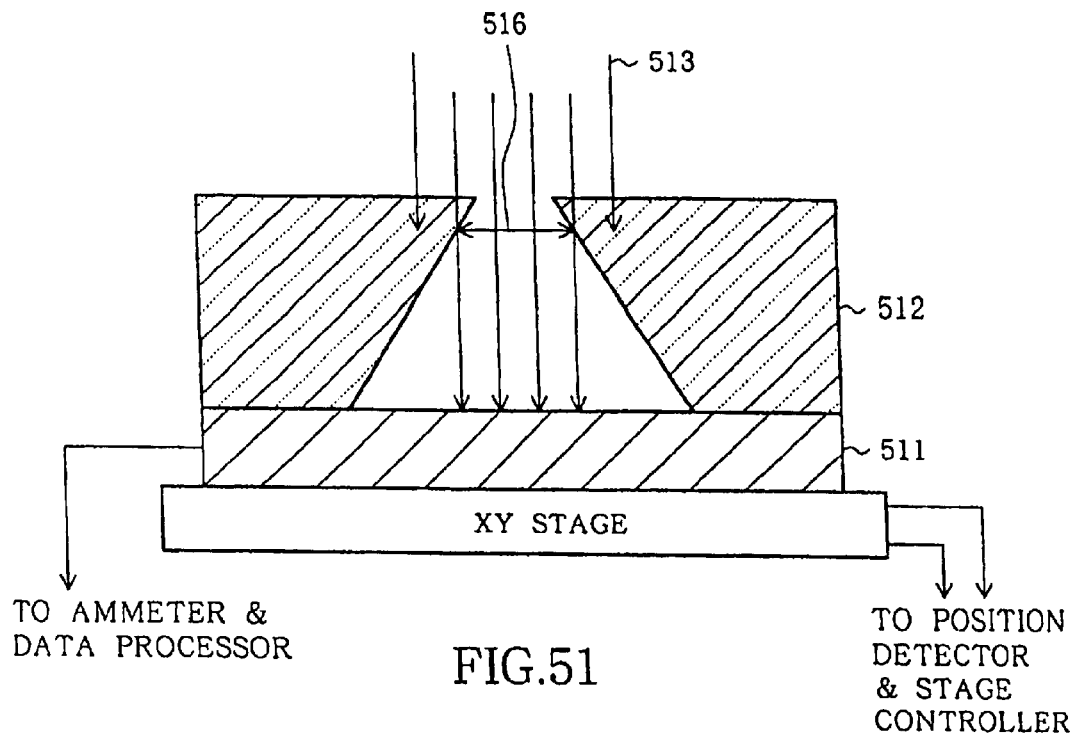
FIG. 51 illustrates a measurement of a three-dimensional configuration of a contact-hole.
Figure 52:
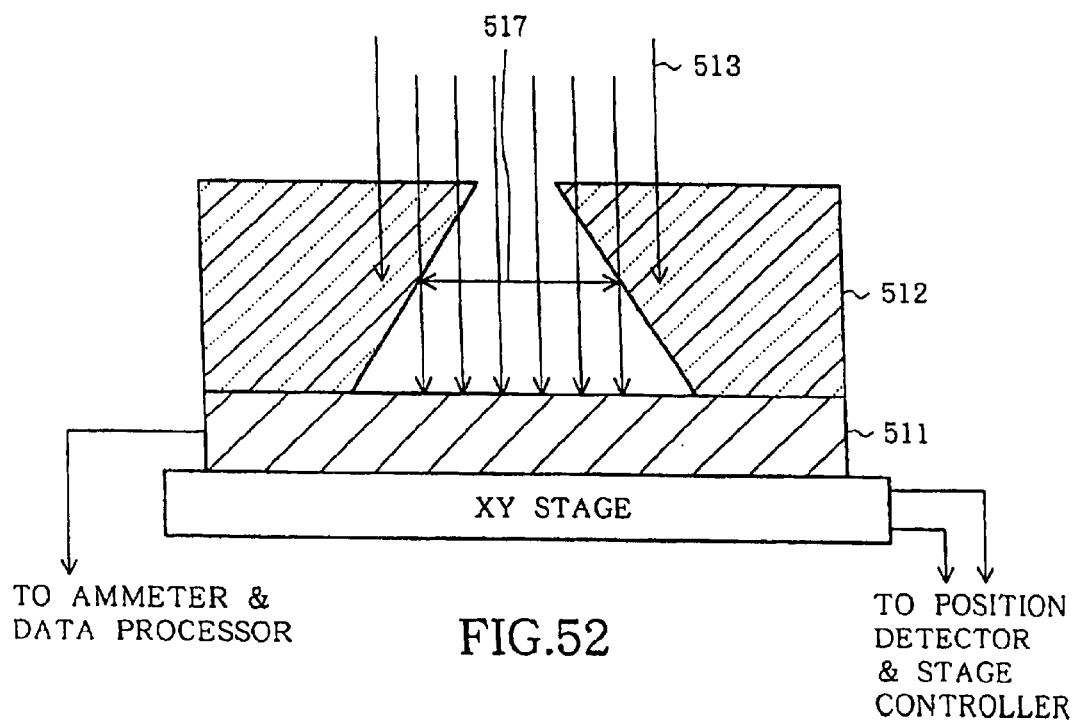
FIG. 52 illustrates a measurement of a three-dimensional configuration of a contact-hole.
Figure 53:
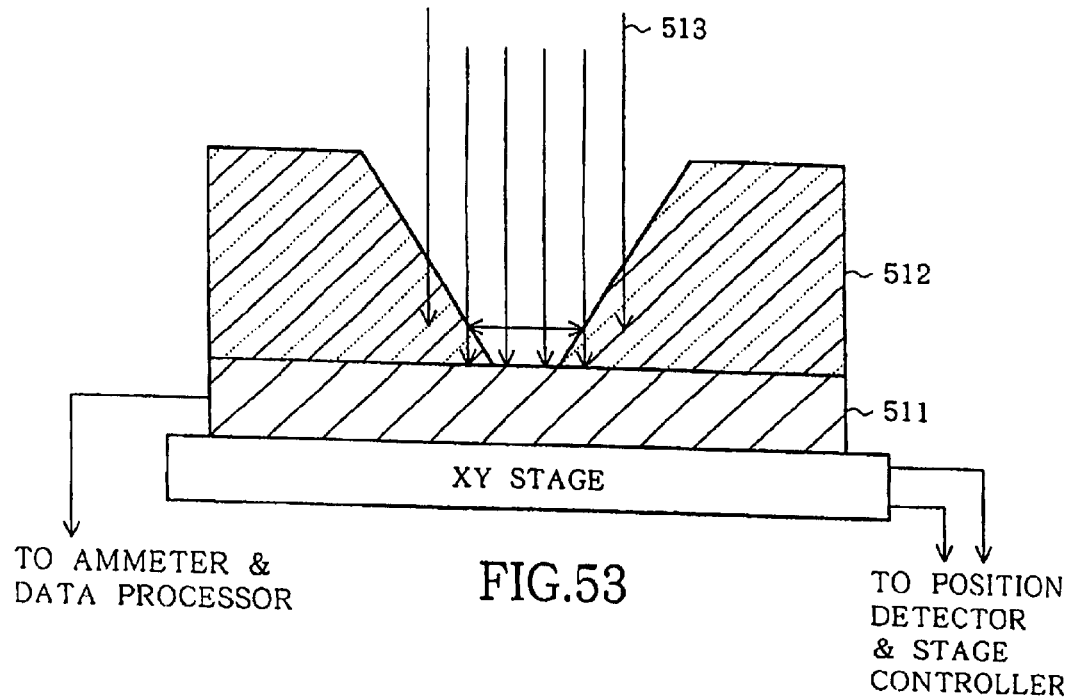
FIG. 53 illustrates a measurement of a three-dimensional configuration of a contact-hole.
Figure 54:
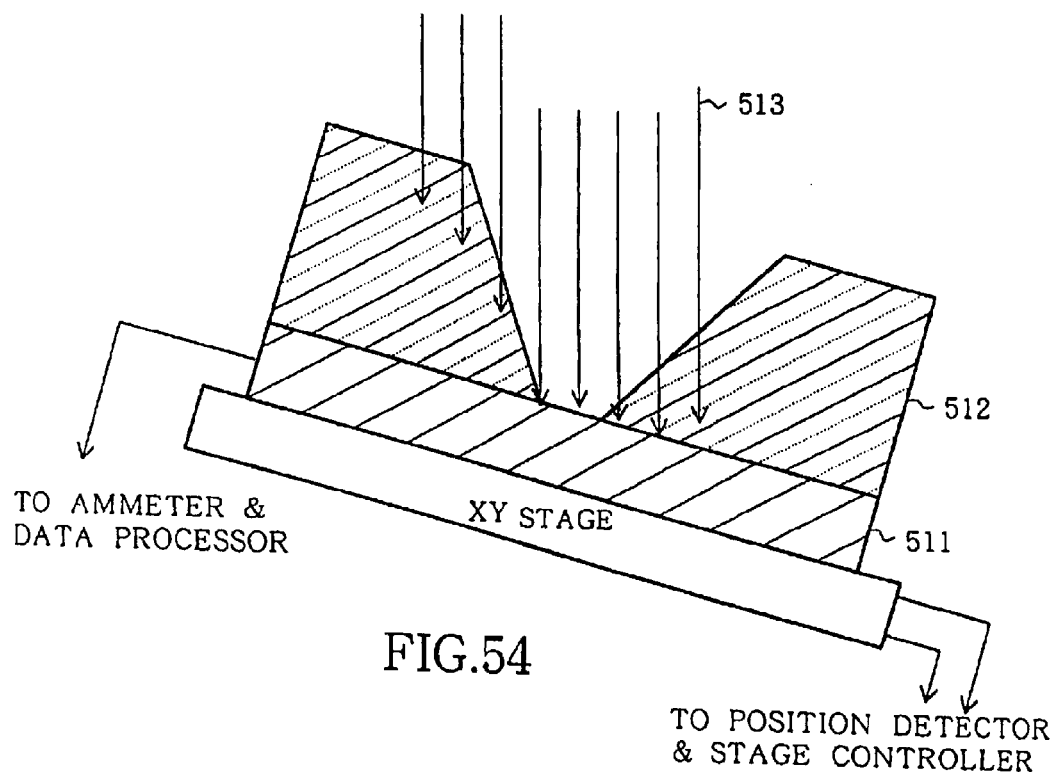
FIG. 54 illustrates a measurement of a three-dimensional configuration of a contact-hole.

Similar measurement to that shown in FIGS. 49 and 50 can be performed for a reverse-tapered contact-hole shown in FIGS. 51 and 52. In such case, as electrons 513 penetrate portions 515 and 516 on according to the acceleration voltages, it is impossible to distinguish in configuration of the contact-hole between a tapered contact-hole and a reverse-tapered contact-hole by using only this measurement. In order to distinguish the contact-hole configuration, the measurement is repeated while changing the tilting angle of the wafer as shown in FIGS. 53 and 54 and, from a change of the intensity distribution of wafer current due to the change of the tilting angle, it is possible to determine whether the contact-hole is tapered or reverse-tapered.

In order to obtain a three-dimensional configuration of a contact-hole, the dependencies of electron beam absorption coefficients of materials constituting a sample under test on electron beam acceleration voltage are preliminarily obtained and preserved as a library.

Figure 55:
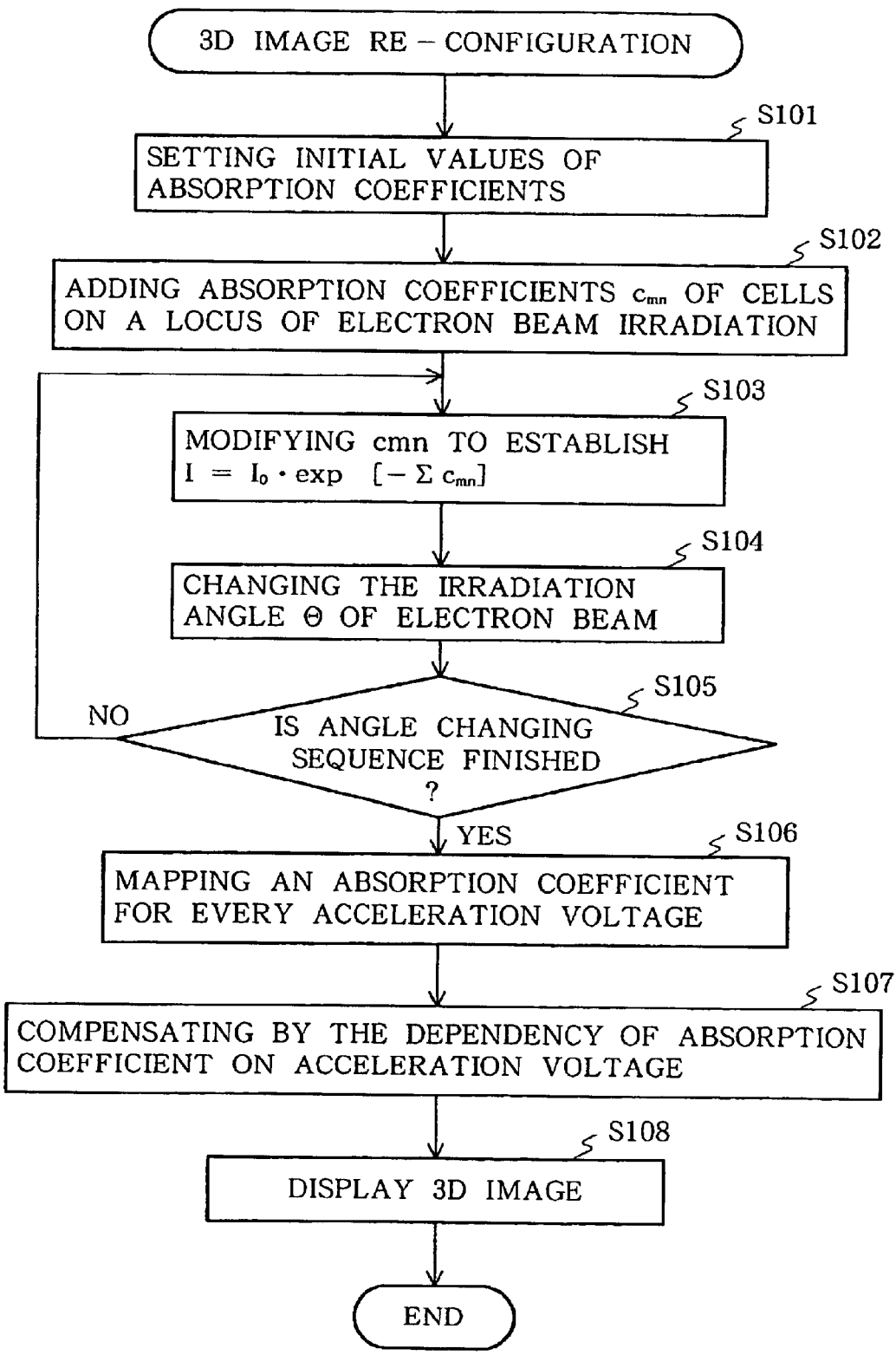
FIG. 55 shows a process flowchart for obtaining a three-dimensional configuration of a contact-hole by successive-approximation.
Figure 57:
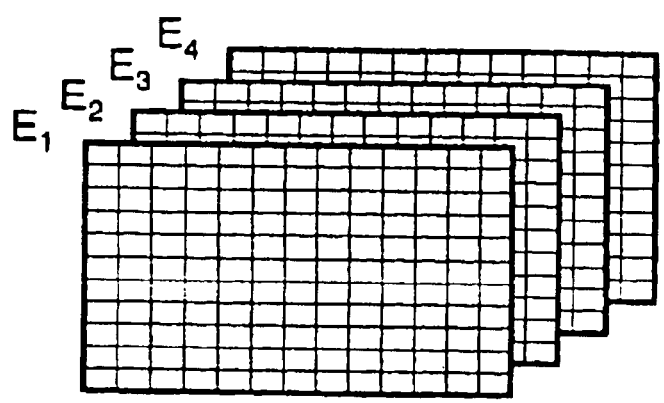
FIG. 57 illustrates another portion of the process.
Figure 58:
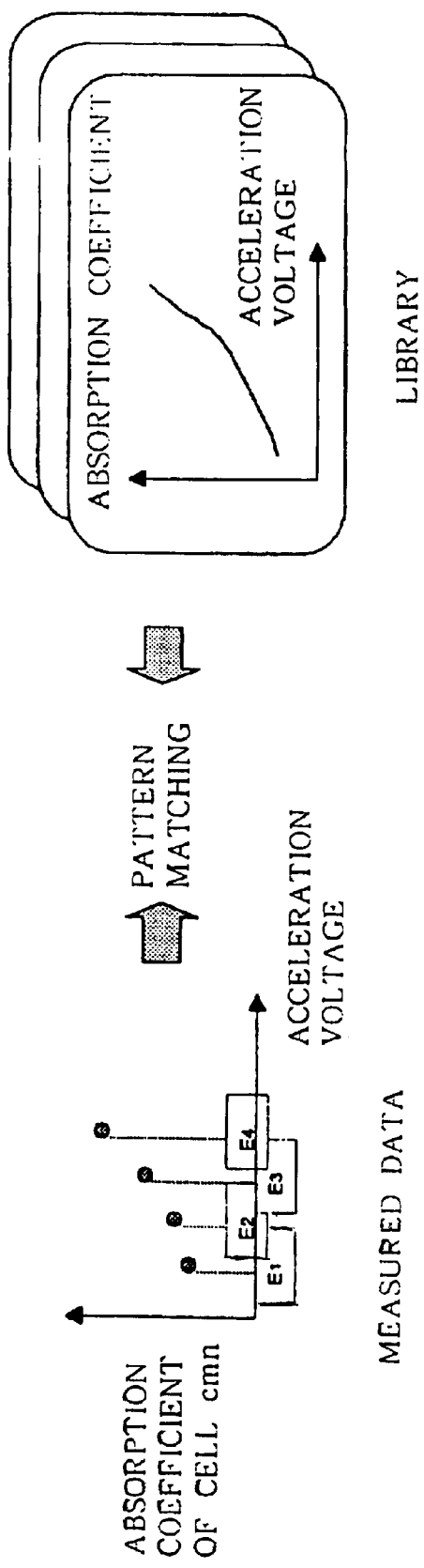
FIG. 58 illustrates another portion of the process.

As a method for restoring a three dimensional image from the current values measured, the Fourier transformation, successive approximation and superposed integration may be considered. The successive approximation among them will be described with reference to FIGS. 55 to 58, in which FIG. 55 shows a processing flowchart and FIGS. 56 to 58 show respective processings.

Figure 56:
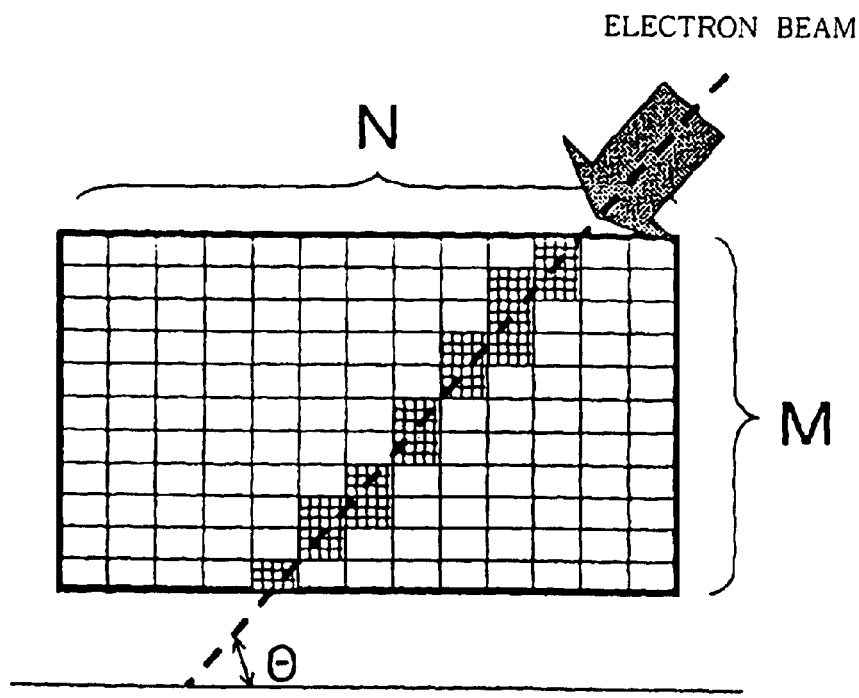
FIG. 56 illustrates a portion of the process.

(1) First, as shown in FIG. 56, a two-dimensional image of a sample under test is decomposed to M×N pixels and a suitable initial value of absorption coefficient is given to the respective pixels (S101).

(2) Then, absorption coefficients $c_{mn}$ of cells on a locus of electron beam irradiation are added (S102). It is assumed here that the following relation is established between the total value of absorption coefficients and substrate the current value I measured:

$$I = I_0 \cdot \exp[-\Sigma c_{mn}] \qquad (1)$$

In order to establish the above relation, the absorption coefficients $c_{mn}$ of the corresponding cells are modified (S103).

(3) The operation (2) is performed by changing the irradiation angle Θ of electron beam sequentially (S104, S105). That is, the absorption coefficients $c_{mn}$ of the respective cells are modified sequentially such that the equation (1) is always established under any measuring condition (any irradiating angle Θ and any acceleration voltage E).

(4) The operations (2) and (3) are repeated while sequentially changing the acceleration voltage E of electron beam to obtain a map of an absorption coefficient every acceleration voltage by approximation (S106), as shown in FIG(. 57.

(5) The dependency of absorption coefficient on acceleration voltage of each cell is compared with the data on the library as shown in FIG. 58 (S107).

(6) The quantitative three-dimensional image of the sample under test is obtain through the above operations (S108).

In the above described image restoring method, the resolution depends upon a probe diameter of electron beam, a spot interval of electron beam and a size of the cell in the successive approximation method and the preciseness of quantitative analysis depends upon a swinging interval of electron beam acceleration voltage, an amplitude of the swinging and a sensitivity of a substrate ammeter.

Interlayer Deviation

In the present invention, it is possible to non-destructively detect an interlayer deviation by utilizing transmission of electron beam through an insulating film. That is, a structure of a lower layer is acquired by irradiating a diffusion layer or a wiring with electron beam passed through the insulating film by increasing the acceleration voltage and, simultaneously, an information of a diffusion layer or a wiring in an upper layer is acquired. It is possible to detect and evaluate a deviation between a contact-hole position and the lower layer structure from an information of different layers, which is obtained simultaneously therewith. Further, by changing a penetration depth of electron beam by changing the acceleration voltage, it is possible to evaluate from a surface of a wafer an interlayer deviation such as between a second layer and a third layer, between the third layer and a fourth layer or between the second layer and the fourth layer. Although, when the lower layer is measured by increasing the acceleration voltage, an information of an upper layer is mixed in the information of the lower information, the information can be separated from each other by an image processing. When an electrically conductive layer such as a wiring, which is not electrically connected to the substrate, is arranged in the upper layer, it can be detected as a negative image when the lower layer is measured.

Figure 59A:
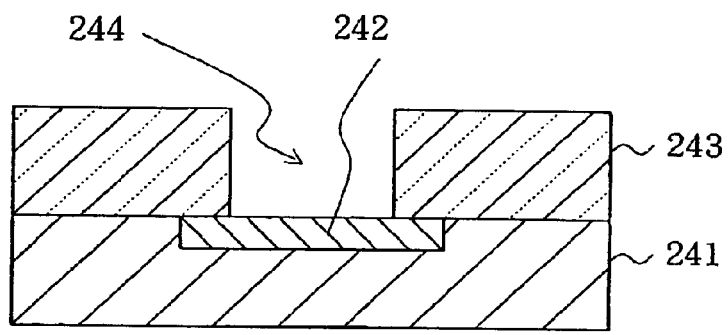
Figure 59B:
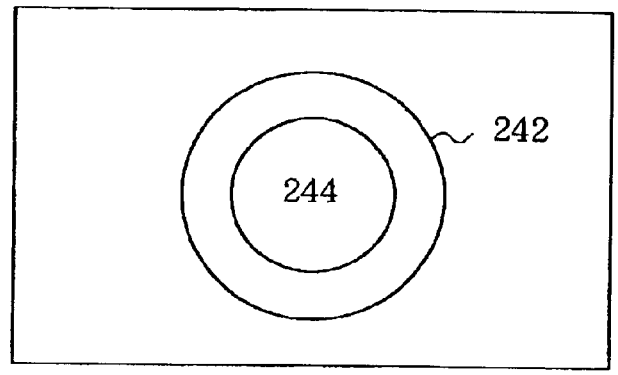

FIGS. 59(a) and 59(b) show an evaluation example of interlayer deviation, in which FIG. 59(a) shows a cross section of a semiconductor device, FIG. 59(b) shows a measured current image. In this example, an insulating film 243 is provided on a wafer 241 on which a diffusion layer 242 is formed and a portion of the diffusion layer is exposed through a contact-hole 244 provided in the insulating film 243. When the acceleration voltage is low and electron beam can not pass through the insulating film 243, a position of the contact-hole 244 can be known from an irradiating position of electron beam and a measured substrate current. When the acceleration voltage is increased to a value with which electron beam can pass through the insulating film 243, a position of the whole diffusion layer 242 can be known from a difference in impurity density from the substrate. The interlayer deviation can be evaluated by evaluating a deviation between a center of the contact-hole 244 and a center of the diffusion layer 242 or a distance between outer peripheries of the contact-hole 244 and the diffusion layer 242.

Figure 60A:
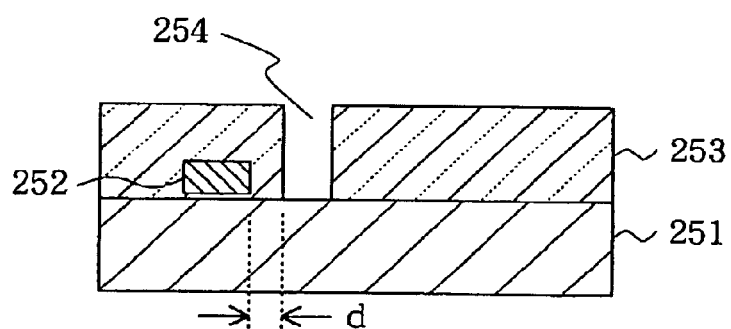
Figure 60B:
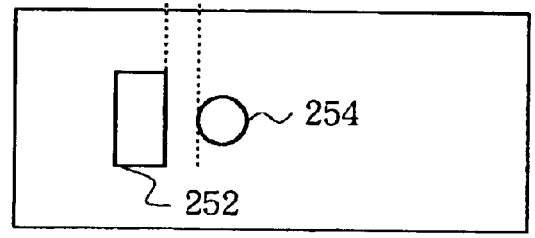

FIGS. 60(a) and 60(b) to 61(a) and 61(b) show another evaluation example of interlayer deviation, in which FIG. 60(a) shows a cross section of a semiconductor with no interlayer deviation, FIG. 61(a) shows a cross section of a similar semiconductor device with interlayer deviation and FIGS. 60(b) and 61(b) show respective measured current image. On each device, a wiring 252 is provided on a surface of a wafer 251 and an insulating layer 253 is formed on the wiring 252. A contact-hole 254 is formed in the insulating layer 253. Although a position of the wiring 252 is nominally deviated by d from a position of the contact-hole 254, the deviation d' of the device shown in FIG. 61(a) is larger than the nominal value. Similarly to the example shown in FIGS. 59(a) and 59(b), in the case shown in FIGS. 60(a), 60(b), 61(a) and 61(b), the position of the contact-hole 254 is detected by using electron beam having low acceleration voltage and the position of the wiring 252 is detected by electron beam having high acceleration voltage. By measuring a distance between the contact-hole and the wiring, the deviation can be evaluated.

In the example shown in FIGS. 62(a), 62(b), a diffusion layer 262 is provided on a surface of a wafer 261. A lower layer wiring 264 is formed on a first insulating film 263 which covers the wafer 261 and the diffusion layer 262 and an upper layer wiring 266 is formed on a second insulating film 265 which covers the first insulating film 263 and the lower layer wiring 264. The upper layer wiring 266 is covered by a third insulating film 267. Positions of the respective layers can be detected by measuring the substrate current while changing acceleration voltage of electron beam sequentially.

Figure 63:
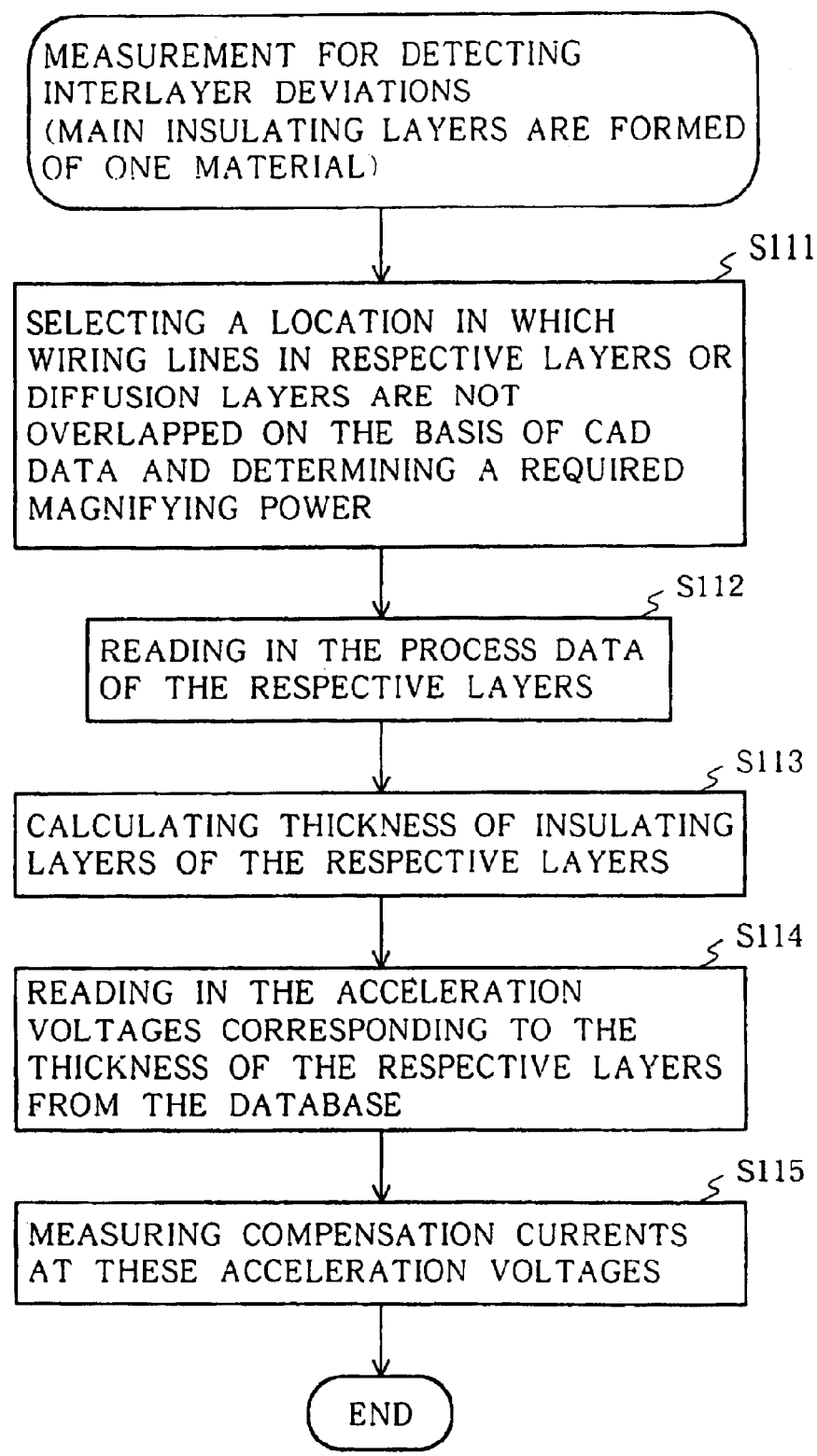
FIG. 63 is a flowchart of measurement when a main insulating film is formed of one kind of material.

In order to detect the interlayer deviations, it is necessary to regulate the acceleration voltage of electron beam such that the electron beam can reach a desired one of layers. FIG. 63 is a flowchart of the interlayer deviation when main insulating layers are formed of one material. First, a location in which wiring lines in respective layers or diffusion layers are not overlapped is selected on the basis of CAD data and a required magnifying power is determined (S111). When the magnifying power is too high, overlapped area can not monitored and, when the magnifying power is too low, a structure can not be observed. Since, when the magnifying power is too high, there is a possibility that an area in which there is no wiring or diffusion layer is tested wastefully, it is preferable to preliminarily select an optimal area from a design data so that the determination processing is facilitated. Then, the process data of the respective layers are read in (S112), thickness of insulating layers of the respective layers are calculated (S113), the acceleration voltages corresponding to the thickness of the respective layers are read in from the database (S114) and compensation currents are measured at these acceleration voltages (S115). This measurement must be performed for each desired layer.

If the insulating layers are formed of one material, the reaction of the insulating layers with respect to electron beam is identical. Even when the insulating layers are formed of different materials, it is possible to handle the different materials of the insulating layers as one material if physical reactions such as secondary electron emission of the different materials with respect to electron beam are identical. The physical properties of the respective insulating layer materials are preliminarily measured and stored in the database. The determination of the interlayer deviation is determined automatically when the process data is read in.

Figure 64:
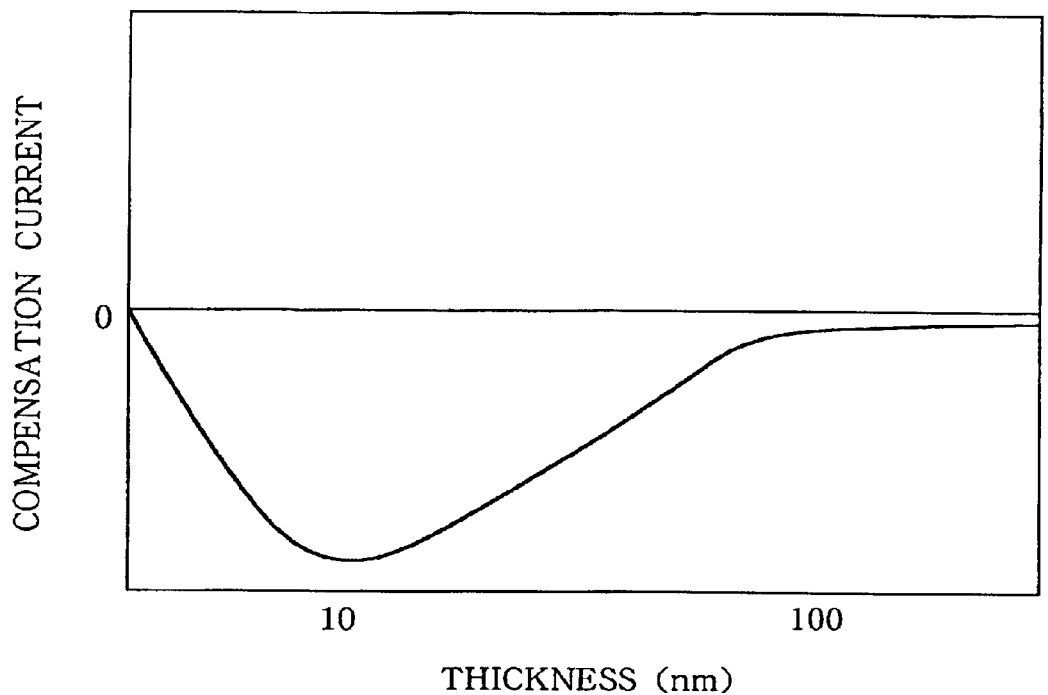
FIG. 64 shows an example of compensation current with respect to film thickness.
Figure 65:
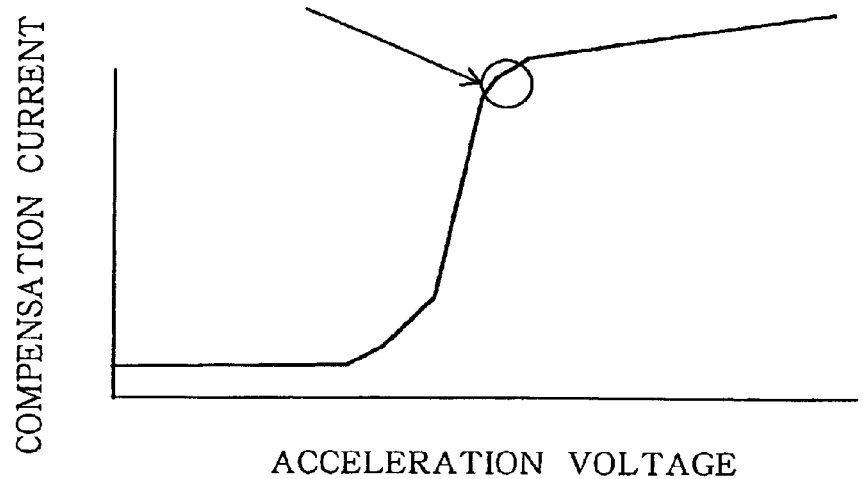
FIG. 65 shows an example of compensation current with respect to acceleration voltage.

As data to be prepared prior to the regulation of acceleration voltage, there are compensation current with respect to the kind and thickness of the insulating layer or current value detected in the wiring and compensation current or current detected in the wiring with respect to acceleration voltage of every kind and thickness of the insulating layer. These data are preliminarily measured and recorded in the database. FIG. 64 shows an example of compensation current with respect to film thickness and FIG. 65 shows an example of compensation current with respect to acceleration voltage.

Figure 66:
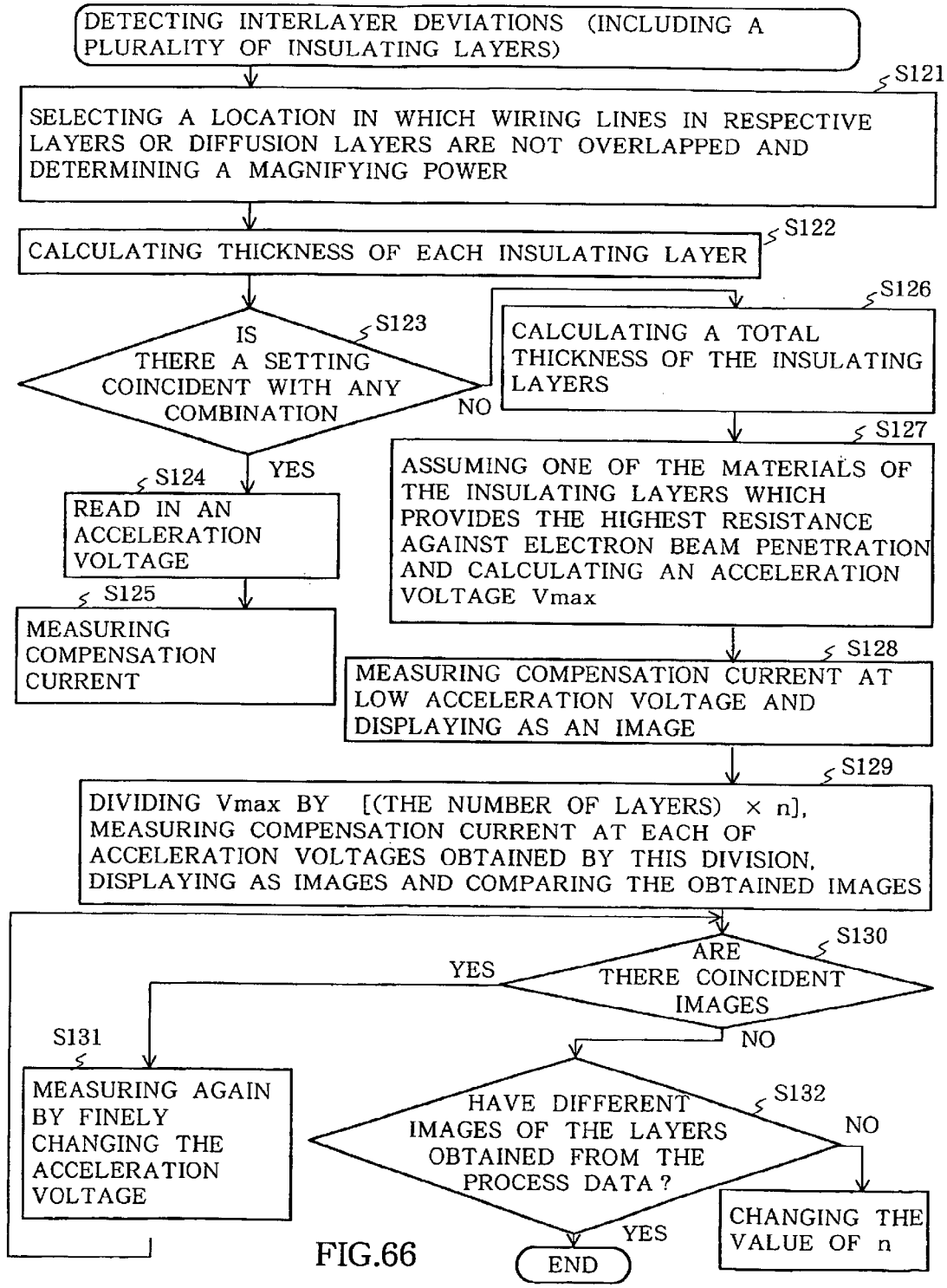
FIG. 66 is a flowchart of measurement when there are a plurality of insulating films.

FIG. 66 is a measuring flowchart when there are a plurality of insulating layers. In this case, a location in which wiring lines in respective layers or diffusion layers are not overlapped is selected on the basis of CAD data and a magnifying power required in the measuring region is determined (S121). Then, thickness of each insulating layer is calculated on the basis of the process data (S122) and a search is performed as to whether or not there is, in the database, a setting coincident with any combination thereof (S123). If there is a coincident setting in the database, an acceleration voltage corresponding to a total thickness of a plurality of different insulating layers is read in from the database (S124) and compensation current is measured with using that acceleration voltage (S125). If thee is no coincident setting, a total thickness of the insulating layers is calculated on the basis of the process data (S126), one of the materials of the insulating layers, which provides the highest resistance against electron beam penetration, is assumed and an acceleration voltage with which electron beam can penetrate through the insulating layer formed of that material up to the lowest insulating layer of the wafer is obtained (S127). Thereafter, compensation current is measured at acceleration voltage as low as 500 V and is displayed as an image (S328). With such low acceleration voltage, only a surface layer can be seen. Then, the highest acceleration voltage thus obtained is divided by [(the number of layers)×n] and compensation current is measured at each of acceleration voltages obtained by this division and displayed as images (S129). In this case, n is an optimal one in a range from 1 to 9. An image of a lower layer obtained in this case includes an information of an upper layer. The thus obtained images are compared (S129) and, when there are images which are coincident (S130), the measurement is performed again by finely changing the used acceleration voltage. In a case where a second image and a third image are coincident, the corresponding layers are measured again with using acceleration voltages which are an intermediate voltage between the acceleration voltages with which a first and second images are obtained and an intermediate voltage between the acceleration voltages with which the third image and a fourth image are obtained (S131). This is repeated until the coincident images becomes different images. The measurement is terminated when different images of the layers have obtained from the process data(S132).

Figure 67:
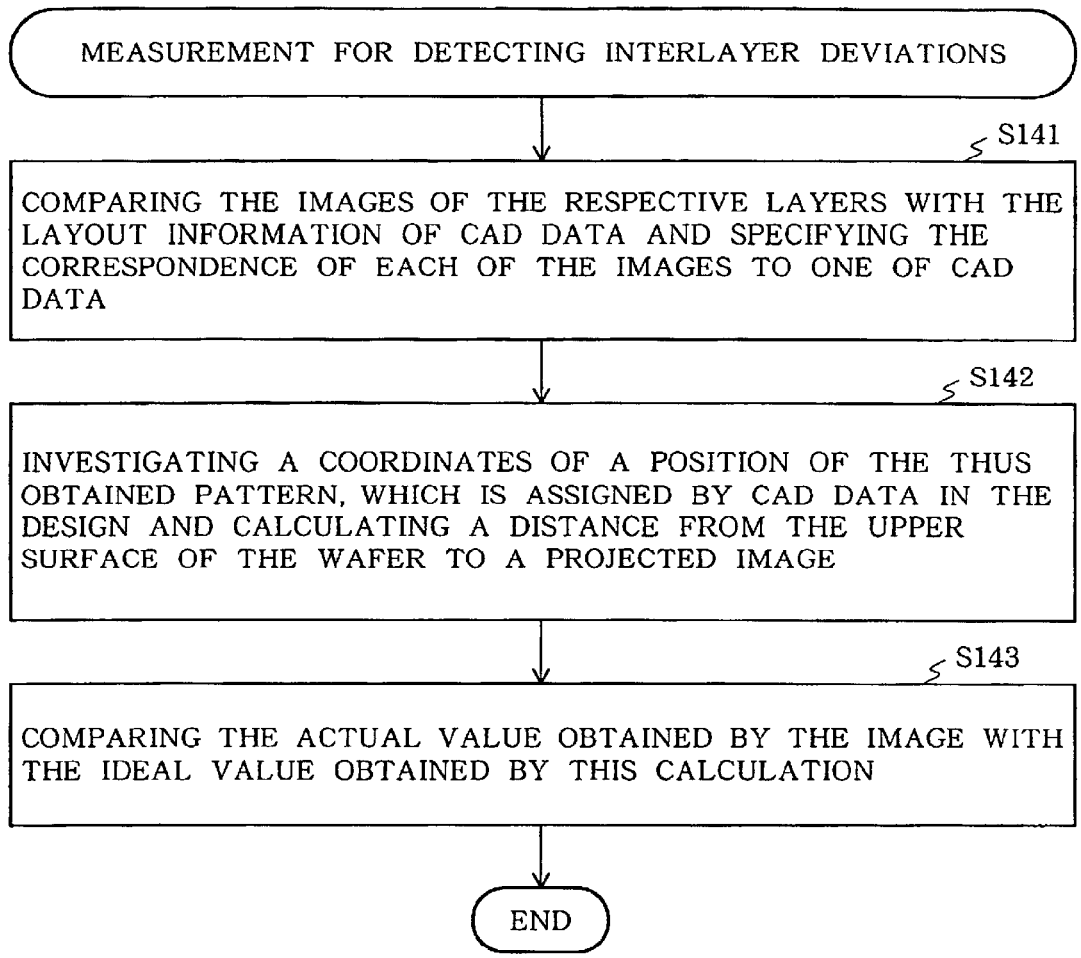
FIG. 67 is a flowchart of deviation determination after images of respective layers are obtained.

FIG. 67 is a flowchart for determining an interlayer deviation after images of respective layers are obtained. The images of the respective layers (patterns of current images) are compared with the layout information of CAD data, and the correspondence of each of the images to one of CAD data, specific wiring or specific diffusion layer, is specified (S141). Then, a coordinates of a position of the thus obtained pattern, which is assigned by CAD data in the design stage is investigated and a distance from the upper surface of the wafer to a projected image is calculated (S142). The actual value obtained by the image is compared with the ideal value obtained by this calculation. The difference corresponds to the interlayer deviation (S143).

Figure 68:
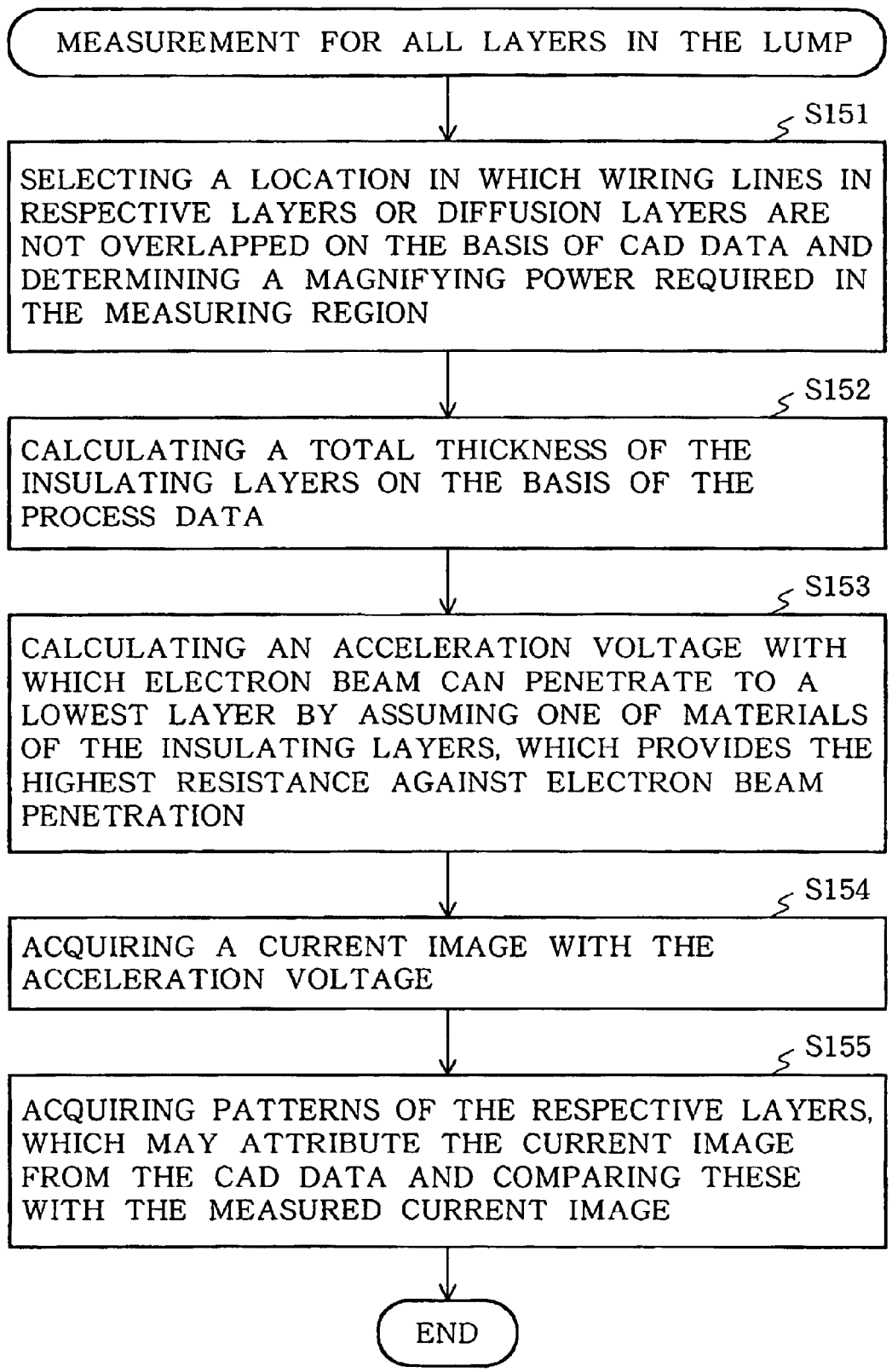
FIG. 68 is a flowchart of measurement for acquiring an information of a plurality of layers together.

It is possible to acquire the required information in the lump, instead of acquiring information from each of the respective layers by changing acceleration voltage of electron beam. The acquirement of the required information of all of the layers in the lump is performed according to a measuring flowchart shown in FIG. 68. In this flowchart, a location in which wiring lines in respective layers or diffusion layers are not overlapped is selected on the basis of CAD data and a magnifying power required in the measuring region is determined (S151) as in the flowchart shown in FIGS. 63 and 65. Then, a total thickness of the insulating layers is calculated on the basis of the process data (S152). An acceleration voltage with which electron beam can penetrate to a lowest layer is obtained by assuming one of materials of the insulating layers, which provides the highest resistance against electron beam penetration (S153), and a current image is acquired with the acceleration voltage (S154). Patterns of the respective layers, which may attribute the current image, are acquired from the CAD data and are compared with the measured current image (S155). According to the data obtained from the CAD data, the layers to which the current images are belong are classified and an interlayer deviation is obtained by comparing them with ideal images obtained by the CAD data. Although the classification step of classifying the current images according to the CAD data is required in this procedure, the preciseness of measurement can be improved since the interlayer deviation can be evaluated by a single image.

Background Correction

In the described tests, current produced in a substrate by scanning a sample surface with electron beam is recorded as a function of electron beam scanning position and by utilizing the function as a luminance signal for image display, a current image is formed on the substrate surface. Further, when the image is used in a contact-hole test, the magnitude of current flowing in the contact-hole in a D.C. sense becomes a reference for determining the quality of the contact-hole. However, an A.C. component is produced since it is practical that pulsed electron beam irradiates the surface periodically or the surface is scanned by electron beam. Therefore, a measured current contains a capacitive A.C. component in addition to the D.C. component. With such A.C. component, the correspondence between brightness of image and a physical object is broken, so that the quality determination of contact-hole becomes inaccurate and the restoration of three-dimensional configuration of the contact-hole becomes difficult.

In order to solve such problem, it is preferable to measure a current by changing an irradiation frequency or scanning frequency of electron beam to thereby correct the current component flowing through a capacitance of the sample under test. The processing flowcharts for performing such correction are shown in FIGS. 69 and 70, respectively.

Figure 69:
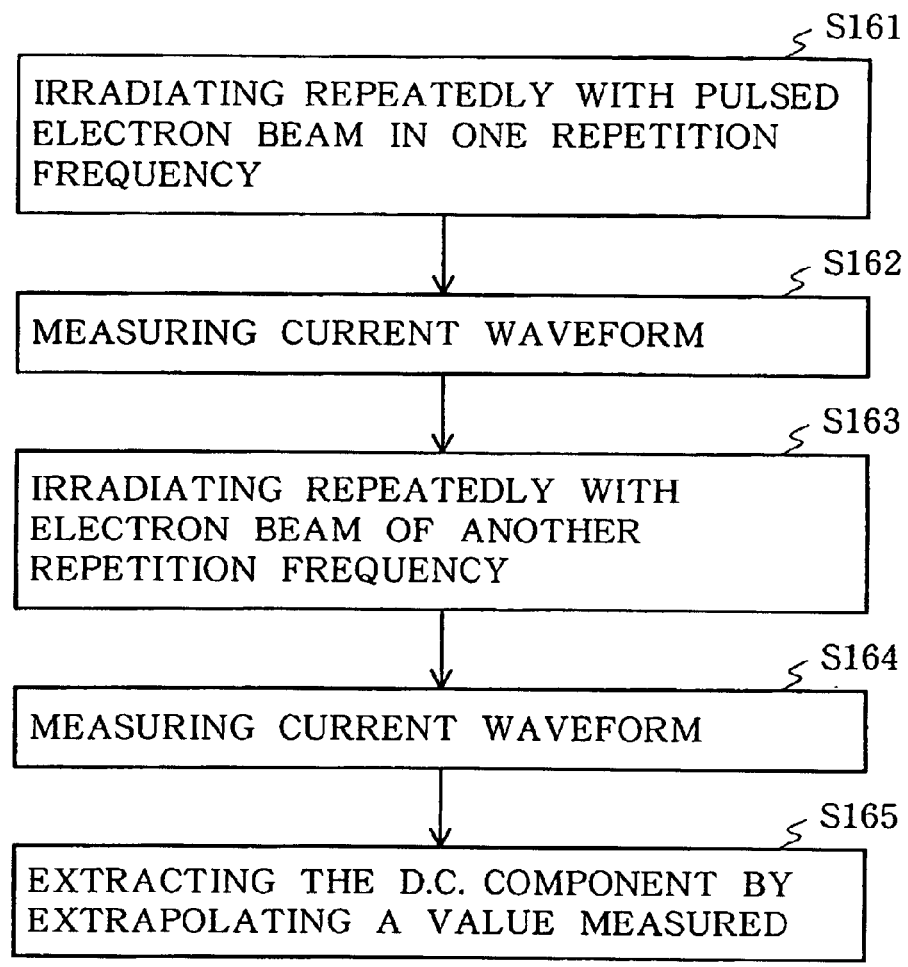
FIG. 69 shows an example of process flowchart for background correction.

In the flowchart shown in FIG. 69, when the sample is irradiated repeatedly with pulsed electron beam, a measurement is repeated while changing the period of repetition frequency (S161, S163) to obtain current waveforms (S162, S164). The D.C. component is obtained by extrapolating a value measured when the sample is continuously irradiated with electron beam from the thus obtained current waveform (S165). Describing this with reference to the semiconductor device tester shown in FIG. 1, the electron gun 1 produces pulsed electron beam repeatedly and the repetition frequency of the electron beam is changed by the beam control portion 11. In the data processor 10, the D.C. component is obtained by extrapolating a current value measured when the sample is irradiated continuously with electron beam from the current measured when the sample is irradiated with electron beam at a different repetition frequency.

Figure 70:
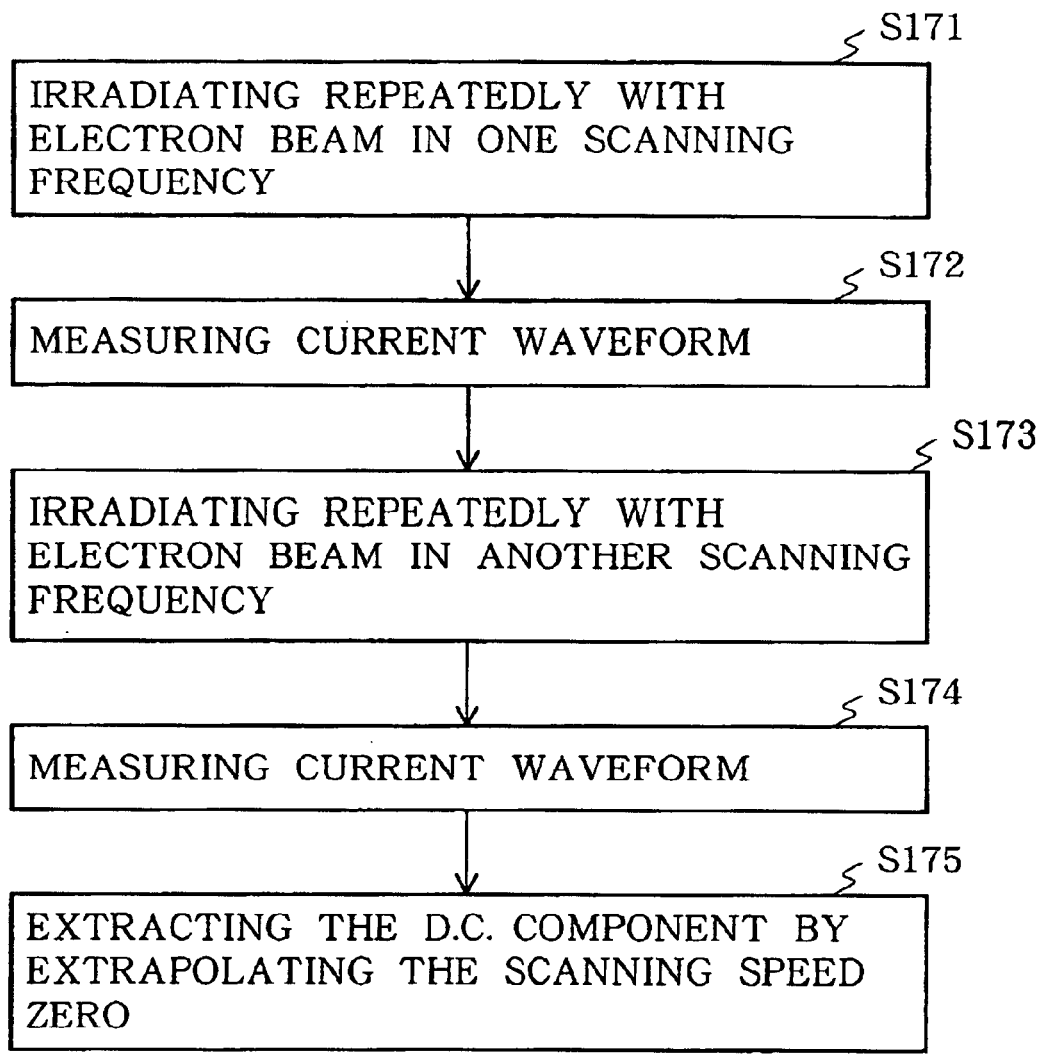
FIG. 70 shows another example of process flowchart for background correction.

In the flowchart shown in FIG. 70, a measurement is repeated while changing the scanning speed of electron beam (S171, 173) and, on the basis of a waveform thus obtained (S172, S174), a value obtained when the scan speed is extrapolated to zero is obtained (S175). Describing this with reference to the semiconductor device tester shown in FIG. 44, the electron beam irradiating position control device 116 can switch the scan speed of electron beam through the sub scan deflector 251 and, in the data processor (for example, the block 10 in FIG. 1) to which the output of the D/A converter 120 is supplied, the value when the scan speed is extrapolated to zero from the respectively measured current values when the sample is scanned with electron beam at different scan speeds.

As described in detail, the semiconductor device tester of the present invention can obtain an information related to a structure of a test sample in a depth direction thereof non-destructively. Therefore, the present invention is effectively used in a test for determining whether or not a quality determination of a fabricated semiconductor device and/or an optimization of a fabrication process thereof.

As to a distance information of a cross section of a contact-hole, which can be obtained by only cutting a sample along a center axis of the contact-hole thereof and looking it by SEM in the past, it is possible according to the present invention to obtain a distance information of an upper and a lower portions of the contact-hole by using an information of an opening portion of the contact-hole, which is obtained from a secondary electron image and an information of a bottom configuration of the contact-hole. By further using an information related to a structure of the contact-hole in the depth direction thereof, which is obtained by using different acceleration voltages, a more precise information can be obtained.

When electron beam having a rectangular cross section is used, it is possible to easily specify a position of an edge thereof and to easily measure an area of a region through which the electron beam passes with high precision. In the described embodiments, the present invention has been described when applied to a contact-hole. However, the present invention can be applied to a configuration determination of, for example, a through-hole, a resist, a wiring and a groove, etc., which have similar structures to that of a contact-hole. Further, it is possible to test a configuration and a bottom state of the contact-hole after etched or washed.

Since the present invention relates to a non-destructive test method, it is possible to obtain the information of a contact-hole in a depth direction without requiring an SEM test of a cross sectioned surface of a sample. Therefore, it is possible to measure products directly without using a monitor wafer, resulting in reduction of process cost.

Further, since it is possible to measure in an analog manner an area and diameter of a bottom of a contact-hole or a three-dimensional configuration thereof at high speed during a process, it is possible to improve a process in that state. For example, in order to provide the etching condition, it is necessary to control both the opening configuration and the bottom configuration of the contact-hole. When the present invention is used, it is possible to measure a distribution of bottom areas of contact-holes of a wafer then and there.

In the past, it is usual that the quality of contact-hole is digitally performed with only existence or absence of an opening portion of the contact-hole. Therefore, the abnormality is detected where the opening portion of contact-hole is clogged. According to the present invention, however, it is possible to always monitor a diameter of a formed contact-hole in a depth direction. Therefore, it is possible to detect an abnormality of the contact-hole as a change of analog value related to a bottom diameter of the contact-hole and an information of a structure in the depth direction, prior to a defect of the contact-hole opening is actually detected. Therefore, it is possible to take a counter measure against the abnormality quicker compared with the prior art. Particularly, an abnormality is detected by the lump method in the present invention to measure the bottom diameter of the contact-hole, it is possible to perform a measurement with higher precision. Since, in the lump current method, a position of the sample can be regulated such that electron beam irradiates one contact-hole, the measurement can be performed with using lower positional preciseness.

Since, in the case of the current measurement, only current flowing in a wiring attributes the measured value, the averaging of test results, which are required in the conventional test method, becomes unnecessary, so that the test speed can be improved.

In a case where the interlayer deviation is corrected by measuring current flowing in an alignment mask, an expensive secondary electron image acquiring device dedicated to the removal of interlayer deviation becomes unnecessary.

In the measurement of current waveform in the present invention, it is possible to acquire an information effective in the test regardless of a position of a wiring, through which thick electron beam passes and it is not always necessary to irradiate a specific position of the wiring with electron beam. On the contrary, it is possible to regulate the detecting sensitivity of defective pattern by changing the electron irradiating position. Further, since the quality of wiring is detected by utilizing an edge position information of the wiring, which is obtained from a rising and falling edges of a current waveform produced by the electron beam irradiation, there may be a case where a test is possible even when a clear test result can not be obtained from only a magnitude change of the acquired current waveform.

In general, the test speed of wiring lines arranged in an array can be improved compared with a case wherein wiring lines are arranged randomly. However, it is practical that such arrayed wiring lines and the random arrangement of wiring lines are mixed in within a chip. In such case, the arrangement of wiring is preliminarily checked in an initial test, estimate a position of the arrayed wiring from a frequency distribution of measured currents and an optimal test method can be selected on the basis of the position information. Therefore, the speed-up of the test can be achieved.

The current waveform measured in the present invention can be performed by continuously or intermittently irradiating a sample with electron beam. Further, by performing such scan of electron beam, it is possible to increase the effective scan speed. Electron beam is not always required to scan different positions of a sample and it is possible to scan edge portions of a test region slightly overlapped. An acceleration voltage and current injection are selected optimally depending upon a sample to be tested. In a case where the pattern detect is partial, current detected is also proportional to an area of the partial defect. Therefore, the partial defect can be detected if the variation of current produced in the partial pattern defect exceeds SN of the tester.

The measurement of current waveform in the present invention is also effective in a case where a wiring to be tested is electrically connected to a substrate. However, the present is also effective when a wiring has a large area or a large leakage current is large or the wiring is electrically connected to the substrate through a large capacitance. Since it is possible to test a plurality of wiring lines simultaneously, the test speed is high compared with the conventional method. Further, it is possible to monitor a cross sectional structure of a contact-hole from a surface thereof directly.

What is claimed is:

1. A system for obtaining information regarding one or more holes that are disposed in a semiconductor wafer or disposed in a layer which is disposed on or above the semiconductor wafer, the system comprising:

an electron gun to irradiate an electron beam;

a current measuring device to measure a compensation current, wherein the compensation current is generated in response to the electron beam irradiated on the one or more holes; and a data processor, coupled to the current measuring device, to determine information relating to a bottom diameter or a bottom circumference of the one or more holes using the amount of compensation current measured by the current measuring device.

2. The system of claim 1 further including an electrode, coupled to the current measuring device, to collect the compensation current.

3. The system of claim 2 wherein the electrode is capacitively coupled to the semiconductor wafer to collect the compensation current.

4. The system of claim 1 wherein:

the electron gun irradiates the electron beam at a plurality of electron beam accelerations; and the current measuring device measures an amount of compensation current generated in response to each electron beam having one of the plurality of electron beam accelerations.

5. The system of claim 4 wherein the data processor is coupled to the electron gun to control the acceleration voltage of the electron beam.

6. The system of claim 4 wherein the data processor determines information relating to the one or more holes in a depth direction using the compensation current measured for the plurality of acceleration voltages of the electron beam.

7. The system of claim 4 wherein the data processor determines information relating to the vertical profile of the one or more holes using the amount of compensation current measured for the plurality of acceleration voltages of the electron beam.

8. The system of claim 4 wherein the data processor determines information relating to the one or more holes, in a depth direction, based on the amount of compensation current measured for the plurality of acceleration voltages of the electron beam which are caused by a penetration depth of the electron beam for the plurality of acceleration voltages.

9. The system of claim 1 wherein the data processor is coupled to the electron gun to control the acceleration voltage of the electron beam and the temporal period that the electron gun irradiates the one or more holes, and wherein the data processor determines information relating to a vertical profile of the one or more holes using the compensation current measured for the plurality of acceleration voltages of the electron beam.

10. The system of claim 1 further including a moveable stage which is adapted to move the semiconductor wafer in at least one direction relative to the electron beam, and wherein:

the electron gun irradiates the electron beam along a beam axis; and the moveable stage, in response to control signals from the data processor, tilts the semiconductor wafer relative to the beam axis.

11. The system of claim 10 wherein the data processor determines information relating to the one or more holes using the compensation current measured for a plurality of incident angles of the electron beam on the semiconductor wafer.

12. The system of claim 1 wherein the data processor determines the presence of a residual film in the one or more holes using the amount of the compensation current and a reference value and wherein the reference value is determined using a test region having a pattern of one or more holes that is similar to the pattern of the one or more holes on the wafer.

13. The system of claim 1 wherein the one or more holes are contact holes or via holes.

14. The system of claim 1 further including a moveable stage which is adapted to move the semiconductor wafer in at least one direction relative to the electron beam.

15. The system of claim 1 wherein the data processor is coupled to the electron gun to control the temporal period that the electron gun irradiates the one or more holes.

16. The system of claim 15 wherein the data processor detects the presence of a residual film in the one or more holes using the amount of the compensation current.

17. The system of claim 1 wherein the data processor determines the presence of a residual film in the one or more holes using the amount of the compensation current and a reference value.

18. The system of claim 1 wherein the electron beam includes a cross-section that is less than the diameter or aperture of the one or more holes.

19. The system of claim 1 wherein the electron beam includes a cross-section that is greater than the diameter or aperture of the one or more holes.

20. The system of claim 1 wherein the data processor determines information relating to a bottom diameter or a bottom circumference of the one or more holes, having substantially circular cross sections, using the amount of compensation current measured by the current measuring device.

21. The system of claim 1 further including a moveable stage, adapted to receive the semiconductor wafer, and to move the wafer relative to the electron gun source while the electron beam irradiates the one or more holes.

22. The system of claim 1 wherein the electron gun includes an electron beam deflector to move the electron beam relative to the wafer and across the one or more holes.

23. The system of claim 1 further including an aperture plate to collimate the cross-section of the electron beam.

24. The system of claim 1 wherein the electron beam cross-section of the electron beam is rectangular, circular or square.

25. The system of claim 1 further including one or more condenser lenses to form the electron beam irradiated from the electron gun into a parallel beam.

* * * * *